United States Patent [19]
Okubo et al.

[11] Patent Number: 5,825,912
[45] Date of Patent: Oct. 20, 1998

[54] ELECTRON BEAM TESTER

[75] Inventors: Kazuo Okubo; Hironori Teguri; Akio Ito, all of Kawasaki, Japan

[73] Assignee: Fujitsu Limited, Kawasaki, Japan

[21] Appl. No.: 783,304

[22] Filed: Jan. 10, 1997

Related U.S. Application Data

[60] Continuation of Ser. No. 431,847, May 1, 1995, abandoned, which is a division of Ser. No. 357,983, Dec. 19, 1994, Pat. No. 5,600,734, which is a continuation of Ser. No. 955,804, Oct. 2, 1992, abandoned.

[30] Foreign Application Priority Data

| Dec. 16, 1901 | [JP] | Japan | 3-332286 |
| Oct. 4, 1991 | [JP] | Japan | 3-258140 |
| Feb. 3, 1992 | [JP] | Japan | 4-17465 |
| Jul. 17, 1992 | [JP] | Japan | 4-191031 |
| Jul. 17, 1992 | [JP] | Japan | 4-191171 |

[51] Int. Cl.$^6$ ..................... G21K 1/00
[52] U.S. Cl. ............. 382/145; 382/296; 348/95
[58] Field of Search ................. 382/144, 145, 382/296; 348/87, 95; 378/145, 152

[56] References Cited

U.S. PATENT DOCUMENTS

| 4,620,288 | 10/1986 | Welmers | 382/296 |
| 4,799,175 | 1/1989 | Sano et al. | 364/552 |
| 4,803,358 | 2/1989 | Kato et al. | 250/310 |
| 4,910,398 | 3/1990 | Komatsu et al. | 382/22 |
| 4,930,088 | 5/1990 | Horiguchi | 382/296 |
| 4,969,199 | 11/1990 | Nara | 382/8 |
| 4,974,736 | 12/1990 | Okunuki et al. | 250/492.2 |
| 5,015,097 | 5/1991 | Nomoto et al. | 356/394 |
| 5,046,109 | 9/1991 | Fujimori et al. | 382/8 |
| 5,085,517 | 2/1992 | Chadwick et al. | 356/394 |
| 5,086,478 | 2/1992 | Kelly-Mahaffey et al. | 382/8 |
| 5,129,009 | 7/1992 | Lebeau | 382/8 |
| 5,150,423 | 9/1992 | Hoki | 382/8 |
| 5,199,054 | 3/1993 | Adams et al. | 378/21 |
| 5,253,306 | 10/1993 | Nishio | 382/22 |

FOREIGN PATENT DOCUMENTS 3-148774  6/1991  Japan .

Primary Examiner—Leo Boudreau
Assistant Examiner—Chris Kelley
Attorney, Agent, or Firm—Nikaido, Marmelstein, Murray & Oram LLP

[57] ABSTRACT

An Electron Beam Tester which corrects deformation of a secondary electron image produced from scanning a sample with an electron beam. The secondary electron image is stored in a storage unit. Luminance data of the stored image is accumulated to obtain a projected luminance distribution. The projected luminance distribution data is then analyzed by a parallelism evaluation unit to obtain a rotation angle. Then the rotation angle is used to determine maximum parallelism and correct deformation of the secondary electron image by providing deflection control which transforms the deflectors .

1 Claim, 44 Drawing Sheets

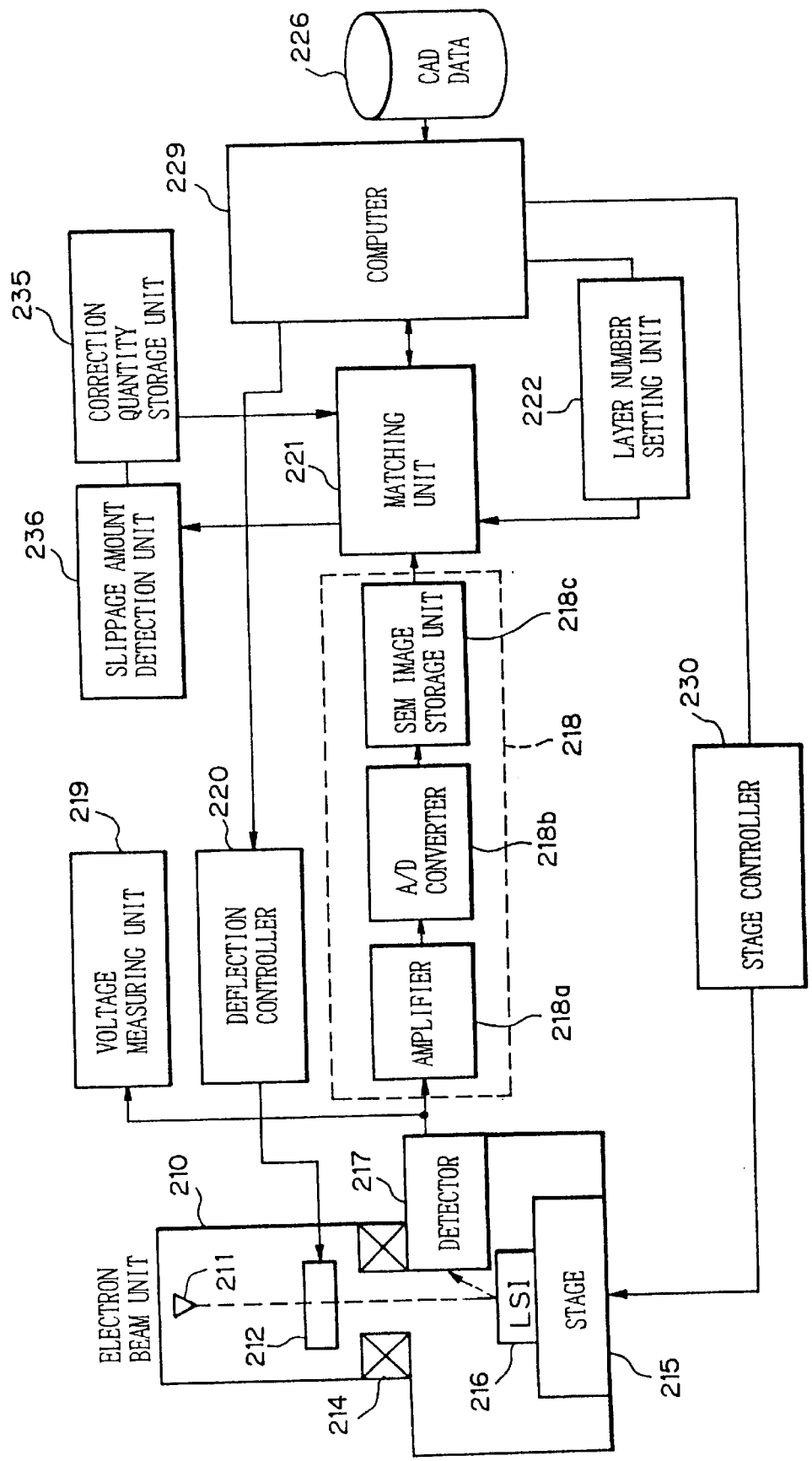

PROJECTED LUMINANCE $|p(i+2,j)-p(i,j)|+|p(i,j)-p(i-2,j)|$

ELECTRON BEAM TESTER

This application is a continuation of application Ser. No. 08/431,847 filed May 1, 1995, now abandoned which in turn is a division of application Ser. No. 08/357,983, filed Dec. 19, 1994, now allowed U.S. Pat. No. 5,600,734 which in turn is a continuation of application Ser. No. 07/955,804, filed Oct. 2, 1992, abandoned.

BACKGROUND OF THE INVENTION

1. Field of the Invention

The present invention relates to an electron beam tester and, in particular, to an electron beam tester for scanning a sample with an electron beam to provide a secondary electron image involving wiring patterns, matching the wiring patterns of the secondary electron image with wiring patterns prepared from computer aided design (CAD) data, measuring voltages of the wiring patterns, and correcting deformation of the secondary electron image.

The present invention is capable of simply, correctly, quickly carrying out a pattern matching operation and accurately correcting deformation of the secondary electron image.

2. Description of Related Art

Electron beam apparatuses are widely used in semiconductor chip manufacturing, to draw circuit patterns on a semiconductor chip with an electron beam. The semiconductor chip manufacturing process involve a process of matching wiring patterns contained in a secondary electron image with wiring patterns prepared from CAD data, a process of emitting an electron beam to measure voltages of the wiring patterns, and a process of correcting deformation of the secondary electron image.

SUMMARY OF THE INVENTION

A first object of the present invention is to simply and quickly match wiring patterns of a secondary electron image with wiring patterns prepared from CAD data.

A second object of the present invention is to take slippage among layers of a multilayered semiconductor chip into consideration to correctly position an electron beam during a pattern matching operation.

A third object of the present invention is to automatically and accurately correct deformation of a secondary electron image.

A fourth object of the present invention is to simply and correctly determine a threshold used for preparing binary image data and to correctly carry out a pattern matching operation.

A fifth object of the present invention is to accurately detect edges from a Laplacian-processed blurred image and correctly carry out a pattern matching operation.

To achieve the first object, a first aspect of the present invention provides a pattern matching apparatus that scans a sample with an electron beam to provide a secondary electron image involving wiring patterns, and matches the wiring patterns of the secondary electron image with wiring patterns prepared from CAD data. The apparatus comprises means for detecting the positions of edges of the CAD wiring patterns extending in parallel with an axis Y of a rectangular coordinate system defined on the CAD data, means for storing the secondary electron image, means for accumulating luminance of the secondary electron image along an axis Y of a rectangular coordinate system defined on the secondary electron image, to provide a projected luminance distribution, means for determining edge likelihood of the secondary electron image according to the projected luminance distribution, means for finding the degree of correlation between the edge positions of the CAD data and the edge likelihood of the secondary electron image as a pattern matching level, and means for shifting the edge positions of the CAD wiring patterns within a predetermined range according to secondary electron image magnification accuracy, sample positioning accuracy, and fluctuations in the width of wiring, to find a maximum pattern matching level, and finding a secondary electron image magnification error and a sample positioning error corresponding to the maximum pattern matching level.

To achieve the second object, a second aspect of the present invention provides a wiring pattern tester that irradiates a sample (a multilayered semiconductor chip) placed on a movable stage with an electron beam, detects secondary electron signals, and according to the signals, forms a secondary electron image and measures voltages of the wiring patterns of the secondary electron image. The wiring pattern tester comprises means for storing a layout of each wiring layer of the multilayered chip, means for comparing the secondary electron image with the layout of each layer read out of the layout storage means, to detect slippage between the secondary electron image and the layout, and means for controlling the movable stage according to the detected slippage so that an electron beam is oriented toward a measuring point on the semiconductor chip.

To achieve the third object, a third aspect of the present invention provides a secondary electron image corrector that scans a sample with an electron beam to provide a secondary electron image and corrects deformation of the secondary electron image. The corrector comprises means for linearly transforming, according to linear transformation parameters, an electron beam scanning position into drive signals to first and second deflectors having different deflecting directions, means for storing the secondary electron image, means for rotating an axis Y of an X-Y coordinate system and accumulating luminance of the secondary electron image along the axis Y, to provide a projected luminance distribution, means for computing parallelism between the wiring patterns and the axis Y according to the projected luminance distribution, and means for computing maximum parallelism and a rotation angle of the axis Y corresponding to the maximum parallelism.

To achieve the fourth object, a fourth aspect of the present invention provides a wiring pattern tester that irradiates a sample with an electron beam to provide a secondary electron image of the sample and, according to the secondary electron image, testing the sample. The tester comprises means for storing mask pattern data, i.e., design data of the sample, means for counting the number of pixels of edges of wiring patterns according to the stored mask pattern data, means for providing a secondary electron image of the sample, means for differentiating the secondary electron image and extracting an image of edges from wiring patterns of the secondary electron image, means for determining a threshold according to the edge image and the counted number of pixels of the edges, and according to the threshold, converting the edge image into a binary image, and means for projecting the binary edge image in the wiring pattern extending direction, matching the projected data with projected edge data prepared from the mask data, and adjusting the position of the electron beam relative to the sample.

To achieve the fifth object, a fifth aspect of the present invention provides a pattern matching processor that detects edges out of a Laplacian-filtered blurred image and carries out a pattern matching operation. The processor comprises data operation means for computing a blur level of the image to be processed, data processing means for detecting edge likelihood of the image according to the blur level, and means for controlling the data operation means and data processing means and extracting edges from the image.

BRIEF DESCRIPTION OF THE DRAWINGS

FIG. 17 is a block diagram showing still another embodiment of the second aspect of the present invention;

DESCRIPTION OF THE PREFERRED EMBODIMENTS

Figure 1:
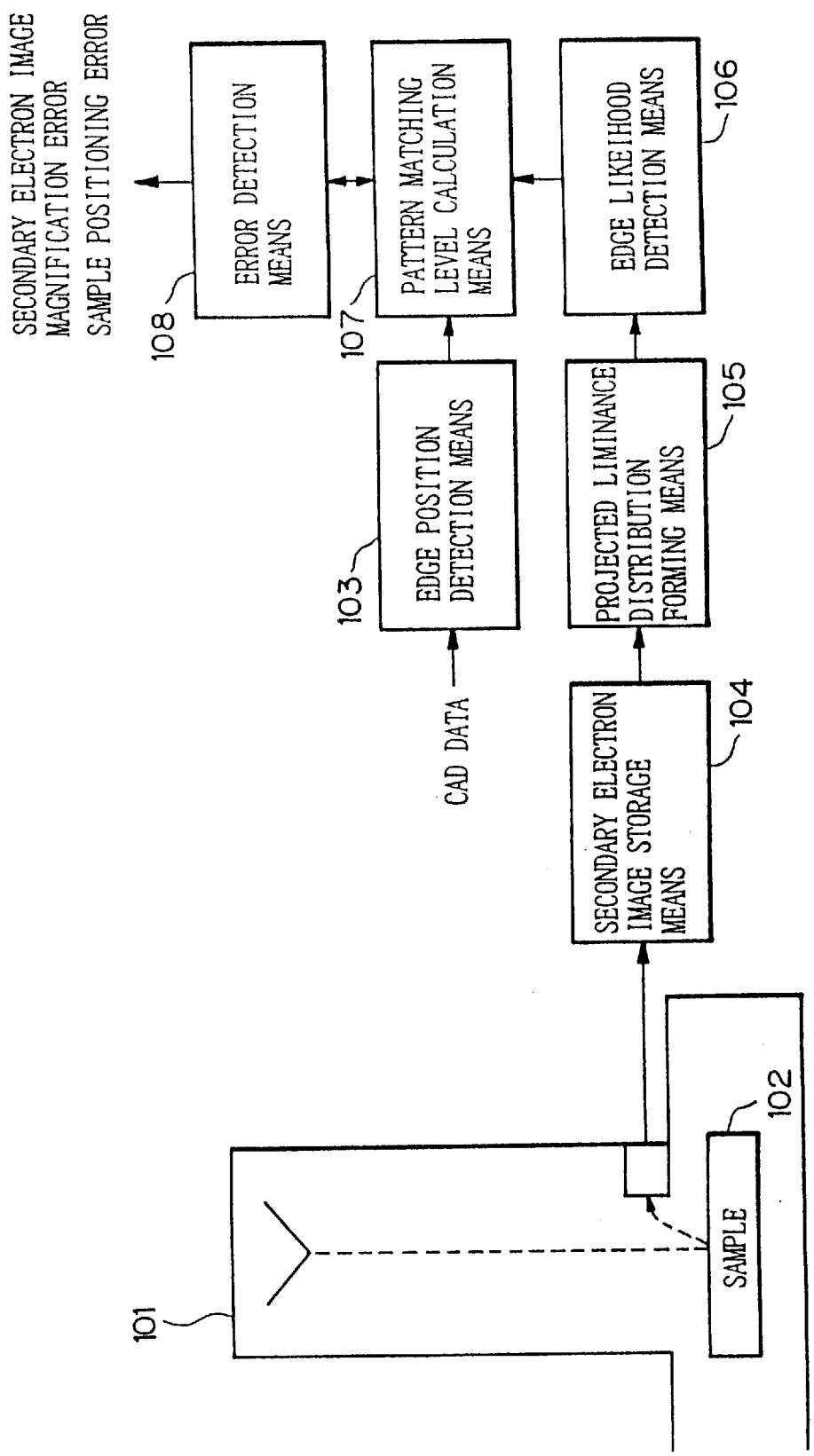
FIG. 1 shows a basic arrangement of a pattern matching apparatus according to the first aspect of the present invention.

A pattern matching apparatus according to the first aspect of the present invention will be explained with reference to FIGS. 1 to 11. This apparatus scans a sample with an electron beam emitted from an electron beam device, to form a secondary electron image involving wiring patterns, and matches the wiring patterns of the secondary electron image with wiring patterns prepared from CAD data.

When measuring voltages of wiring patterns formed on a semiconductor chip, an electron beam tester scans the surface of the chip with an electron beam to provide a secondary electron image, which is displayed on a display unit. A measuring point is specified on the displayed image, to direct the electron beam toward the measuring point to measure a voltage at the measuring point.

Specifying the measuring point on the displayed secondary electron image is very difficult because:

(1) Recent semiconductor integrated circuits are large and highly integrated as a result a visual field of the secondary electron image thereof is reduced. This increases, relative to a wiring pitch, an error in positioning a stage which carries the chip.

(2) Wiring patterns on the top layer of the chip are clearly visible in the secondary electron image. Wiring patterns on a layer below the top layer, however, have low contrast and are not clearly visible.

To solve these problems, there has been proposed a method of specifying a measuring point on wiring mask patterns prepared from CAD layout data, matching the CAD mask patterns with a secondary electron image, and automatically converting the measuring point specified on the CAD data into a measuring point on the secondary electron image.

This pattern matching can be difficult to achieve because:

(1) There are many image data. For example, one secondary electron image may involve 512×512 pixels×8 bits.

(2) The secondary electron image is a collection of pixel luminance data. On the other hand, the CAD data are polygon data (vector data).

(3) A magnification error in the secondary electron image is about ±2%, and a positioning error in a stage on which a sample is placed is about ±2μm.

(4) Semiconductor chip manufacturing fluctuates the width of wiring among layers of a multilayered chip.

The conventional pattern matching operation computes a sum of products of pixels of an image as a pattern matching level of the image and repeatedly shifts the image until a maximum pattern matching level is found. Then, it finds a shift quantity corresponding to the maximum pattern matching level. According to this technique, an image must be shifted and pattern matching levels must be calculated whenever the magnification of the image and fluctuations in the width of wiring are changed, to find a maximum pattern matching level and magnification, fluctuation, and shift quantity corresponding to the maximum pattern matching level. This technique, therefore, involves complicated processes and a long processing time.

An object of the first aspect of the present invention is to provide a pattern matching apparatus that simply and quickly matches wiring patterns prepared from CAD data with wiring patterns of a secondary electron image.

FIG. 1 shows a basic arrangement of the pattern matching apparatus according to the first aspect of the present invention. This apparatus scans a sample with an electron beam emitted from an electron beam unit to form a secondary electron image involving wiring patterns, and matches the wiring patterns of the secondary electron image with wiring patterns prepared from CAD data. Components of the pattern matching apparatus will be explained.

Edge position detection means 103 detects edge positions $Xi$ (i=1 to n) of the CAD wiring patterns extending in parallel with an axis Y of a rectangular coordinate system defined on the CAD data. Secondary electron image storage means 104 stores the secondary electron image of the sample. Projected luminance distribution forming means 105 finds a projected luminance distribution B(X) by accumulating luminance of the secondary electron image along an axis Y of a rectangular coordinate system defined on the secondary electron image. A range of Y may be limited according to secondary electron image magnification accuracy, sample positioning accuracy, and fluctuations in the width of wiring. Edge likelihood detection means 106 detects edge likelihood E(X) of the wiring patterns of the secondary electron image according to the projected luminance distribution B(X). Pattern matching level calculation means 107 computes a pattern matching level V according to the degree of correlation between the edge positions $Xi$ (i=1 to n) and the edge likelihood E(X). Error detection means 108 changes the edge positions $Xi$ (i=1 to n) of the CAD wiring patterns in a range of $Xi-ai \leq Xi \leq Xi+bi$ depending on the secondary electron image magnification accuracy, sample positioning accuracy, and fluctuations in the width of wiring, to find a maximum pattern matching level V. Then, a secondary electron image magnification error and a sample positioning error corresponding to the maximum pattern matching level V are found. The pattern matching level V may be found after properly setting a range of edge positions $Xi$ (i=1 to n) instead of inspecting all wiring patterns. For example, edges of wiring patterns of the top layer alone may be inspected.

In this way, the first aspect of the present invention finds edge likelihood E(X) according to a luminance distribution B(X) obtained by projecting a secondary electron image on an axis X, calculates a pattern matching level V between the edge likelihood E(X) and CAD edge positions $Xi$ (i=0 to n). The CAD edge positions $Xi$ (i=1 to n) are shifted according to secondary electron image magnification accuracy, sample positioning accuracy, and fluctuations in the width of wiring, to find a maximum pattern matching level V. Then, a secondary electron image magnification error and a sample positioning error corresponding to the maximum pattern matching level V are found. The first aspect of the present invention, therefore, simply, correctly, and quickly matches the CAD wiring patterns with the wiring patterns of the secondary electron image.

According to a first mode, the pattern matching level calculation means 107 calculates the pattern matching level V as follows:

$$V = E(X1) + E(X2) + \ldots + E(Xn)$$

The level V is also expressed as follows:

$$\begin{aligned} V &= \Sigma_X E(X) e(X) \\ &= E(X1) + E(X2) + \ldots + E(Xn) \end{aligned}$$

where $\Sigma_X$ is a sum of all Xs in a specified range. The e(X) will be a if there is an edge at a position X on the CAD data and 0 if there is no edge at there. The edge positions $Xi$ (i=1 to n) are detectable from the CAD data, so that the pattern matching level V is correctly and simply obtainable.

According to a second mode, the edge likelihood detection means 106 computes the edge likelihood E(X) as follows:

$$E(X) = |B(X-q) - B(X)| + |B(X) - B(X+q)|$$

This correctly evaluates edges in the wiring patterns with no regard to wiring layers and whether the edges are on the right or left side.

According to a third mode, the projected luminance distribution forming means 105 finds the projected luminance distribution B(X) with the edge positions $Xi$ (i=1 to n) ranging $Xi-ai \leq Xi \leq Xi+bi$.

This method quickly processes data because the quantity of the data to be processed is limited.

According to a fourth mode, the edge position detection means 103 detects straight edges of oblique wiring patterns that are not in parallel with any of the axes of the rectangular coordinate system defined on the CAD data. The projected luminance distribution forming means 105 computes an obliquely projected luminance distribution by accumulating luminance of the secondary electron image along the straight edges. The edge likelihood detection means 106 detects edge likelihood according to the obliquely projected luminance distribution. The pattern matching level calculation means 107 computes the degree of correlation between the straight edges and the edge likelihood, to provide a pattern matching level V. The error detection means 108 shifts the positions of the straight edges of the oblique wiring patterns on the CAD data according to secondary electron image magnification accuracy, sample positioning accuracy, and fluctuations in the width of wiring, to find a maximum pattern matching level V. Then, a secondary electron image error and a sample positioning error corresponding to the maximum pattern matching level V are found.

By properly setting the rectangular coordinate system, most of the wiring patterns will run in parallel with one of the axes of the rectangular coordinate system. Even if there are wiring patterns that are not in parallel with any of the axes, they may be ignored in a pattern matching operation. According to the fourth mode, the pattern matching operation can be carried out even on oblique patterns, in a manner similar to the parallel patterns.

Embodiments according to the first aspect of the present invention will be explained with reference to the drawings.

First Embodiment

Figure 2:
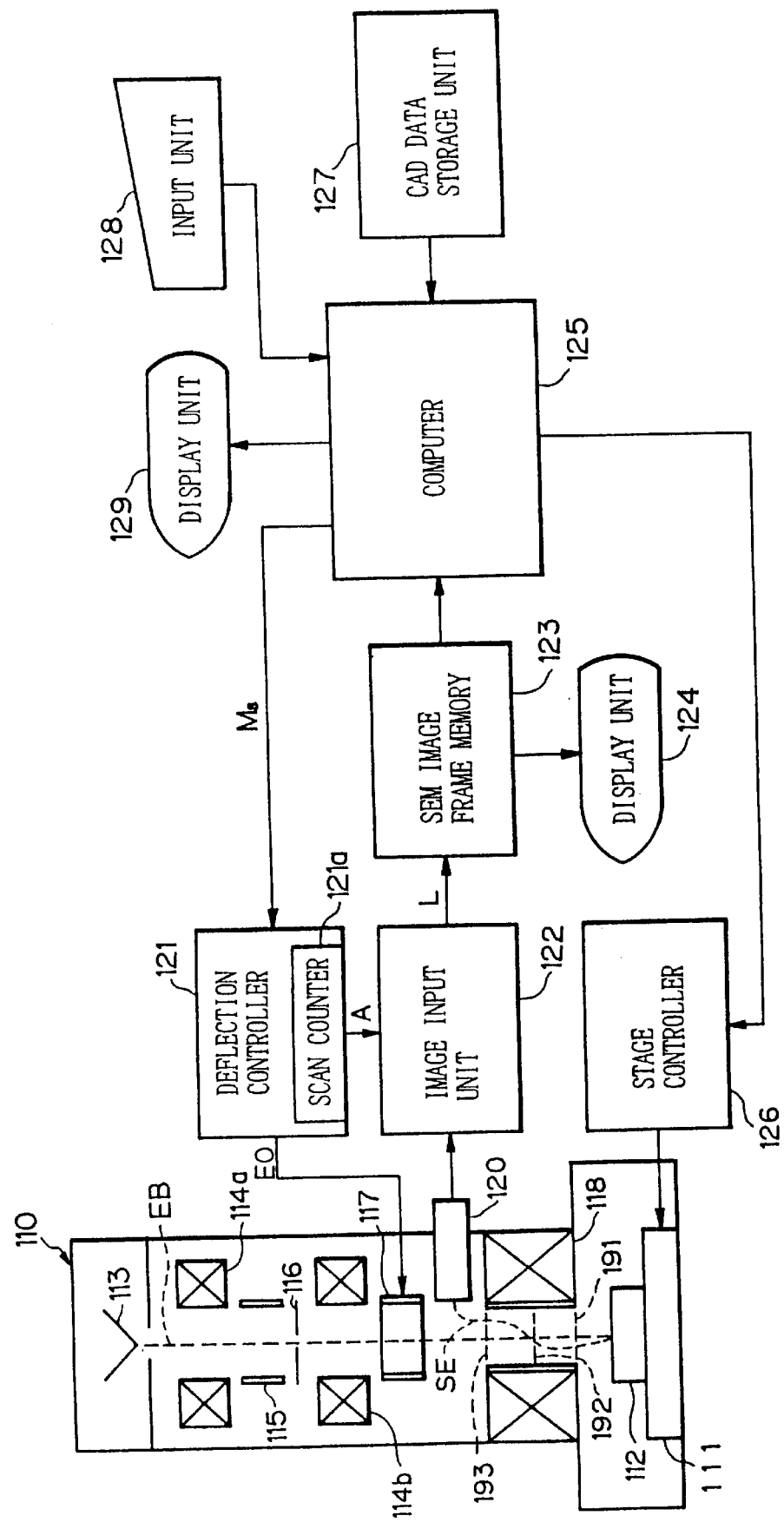
FIG. 2 shows an electron beam tester employing the pattern matching apparatus of FIG. 1.

FIG. 2 shows an electron beam tester according to the first embodiment of the first aspect of the present invention. A measuring point is specified on wiring patterns formed from CAD data, and then a measuring point on a secondary electron image is automatically determined according to the measuring point specified on the CAD data, to measure a voltage at the measuring point.

An electron beam unit 110 detects the quantities of secondary electrons that correspond to a voltage at the measuring point and a voltage applied to an energy analytic grid 193. A stage 111 carries a sample 112. An electron gun 113 emits an electron beam EB toward the sample 112. The electron beam EB is converted into pulses while passing through a capacitor magnetic field lens 114a, a blanking deflector 115, and a blanking aperture 116. The pulses are passed through a capacitor magnetic field lens 114b, a deflector 117, and an object magnetic field lens 118, and focused at the measuring point on the sample 112. Secondary electrons SE produced at the measuring point are passed through a pullout grid 191, a control grid 192, and the energy analytic grid 193, and detected by a secondary electron detector 120.

The deflector 117 for deflecting the electron beam EB to scan the sample 112 is driven by a drive voltage provided by a deflection controller 121. An amplitude E0 of the drive voltage determines magnification of a secondary electron image. The deflection controller 121 has a scan counter 121a, which provides a count A corresponding to an electron beam scanning position. The count A of the counter 121a is supplied to an image input unit 122. The count A comprises, for example, 18 bits including nine upper bits y and nine lower bits x. A voltage of E0x/511 is applied to an X-deflection plate of the deflector 117, and a voltage of E0y/511 to a Y-deflection plate of the deflector 117. Accordingly, the coordinates (X, Y) of the electron beam scanning point on the sample 112 will be theoretically (E0kx, E0ky), where k is a constant.

The image input unit 122 amplifies an output of the secondary electron detector 120, converts the amplified output into a digital value, and writes the digital value as luminance L at an address A in a scanning electron microscope (SEM) image frame memory 123. The data stored in the SEM image frame memory 123 are supplied to a display unit 124, which displays a secondary electron image. Also, the data stored in the SEM memory 123 are read and processed by a computer 125.

A CAD data storage 127 stores CAD data that provides photomask wiring patterns. The computer 125 reads the CAD data out of the CAD data storage 127 according to a specified range, determines magnification Ms of the secondary electron image, sets the magnification Ms in the deflection controller 121, determines a target position of the stage 111, sets the target position in the stage controller 126, matches the secondary electron image with the CAD data, and determines a measuring point on the secondary electron image according to a measuring point specified on the CAD data.

The measuring point and region are specified on the CAD data through an input unit 128, which may be a keyboard or a storage unit. A display unit 129 displays the input data and other data. The magnification Ms is supplied to the deflection controller 121, which provides the deflector 117 with a drive voltage having an amplitude E0, which is in inverse proportion to the magnification Ms.

Figure 3:
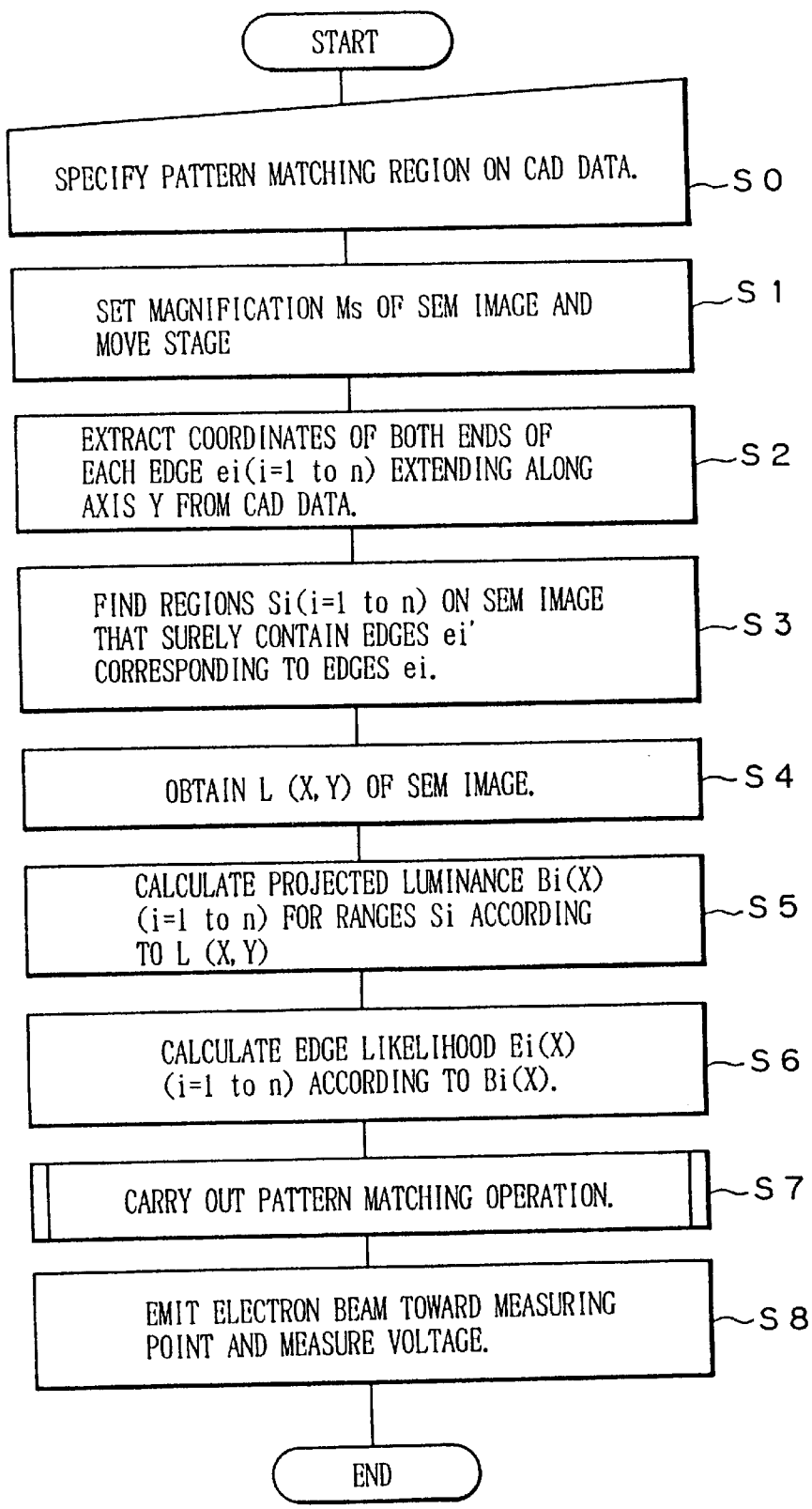
FIG. 3 is a flowchart showing a voltage measuring operation.

FIG. 3 shows a voltage measuring operation carried out by the computer 125.

(Step S0)

Figure 5A:
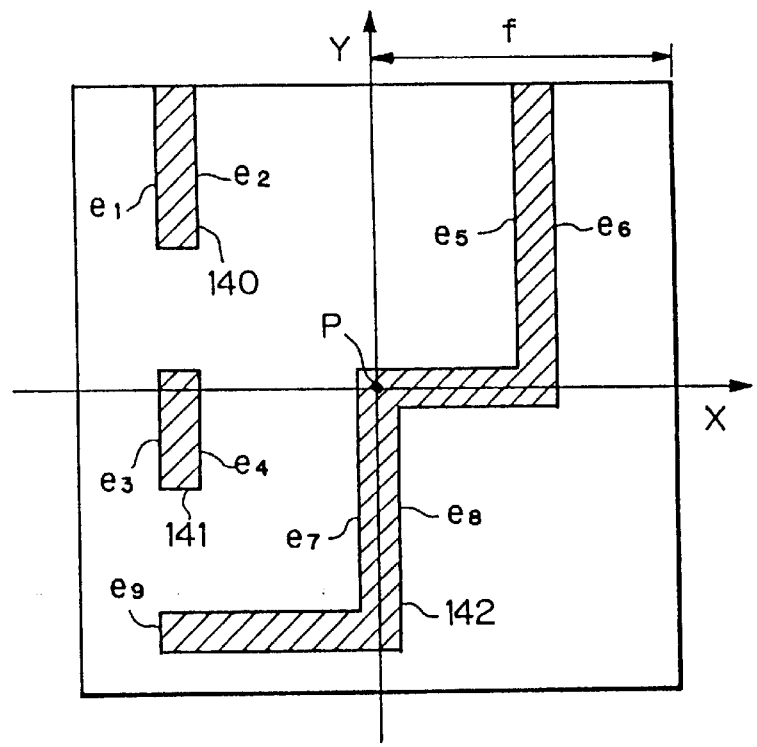
FIG. 5(A) shows a region specified on CAD data.

A pattern matching region corresponding to a secondary electron image to be obtained and a measuring point P are specified on the CAD data through the input unit 128. FIG. 5(A) shows an example of the region to be specified. In the figure, the square region is specified by the measuring point P as the center thereof and by a length f being half of each side. The region includes wiring patterns 140, 141, and 142. The CAD data, including edge data of the wiring patterns, which is stored in the CAD data storage 127 are vector data. Most of the vectors are in parallel with one of the axes X and Y of a rectangular X-Y coordinate system with the measuring point P serving as an original point of the coordinate system. In the following steps, edges e1 to e9, which extend in parallel with the axis Y. of the wiring patterns 40 to 142 are particularly considered.

(Step S1)

Magnification Ms of the secondary electron image is calculated from the value f and set in the deflection controller 121. An error in the magnification Ms relative to actual magnification of the secondary electron image is about ±2%. A target position of the stage 111 is determined according to the coordinates of the measuring point P specified on the CAD data, and set in the stage controller 126.

According to the set target position, the stage controller 126 moves the stage 111. If the stage 111 involves no positioning error, a measuring point P on the sample 112 corresponding to the measuring point P comes just on an optical axis of the electron beam unit 110. When feedback control is not carried out for positioning the stage 111, an error in the position of the stage 111 will be about ±2 μm.

(Step S2) Vectors, i.e., coordinates of both ends of each of the edges ei (i=1 to n and n=9 in FIG. 5(A)), which run along the axis Y of the wiring patterns in the region specified in the step S0 are read out of the CAD data storage 127.

(Step S3)

Figure 6A:
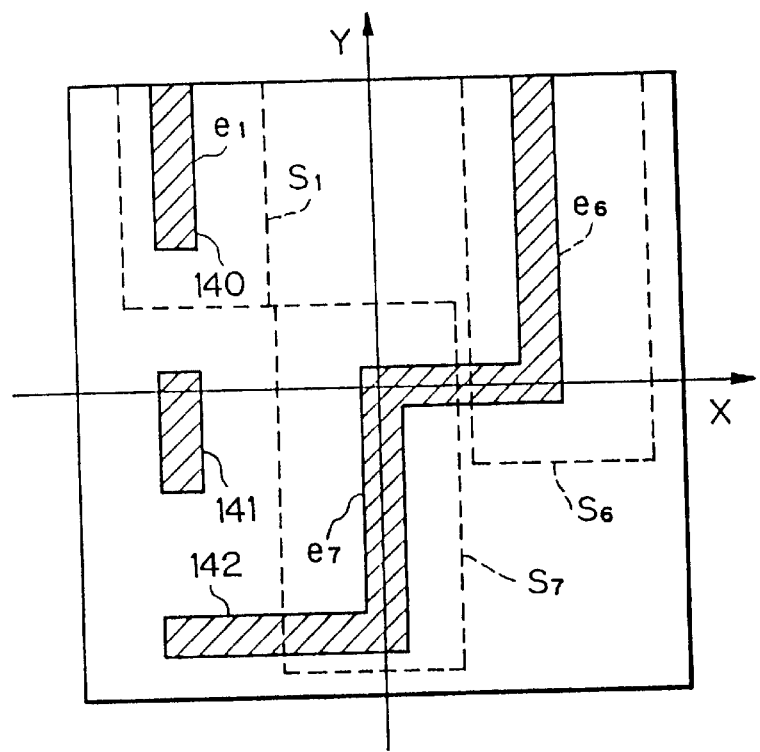
FIG. 6(A) shows edge detecting areas Si defined on CAD data.
Figure 6B:
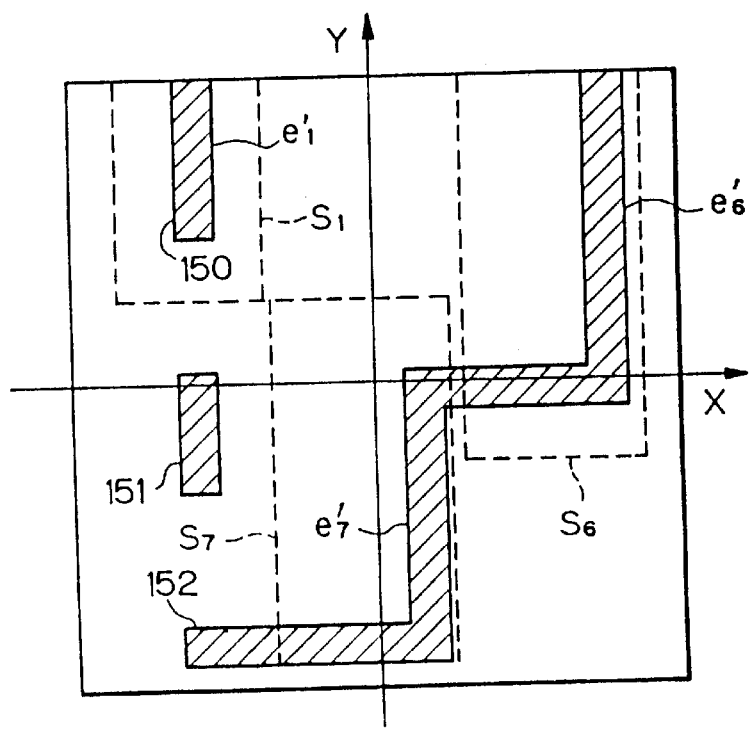
FIG. 6(B) shows edge detecting areas Si defined on a secondary electron image.

Regions Si are defined on the CAD data so that the regions Si surely include edges ei' of a secondary electron image corresponding to the edges ei. Namely, edge detection regions S1, S6, and S7 surrounded by dotted lines in FIG. 6 are defined.

(Step S4)

Figure 5B:
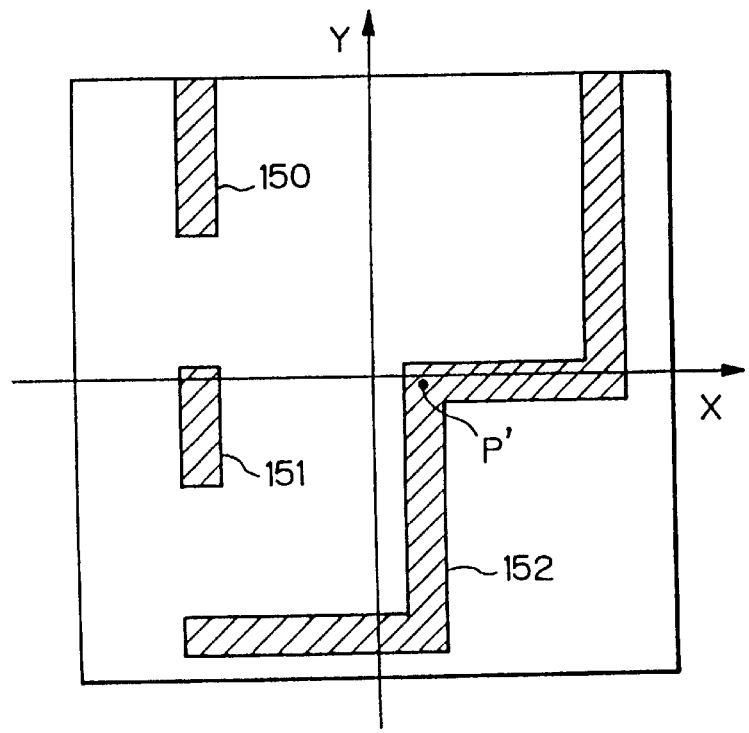
FIG. 5(B) shows a secondary electron image corresponding to the region of FIG. 5(A)

The sample 112 is scanned with the electron beam EB to obtain a secondary electron image (a SEM image), which is stored in the SEM image frame memory 123. An example of the secondary electron image is shown in FIG. 5(B). The secondary electron image contains wiring patterns 150 to 152 corresponding to the wiring patterns 140 to 142 of the CAD data. A rectangular X-Y coordinate system is defined on the secondary electron image. Variables X and Y are integers changing at intervals of pixel pitches and ranging— f'≦X≦f' and -f'≦Y≦f';for example, f'=256 Luminance at coordinates (X, Y) on the secondary electron image is expressed as L(X, Y).

(Step S5)

According to the luminance L(X, Y), projected luminance Bi(X) on the axis X in each edge detection region Si is computed as follows:

$$Bi(X) = \Sigma_{iy}(X, Y)$$

where $\Sigma_{iy}$ is a sum of all values for Y in the edge detection region SI.

(Step S6)

According to the projected luminance Bi(X), edge likelihood Ei(X) is computed as follows:

$$Ei(X) = |Bi(X-q) - Bi(X)| + |Bi(X) - Bi(X+q)| \quad (1)$$

Figure 8A:
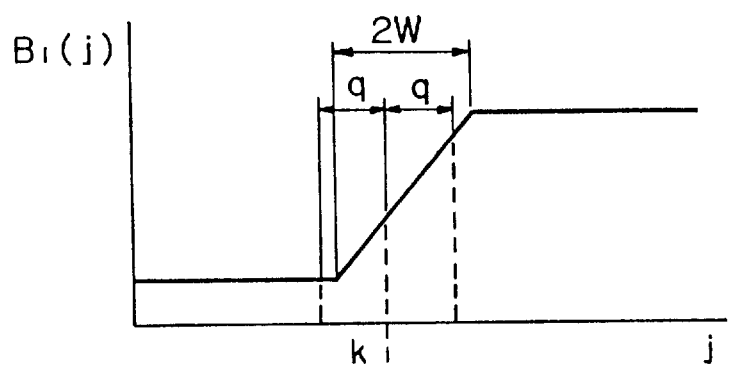
FIGS. 8(A) to 8(D) explain how to obtain edge likelihood from projected luminance.
Figure 8B:
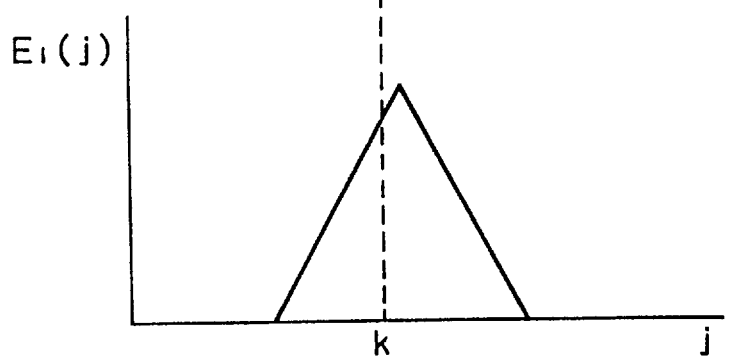

The projected luminance Bi(X) of the wiring patterns on the top layer of the secondary electron image changes around edges as shown in FIG. 8(A). In the equation (1), a preferable value for the q for improving edge detection accuracy is W with the width of an edge in the projected luminance Bi(X) being 2W. FIG. 8(B) shows the edge likelihood Ei(X). The edge width 2W is mainly determined by the size of an electron beam spot. The edge likelihood Ei(X) is independent of whether the edge is located on the right or left side of a corresponding pattern.

Figure 8C:
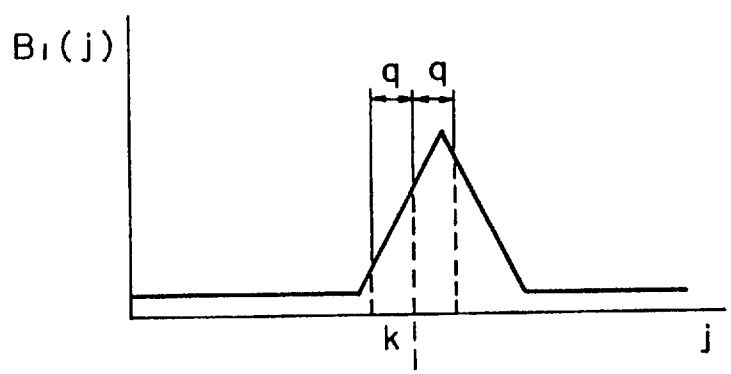
Figure 8D:
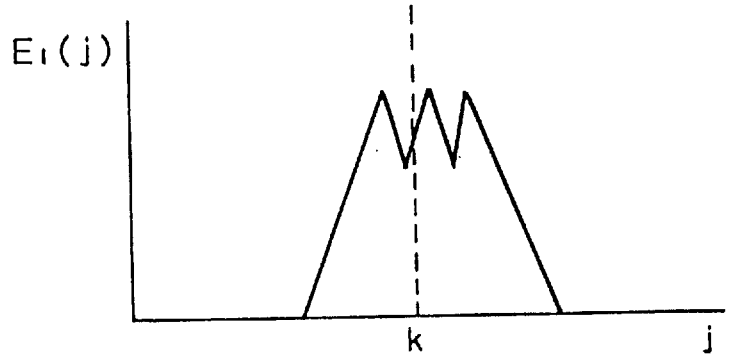

Wiring patterns on a layer below the top layer on the secondary electron image are detected only as edges, and projected luminance Bi(X) thereof will be usually as shown in FIG. 8(C). In this case, edge likelihood Ei(X) will be as shown in FIG. 8(D), so that it will be possible to detect the positions of the edges.

Namely, edges of wiring patterns can be detected or evaluated according to the edge likelihood Ei(X) of the above equation, with no regard to layers and right/left edges.

Each edge ei has a coordinate Xi on the axis X. Each edge detection region Si ranges, on the axis X, from Xi-ai to X+bi, and on the axis Y. from Yi-ci to Yi-di. When Xi-ai≦X≦Xi+bi, j=X-ai. For the sake of simplicity, Bi(X) =Bi(j) and E(X)=Ei(j).

Figure 7A:
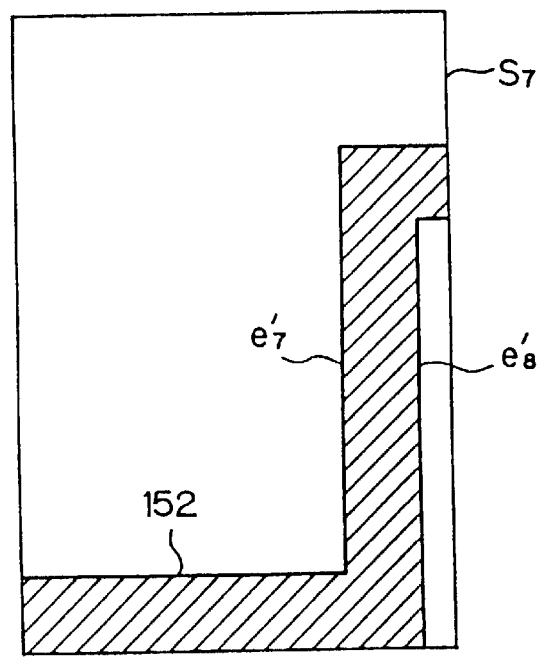
FIG. 7(A) shows one of the edge detecting areas of the secondary electron image.
Figure 7B:
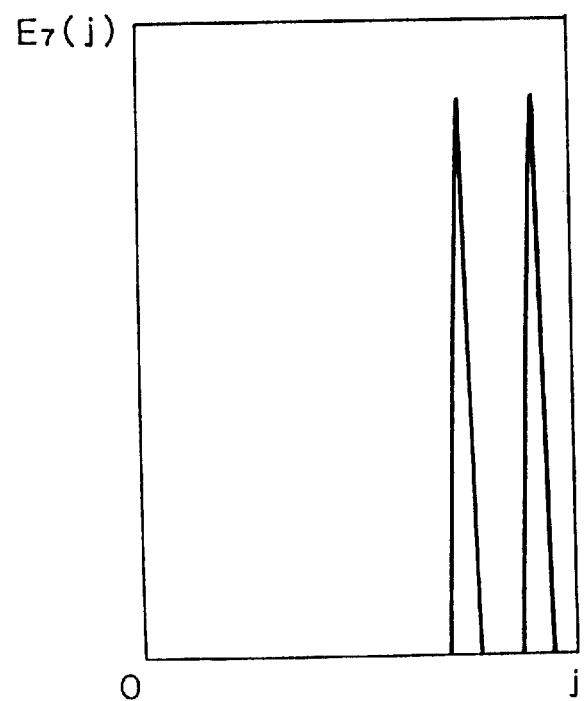
FIG. 7(B) shows edge likelihood obtained from luminance data of the edge detecting area of FIG. 7(A)

For the edge detection region 57 in the secondary electron image of FIG. 7(A), luminance L(X, Y) and projected luminance B7(j) are computed. Edge likelihood E7(j) is computed accordingly, as shown in FIG. 7(B). The edge likelihood E7(j) includes two peaks corresponding to edges e7' and e8'.

(Step S7)

A pattern matching operation is carried out to determine a secondary electron image magnification error ΔMo and a stage positioning error Δxo.

(Step S8)

According to these errors ΔMO and Δxo, the coordinate X of the measuring point P' of the secondary electron image corresponding to the measuring point P on the CAD data is computed as ΔXo+(1+ΔMo). X. similarly, the coordinate Y of the measuring point P' is obtained. The electron beam EB is oriented toward the measuring point P', to measure a voltage at the measuring point according to a known method. When determining the coordinate Y of the measuring point P' a device constant of (Y-axis magnification)/(X-axis magnification) may be set in advance, and then the magnification increase ΔM is fixed to αΔMo during the pattern matching operation. Next, the pattern matching level V will be explained. The ai and bi for a right edge of each wiring pattern are expressed as follows:

$$ai = es/f + |Xi \cdot em/100| + e1/f + ew/f$$

$$bi = es/f + |xi \cdot em/100| + e2/f + ew/f$$

and a left edge of the wiring pattern is expressed as follows:

$$ai = es/f + |Xi \cdot em/100| + e2/f + ew/f$$

$$bi = es/f + |Xi \cdot em/100| + e1/f + ew/f$$

where ±es/f is positioning accuracy of the electron beam EB on the coordinate system on the secondary electron image, ±em% is magnification accuracy of the secondary electron image, e1/f is a maximum reduction in the width of a wiring pattern, e2/f is a maximum increase in the width of a wiring pattern, and ew/f is the maximum width of an edge of a wiring pattern. The values es, em, e1, e2, and ew are independent of the magnification of the secondary electron image.

When each Xi is changed to Xi(1+ΔM)+ΔX+ΔWi, ji (=Xi-ai) is changed by Δji as follows:

$$\begin{aligned}\Delta ji &= Xi(1+\Delta M) + \Delta X + \Delta Wi - ai - (Xi - ai) \\ &= Xi\Delta M + \Delta X + \Delta Wk\end{aligned}$$

where ΔM is an increase in magnification relative to the CAD data, ΔX is a shift quantity relative to the CAD data, and ΔWk is an increase or a decrease in the width of a wiring pattern of the "k"th layer. The ΔWk is unchanged in the same layer. The ji is changed with -em/100≦ΔM≦em/100, -es/f≦ΔX≦es/f, and -e1/f≦ΔWi≦e2/f, to find the maximum pattern matching level V. Then, a magnification increase ΔM and shift quantity ΔX corresponding to the maximum pattern matching level V are set as the magnification error ΔMo and stage positioning error ΔXo.

The pattern matching level V is defined as follows:

$$\begin{aligned}V &= \Sigma\Sigma_{ixy}\{|L(X-q, Y) - L(X,Y)| + \\ &\quad |L(X, Y) - L(X+q,Y)|\}e(X, Y) \\ &= \Sigma\Sigma_{ix}\{|Bi(X-q) - Bi(X)| + \\ &\quad |Bi(X) - Bi(X+q)|\}e(X) \\ &= \Sigma\Sigma_{ix}Ei(X)e(X) \\ &= E1(j1) + E2(j2) + \ldots + En(jn)\end{aligned}$$

where $\Sigma_{ixy}$, is a sum of luminance for all combinations of X and Y in the edge detection region Si, $\Sigma_{ix}$ is a sum of luminance for all Xs in the edge detection region Si, and $\Sigma_i$. is a sum of luminance for the entire edge detection region Si.

The e(X, Y) will be 1 if there is an edge at a position (X, Y) on the CAD data, and 0 if there is no edge at the position (X, Y). Similarly, the e(X) will be 1 if there is an edge at a position X on the CAD data, and 0 if there is no edge at the position X.

Figure 4:
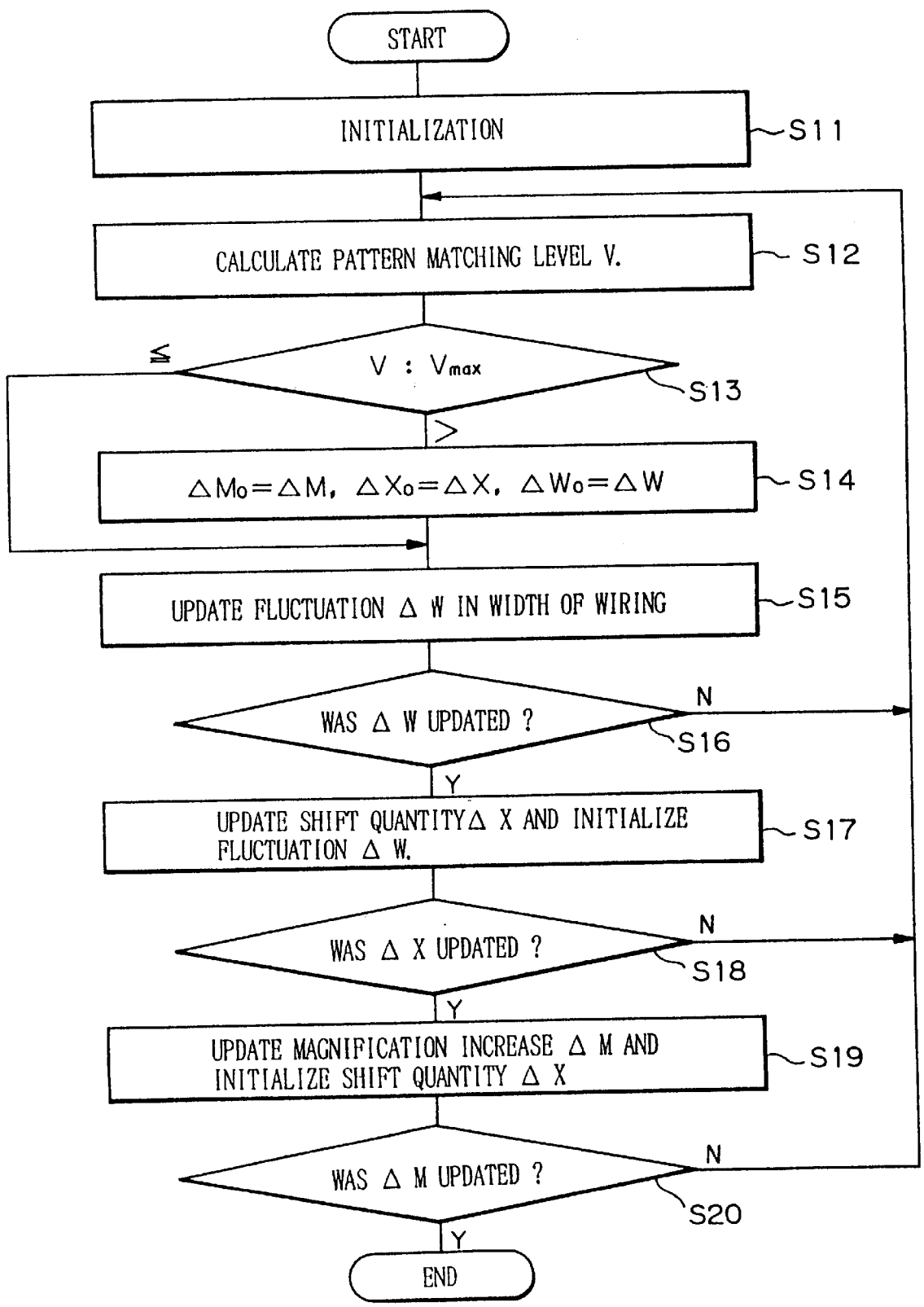
FIG. 4 is a flowchart showing a pattern matching operation.

The details of the step S7 will be explained with reference to FIG. 4.

(Step S11)

Variables are initialized. Namely, the fluctuation $\Delta W$ in the width of wiring, shift quantity $\Delta X$, and magnification increase $\Delta M$ used for calculating the pattern matching level V are initialized, and a maximum pattern matching level Vmax is set to 0. The fluctuation $\Delta W$ represents an increase or decrease $\Delta Wk$ (k=1 to m) in the width of wiring in a given layer.

(Step S12)

The pattern matching level V is computed.

(Steps S13 and S14)

If V>Vmax, the magnification increase $\Delta M$ and shift $\Delta X$ substitute for the secondary electron image magnification error $\Delta Mo$ and stage positioning error $\Delta Xo$.

(Step S15)

The fluctuation $\Delta W$ in the width of wiring is updated. This is done with units of pixels.

(Step S16)

If the fluctuation $\Delta W$ in the width of wiring has not been updated, the flow returns to the Step S12. If it has been updated, the flow proceeds to Step S17.

(Step S17)

The shift $\Delta X$ is updated, and the fluctuation $\Delta W$ in the width of wiring is initialized. This is done with units of pixels.

(Step S18)

If the shift $\Delta X$ has not been updated, the flow returns to the Step S12, and if updated, the flow proceeds to the next Step S19.

(Step S19)

The magnification increase $\Delta M$ is updated, and the shift quantity $\Delta X$ is initialized. For example, this is done such that a pixel at a position (f, 0) of FIG. 5(A) is shifted by one pixel according to the magnification increase $\Delta M$. Namely, $\Delta M=1/f$. The 1/f is a constant used for converting the es, e1, and e2 into coordinates on the secondary electron image.

(Step S20)

If the fluction $\Delta w$ has not been updated, the flow returns to the Step S12, and if updated, the pattern matching operation ends.

In this way, the secondary electron image magnification error $\Delta Mo$ and stage positioning error $\Delta Xo$ are determined.

Second Embodiment

Unlike the first embodiment that handles wiring patterns extending in parallel with axes X and Y, the second embodiment handles oblique patterns that are not in parallel with the axes X and Y.

Figure 9A:
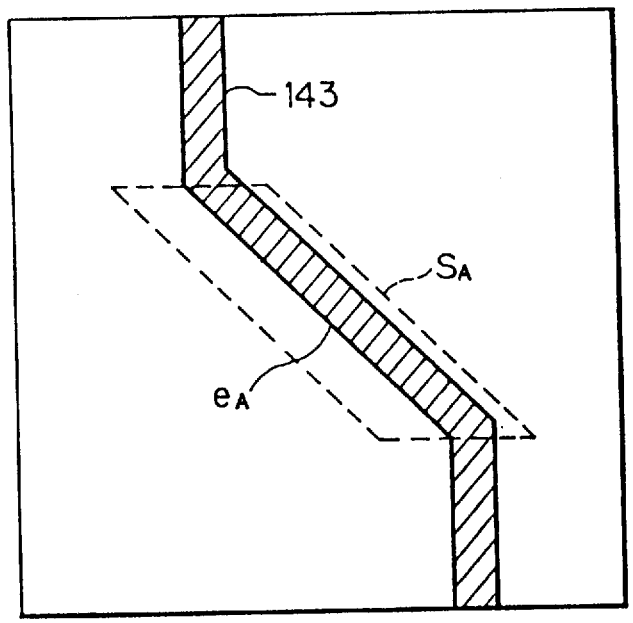
FIG. 9(A) shows an oblique pattern formed from CAD data.
Figure 9B:
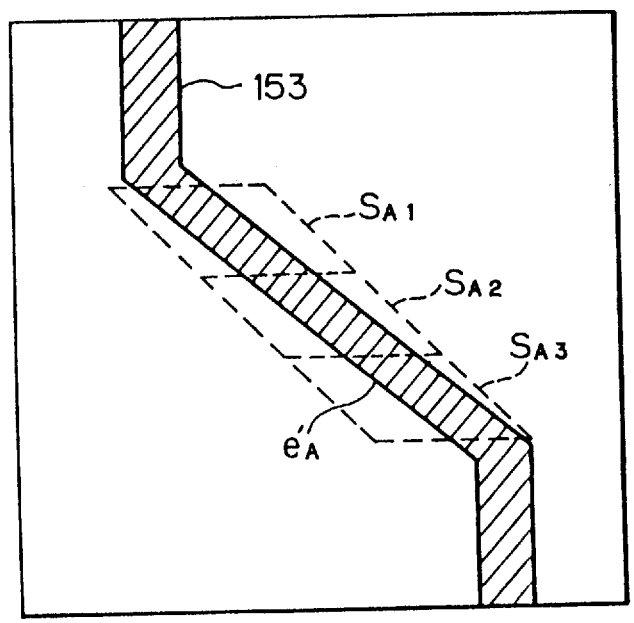
FIG. 9(B) shows edge detecting areas Si defined in a secondary electron image obtained from FIG. 9(A)
Figure 10A:
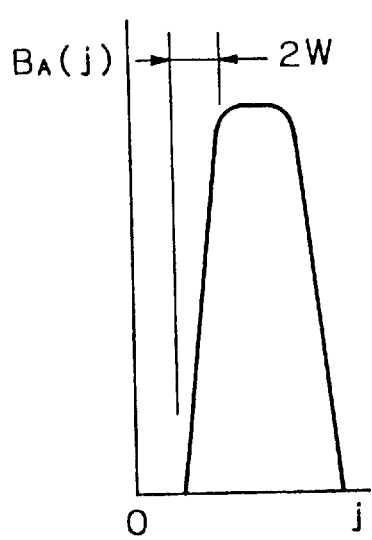
FIGS. 10(A) to 10(D) explain distributions of projected luminance and expected edges of the oblique pattern.
Figure 10B:
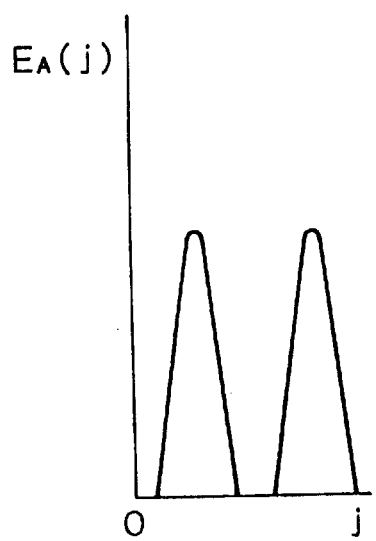
Figure 10C:
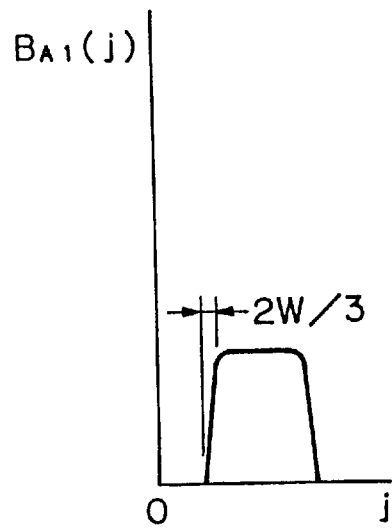

In FIG. 9(A), a wiring pattern 143 formed from the CAD data has an edge eA for which a detection region SA surrounded by dotted lines is set. This edge detection region SA is applied to a secondary electron image as shown in FIG. 9(B). A sum of luminance L is calculated along a straight line extending in parallel with an oblique side of the edge detection region SA, to obtain a projected luminance distribution as shown in FIG. 10(A). In this figure, an edge width 2W is relatively wide to incorrectly carry out a pattern matching operation. In this case, obliquely projected luminance will be as shown in FIG. 10(B). The edge width 2W is wide because of a magnification error.

Figure 10D:
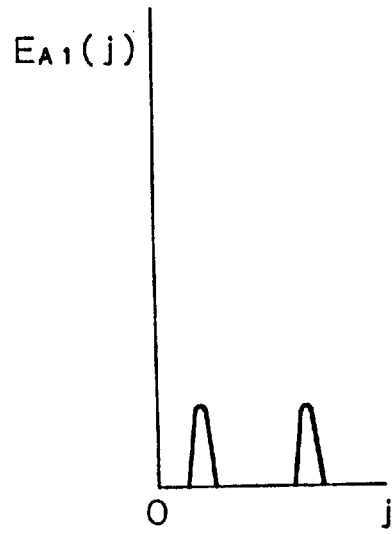
Figure 11:
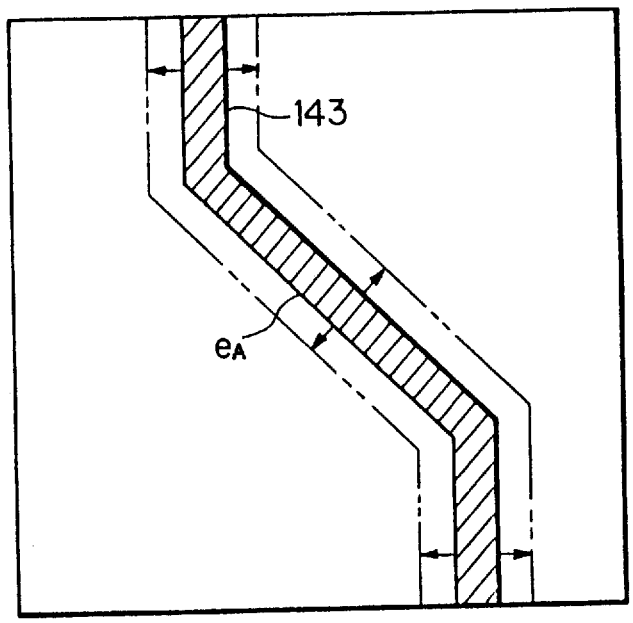
FIG. 11 is an enlarged view showing the oblique pattern.

Accordingly, the second embodiment of the present invention divides the edge detection region SA into, for example, three regions SA1, SA2, and SA3 as shown in FIG. 9(B). The edge detection region SA1 provides obliquely projected luminance BA1(j) shown in FIG. 10(C) where the edge width is 2W/3, which is one third of that of FIG. 10(A). In this case, edge likelihood EA1(j) shown in FIG. 10(D) provides more acute peaks than in the case of FIG. 10(B). The pattern matching level V is obtained by computing edge likelihood of each divided detection region and by calculating a sum of them, as mentioned before. As shown in FIG. 11, the oblique pattern is expanded in the direction of an arrow mark that is orthogonal to the edges of the pattern before expansion. Other parts of the second embodiment are the same as those of the first embodiment.

As explained above, the pattern matching apparatus according to the first aspect of the present invention projects a secondary electron image on an axis X to obtain a luminance distribution B(X), and according to the luminance distribution, computes edge likelihood E(X). Then, a pattern matching level V is calculated according to the edge likelihood E(X) and edge positions Xi (i=1 to n) provided by CAD data. The edge positions Xi (i=1 to n) are changed according to secondary electron image magnification accuracy, sample positioning accuracy, and fluctuations in the width of wiring, to find a maximum pattern matching level. Then, a secondary electron image magnification error and a sample positioning error corresponding to the maximum pattern matching level are obtained. Accordingly, the first aspect of the present invention simply, correctly, quickly matches wiring patterns prepared from the CAD data with wiring patterns included in the secondary electron image, thereby improving the operability of an electron beam apparatus.

A wiring pattern tester according to the second aspect of the present invention will be explained with reference to FIGS. 12 to 19. The tester measures a voltage of wiring of a semiconductor chip with use of an electron beam.

A conventional wiring pattern tester scans an integrated circuit formed on a semiconductor chip with an electron beam to obtain a secondary electron image (a SEM image), emits an electron beam toward a measuring point on wiring patterns of the semiconductor chip specified according to the SEM image, and measures a voltage of the wiring. The wiring pattern tester must correctly orient the electron beam toward the measuring point on the wiring whose voltage is to be measured.

Figure 19:
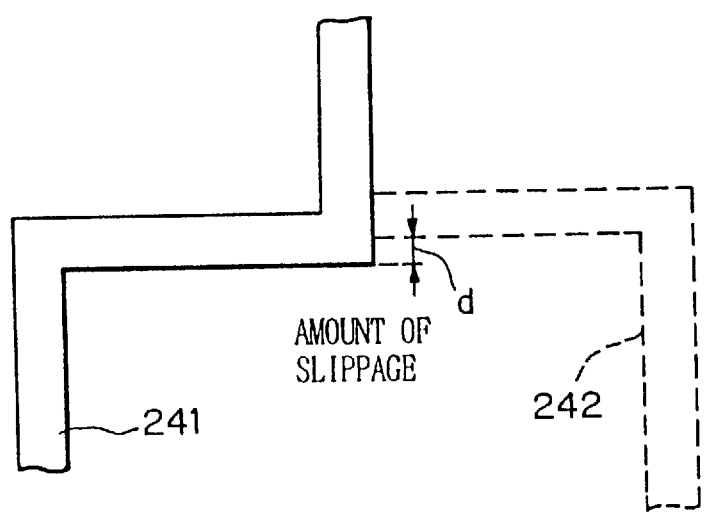
FIG. 19 explains a problem of a prior art.

The applicant of the present invention has disclosed in Japanese patent publication No. 4-47174 (Japan '174) an apparatus for measuring the voltage of internal wiring of an LSI chip with use of an electron beam. To automatically measure the voltage of the internal wiring of the chip, Japan '174 matches mask patterns (layout) prepared from CAD data used for designing the chip with patterns obtained from a secondary electron image (a SEM image) of the chip, to automatically position the electron beam at a measuring point. This technique projects the SEM image onto the X and Y, axis extracts wiring edges from the projected data, correlates the extracted edges with the mask patterns (layout), and adjusts the electron beam in X and Y directions LSI chip manufacturing allows slippage of up to 20% of a minimum wiring width among layers. FIG. 19 shows a SEM image of an LSI chip having two wiring layers. In the figure, wiring indicated with dotted lines in a first layer 242 has a slippage of "d" relative to wiring indicated with continuous lines in a second layer 241.

A conventional matching method employed for a wiring pattern tester mainly depends on wiring edges in the second (top) layer 241. Namely, the conventional method determines a match if the wiring edges in the second layer 241 having the clearest contrast correlate with reference data. This raises a problem that the positioning of an electron beam onto the wiring in the first layer 242 will be incorrect by the slippage d between the first and second layers 242 and 241. This causes a serious problem because recent LSI chips involve very fine wiring that requires the precise positioning of an electron beam.

An object of the second aspect of the present invention is to correctly carry out a pattern matching operation even if there is slippage among layers of a semiconductor chip, and correctly position an electron beam onto a measuring point.

A wiring pattern tester according to the second aspect of the present invention comprises a layout data storage for storing a layout of each wiring layer of a semiconductor chip, detection means for comparing a SEM image provided by an electron beam unit with the layout of each wiring layer read out of the layout data storage, to detect slippage between the SEM image and the layout, and scan control means for controlling a two-dimensionally movable stage according to the slippage detected by the detection means so that an electron beam is oriented toward a measuring point on the semiconductor chip. The layout data storage stores the layout of each wiring layer of the semiconductor chip. A pattern matching unit matches the layout of each wiring layer stored in the layout data storage with the SEM image of the corresponding layer provided by the electron beam unit. This arrangement correctly positions an electron beam onto a measuring point on a wiring layer.

Figure 12:
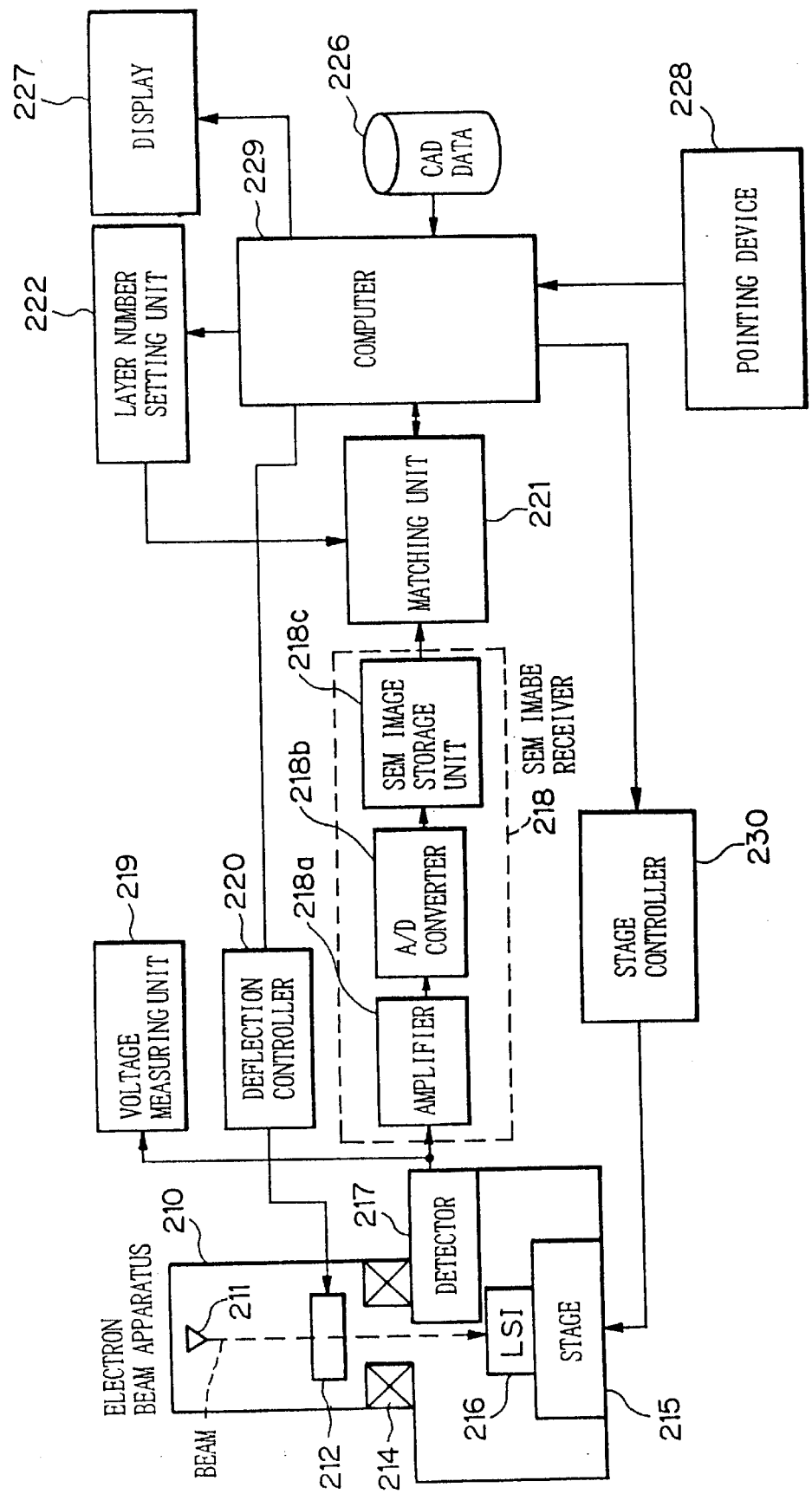
FIG. 12 is a block diagram showing a wiring pattern tester according to an embodiment of the second aspect of the present invention.

FIG. 12 shows an embodiment according to the second aspect of the present invention. An electron beam unit 210 has an electron gun 211, which emits an electron beam. The electron beam is deflected by a scan deflector 212 and oriented, by an electronic lens 214, toward a semiconductor chip 216 to be tested. The semiconductor chip 216 is placed on a two-dimensionally movable stage 215. Secondary electrons produced by the semiconductor chip 216 are detected by a detector 217. The detector 217 provides a detection signal to a SEM image receiver 218 and to a voltage measuring unit 219. A deflection controller 220 controls the scan deflector 212 so that the electron beam scans the whole surface of the semiconductor chip 216. The detector 217 provides a SEM image to the SEM image receiver 218. The SEM image receiver 218 digitizes the SEM image and stores the digitized image.

The SEM image receiver 218 comprises an amplifier 218a, an analog-to-digital (A/D) converter 218b, and a SEM image storage 218c. The amplifier 218a amplifies the signal from the detector 217 and supplies the amplified signal to the A/D converter 218b. The A/D converter 218b converts the analog signal from the amplifier 218a into a digital signal, which is stored in the SEM image storage 218c.

CAD data (layout data) of the semiconductor chip 216 is stored in an image storage unit 226. The layout data stored in the image storage unit 226 are controlled by a computer 229 and displayed on a display unit 227. A pointing device 228 is used to specify a measuring point on the layout displayed on the display unit 227.

The pointing device 228 is also used to select a region to be displayed. One may specify a necessary region on the display unit 227 through the pointing device 228, and then data related to the specified region is read out of the image storage unit 226 and displayed as an enlarged view on the display unit 227.

Thereafter, one may use the pointing device 228 to specify a measuring point on the enlarged view on the display unit 227. The computer 229 controls a stage controller 230 so that the stage 215 is moved to a location where the electron beam correctly irradiates the measuring point.

The stage controller 230 controls the stage 215 according to an instruction provided by the computer 229.

The computer 229 also controls the deflection controller 220 to orient the electron beam toward the measuring point on the semiconductor chip 216. Secondary electrons emitted from the measuring point are detected by the detector 217, and an output of the detector 217 is measured by the voltage measuring unit 219.

A matching unit 221 matches the SEM image provided by the SEM image receiver 218 with the CAD data of the semiconductor chip 216 stored in the image storage unit 226. A layer number setting unit 222 sets the number of a layer to be tested. The layer number setting unit 222 may be realized in a memory or in a disk unit. The matching unit 221 refers to the layer number setting unit 222 for a layer number and reads mask patterns of the layer corresponding to the layer number.

Figure 13:
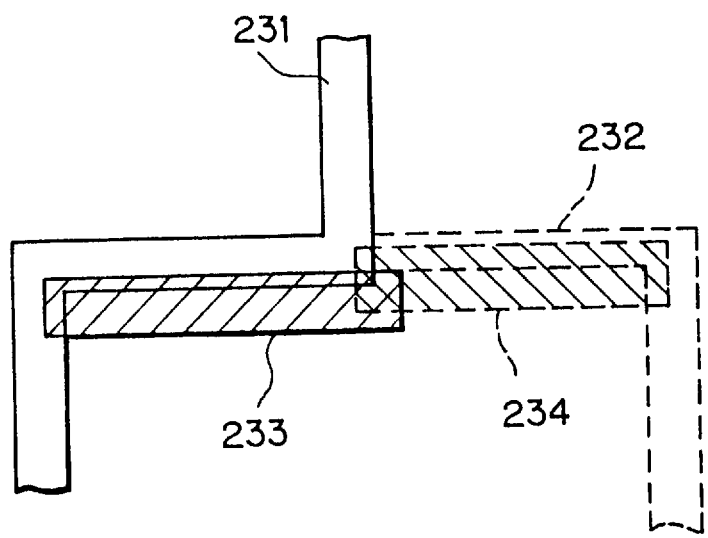
FIG. 13 shows an operation of the tester of Fig. 12.
Figure 14:
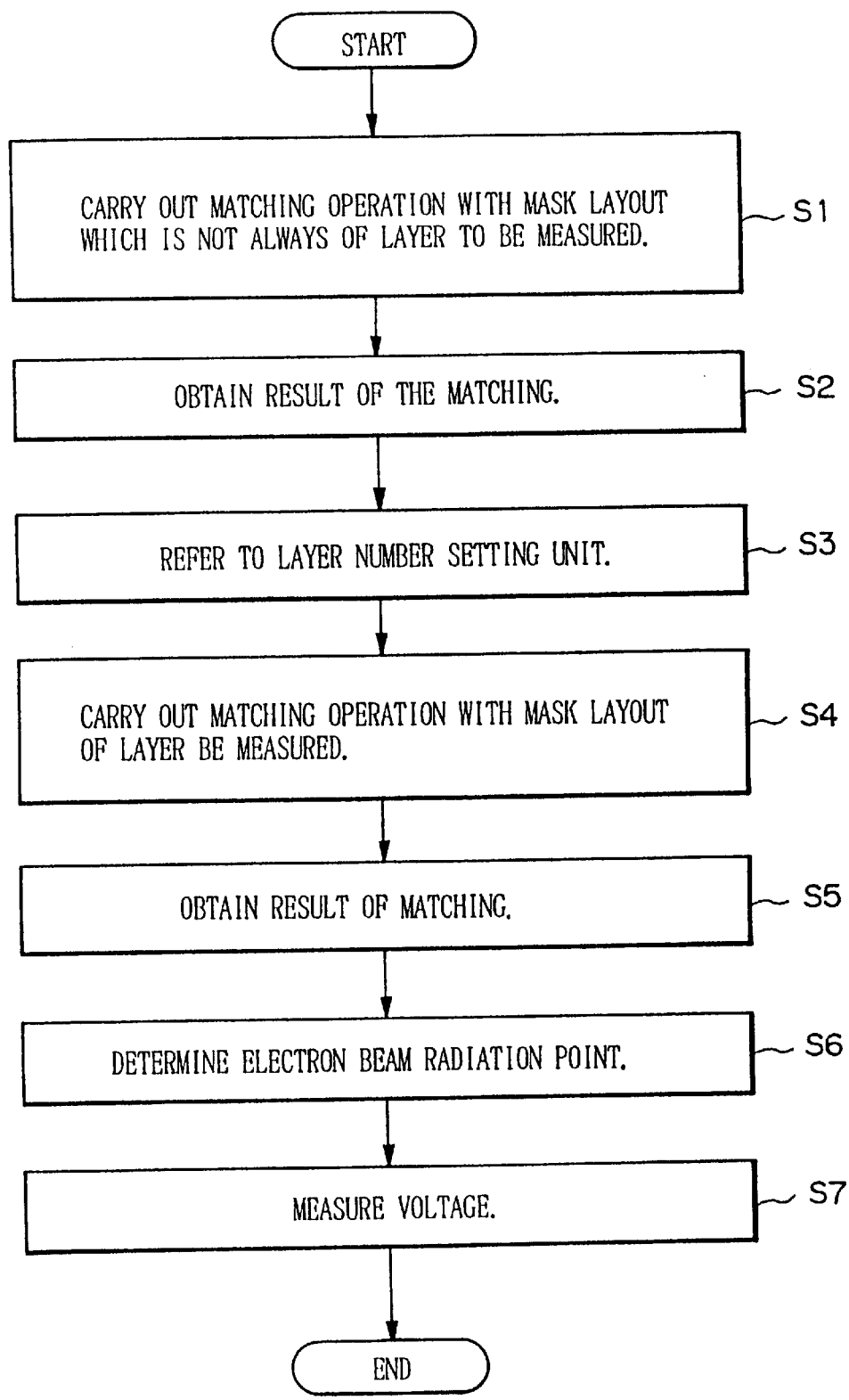
FIG. 14 is a flowchart showing an operation of the tester of FIG. 12.

FIG. 13 is a model showing a matching operation to be carried out layer by layer. Continuous lines indicate wiring 231 of a second layer, and dotted lines represent wiring 232 of a first layer. Hatched rectangular regions represent projection regions 233 and 234 that are laterally projected. For each wiring edge, one projection region such as the region 233 or 234 is defined. Namely, an independent projection region such as the projection region 233 or 234 is defined for each wiring edge, and the matching operation is carried out layer by layer.

A layer number of wiring to be measured is referred to, and mask patterns of the layer having the specified layer number are selected for the matching operation. When carrying out the matching operation only with wiring patterns of a target layer, a matching result will be incorrect because the number of edges involved in the matching operation is small. Accordingly, the second aspect of the present invention carries out the matching operation according to a flowchart of FIG. 14. At first, steps S1 and S2 carry out the matching operation with use of mask patterns of a layer that is not necessarily the target layer (for example, the top layer having clear contrast). Steps S3 to S5 read mask data according to the layer number set in the layer number setting unit 222, correct slippage of the mask data according to a result of the matching operation of the steps S1 and S2, and carry out another matching operation on the mask patterns of the layer whose layer number is set in the layer number setting unit 222.

According to a result of the matching operation carried out in the steps S3 to S5, step S6 determines an electron beam radiation point for measuring a voltage. Step S7 irradiates the point determined in the step S6 with an electron beam, to measure a voltage at the point.

As explained above, this embodiment carries out a matching operation on wiring of the semiconductor chip 216 layer by layer, so that it can correctly position an electron beam on a measuring point of each layer.

Figure 15:
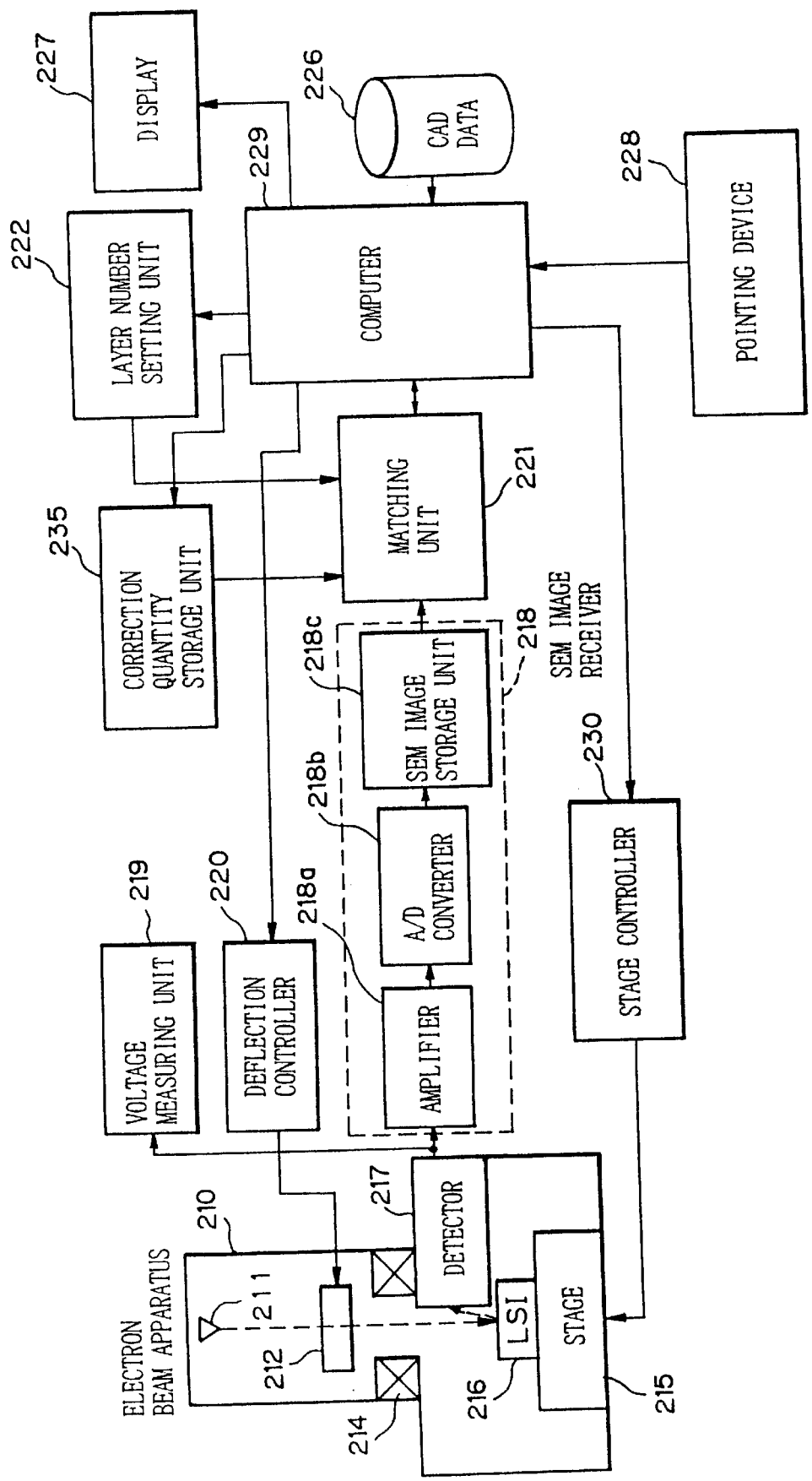
FIG. 15 is a block diagram showing another embodiment according to the second aspect of the present invention.

FIG. 15 is a block diagram showing a second embodiment according to the second aspect of the present invention. In the figure, the same parts as those shown in FIG. 12 are represented with like reference marks, and their explanations will not be repeated.

A matching unit 221, layer number setting unit 222, etc., are the same as those of FIG. 12. The second embodiment is characteristic in that it has a correction quantity storage unit 235, which is realized in a memory of a computer or in a disk unit. The correction quantity storage unit 235 stores a slippage correction quantity for each combination of a layer number and a positioning direction (X or Y). The correction quantities are set before starting matching and measuring operations. The matching unit 221 matches mask patterns read out of an image storage unit 226 with a SEM image provided by a SEM image receiving unit 218. The SEM image and the mask patterns are matched with each other after shifting the SEM image or the mask patterns by a slippage quantity corresponding to a peak matching evaluation level on a characteristic curve, which represents a relationship between a matching evaluation level and slippage between the SEM image of the chip and the stored patterns.

The pattern matching operation is carried out with respect to mask patterns of a layer (for example, a top layer) having clear contrast at first, and a result of the matching is corrected by adding a correction quantity read out of the correction quantity storage unit 235 according to the layer number of the layer where the measuring point is present.

Figure 16A:
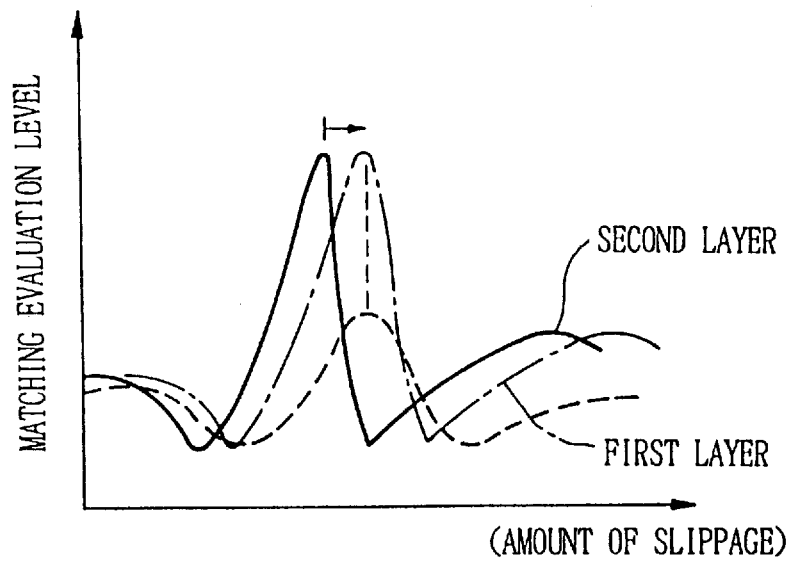
FIGS. 16(A) and 16(B) explain an operation of the embodiment of FIG. 15.
Figure 16B:
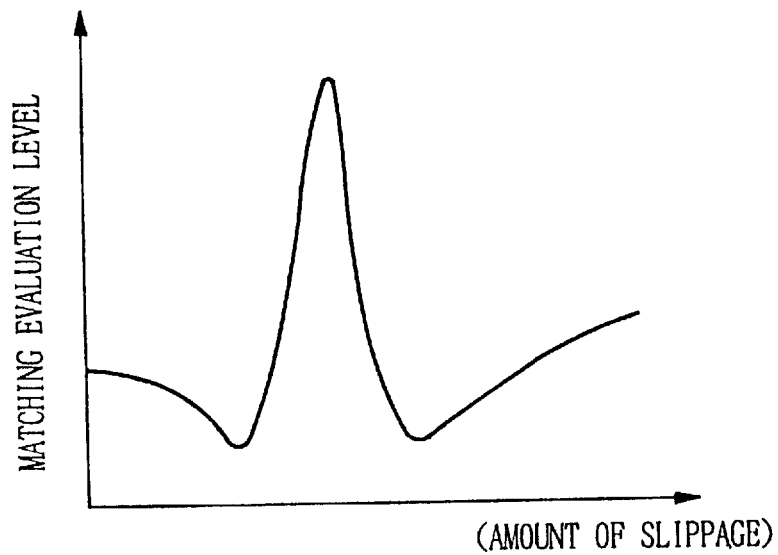

There is another pattern matching method. This method carries out a matching process layer by layer with use of a correction quantity of each layer stored in the correction quantity storage unit 235, to find a matching evaluation level of each layer. According to the matching evaluation levels of the individual layers, a total evaluation level for all layers is computed to determine a point toward which an electron beam is emitted. This method will be explained with reference to FIGS. 16(A) and 16(B). In FIG. 16(A), a continuous line is a characteristic curve showing slippage between mask patterns and a SEM image and a matching evaluation level obtained only with mask patterns of the second layer, and a dotted line is a characteristic curve showing slippage and a matching evaluation level obtained only with mask patterns of the first layer. Since the first layer has a smaller number of evaluation points, the evaluation level of the first layer indicated with the dotted line is lower than that of the second layer indicated with the continuous line. The characteristic curve of the second layer indicated with the continuous line is shifted by "d" to a characteristic curve indicated with a dot-and-dash line, to provide a slippage corrected evaluation level of the second layer. This corrected characteristic curve is added to the characteristic curve of the first layer indicated with the dotted line, to provide an overall characteristic curve of FIG. 16(B) representing a relationship between the matching evaluation level and the slippage. When a matching operation is carried out only on a layer where wiring to be measured is present, a correct matching result will not be obtained if there are a plurality of candidate matching points in the layer. In this case, the technique of FIGS. 16(A) and 16(B) is effective.

FIG. 17 is a block diagram showing a third embodiment of the second aspect of the present invention. In the figure, the same parts as those of FIGS. 12 and 15 are represented with like reference marks, and their explanations will not be repeated.

Figure 18:
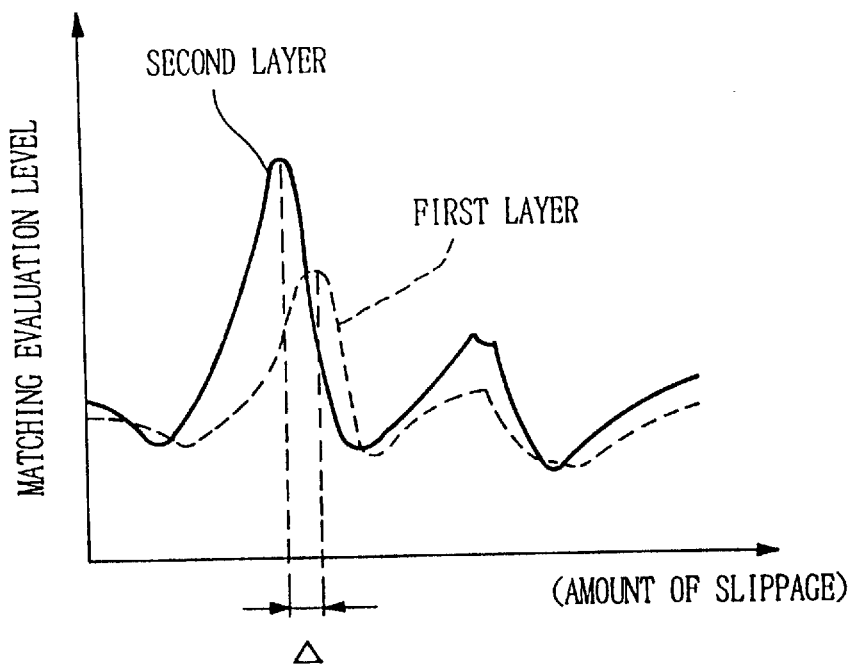
FIG. 18 shows an operation of the embodiment of FIG. 17.

This embodiment employs a slippage quantity detection unit 236 in addition to the correction quantity storage unit 235. The correction quantity storage unit 235 stores a correction quantity that is calculated according to slippage among layers detected by the slippage quantity detection unit 236. A method of detecting slippage by the slippage detection unit 236 will be explained. When a matching operation is carried out on individual layers of a multilayered chip, slippage among layers appears as a difference between peak positions of characteristics curves showing matching evaluation levels and slippage quantities, as shown in FIG. 18. In the figure, the characteristic curve indicated with a continuous line shows matching evaluation levels and positional slippage between mask patterns of a second layer and a SEM image thereof, and the characteristic curve indicated with a dotted line shows matching evaluation levels and positional slippage between mask patterns of a first layer and a SEM image thereof. A difference Δ between peaks of the continuous and dotted lines represents slippage between the two layers. The slippage detection unit 236 detects this difference Δ.

In this way, the second aspect of the present invention evaluates a matching level of each layer of a semiconductor chip, corrects the matching level according to slippage between the layers, and correctly positions an electron beam onto wiring to be tested of each layer.

A secondary electron image corrector according to the third aspect of the present invention will be explained with reference to FIGS. 20 to 28. The third aspect of the present invention corrects deformation of a secondary electron image that is obtained by scanning a sample with an electron beam emitted from an electron beam apparatus.

When an electron beam tester measures a voltage of wiring formed on a semiconductor chip, the tester scans the surface of the chip with an electron beam to provide a secondary electron image of the chip, and displays the image on a display unit. An operator observes the displayed image, specifies a measuring point on the displayed image, irradiates the measuring point with an electron beam, and measures the voltage. As semiconductor circuits become highly integrated and their scale increased, a view field of the secondary electron image becomes smaller to specify a measuring point on the secondary electron image.

A conventional technique specifies a measuring point on wiring patterns prepared from CAD data and matches the CAD patterns with patterns of a secondary electron image, to automatically convert the measuring point on the CAD data into a measuring point on the secondary electron image.

The secondary electron image is deformed if there is an error in orthogonality between X and Y deflectors of an electron beam emitter, or if there is a difference in sensitivities of the X and Y deflectors, or if there is an error in parallelism between an axis X of a stage and an axis X of a sample disposed on the stage. Such deformation of the secondary electron image must be corrected before carrying out the pattern matching operation. This correction is usually done manually by observing the secondary electron image and by gradually changing matrix parameters for converting an electron beam scan position into currents to be supplied to the X and Y deflectors.

Changing the matrix parameters is equal to rotating axes X and Y of the secondary electron image, i.e., axes X and Y of the CAD data.

Such a manual correction cannot reduce a rotational correction error in the X and Y axes less than 0.5 degrees. To reduce an influence of local electric field effect and accurately measure a voltage, the radius of an equipotential circle around a spot irradiated with an electron beam must be as large as possible. To achieve this, the electron beam must be oriented to the center of the width of a target wiring pattern. To reduce an error in positioning the beam at the center of a wiring pattern of 1 μm wide within 10%, a correction error in rotating the axes X and Y must be within 0.1 to 0.2 degrees.

The conventional manual correction technique that gradually and repetitively rotates the axes X and Y is troublesome.

An object of the third aspect of the present invention is to accurately and automatically correct deformation of a secondary electron image.

Figure 20:
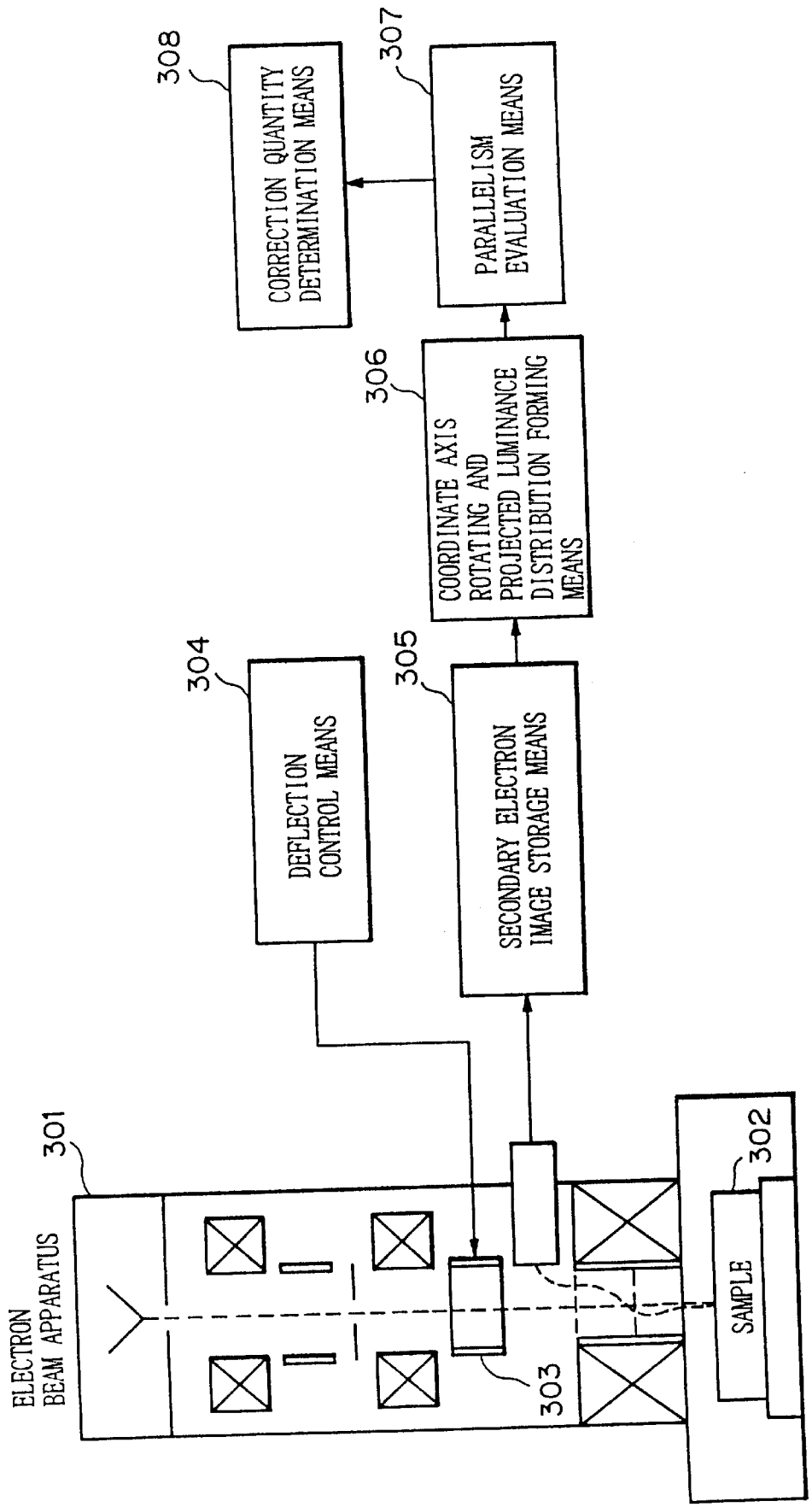
FIG. 20 shows a basic arrangement of a secondary electron image corrector according to the third aspect of the present invention.

FIG. 20 is a block diagram showing a basic arrangement of a secondary electron image corrector according to the present invention.

This corrector corrects deformation of a secondary electron image provided by scanning a sample 302 with an electron beam EB emitted from an electron beam unit 301. The corrector comprises deflection control means 304 for linearly transforming, according to linear transformation parameters, an electron beam scan position into drive signals to first and second deflectors 303 having different deflection directions, secondary electron image storage means 305 for storing the secondary electron image, means 306 for rotating an axis Y of an X-Y coordinate system and accumulating luminance of the secondary electron image along the axis Y, to obtain a projected luminance distribution B(X), parallelism evaluation means 307 for computing a parallelism value d indicating parallelism between wiring patterns and the axis Y according to the projected luminance distribution B(X), and correction quantity determination means 308 for obtaining a rotational angle As of the axis Y for achieving a maximum parallelism value d. The rotational angle As is used to correct deformation of the secondary electron image.

The axis Y is rotated by changing the linear transformation parameters to actually rotate a secondary electron image, or by virtually rotating the secondary electron image without changing the linear transformation parameters.

According to the first technique, the means 306 changes the linear transformation parameters to rotate the axis Y of the X-Y coordinate system with its axis X being fixed. This technique easily provides a projected luminance distribution after rotating the axis Y.

Figure 28:
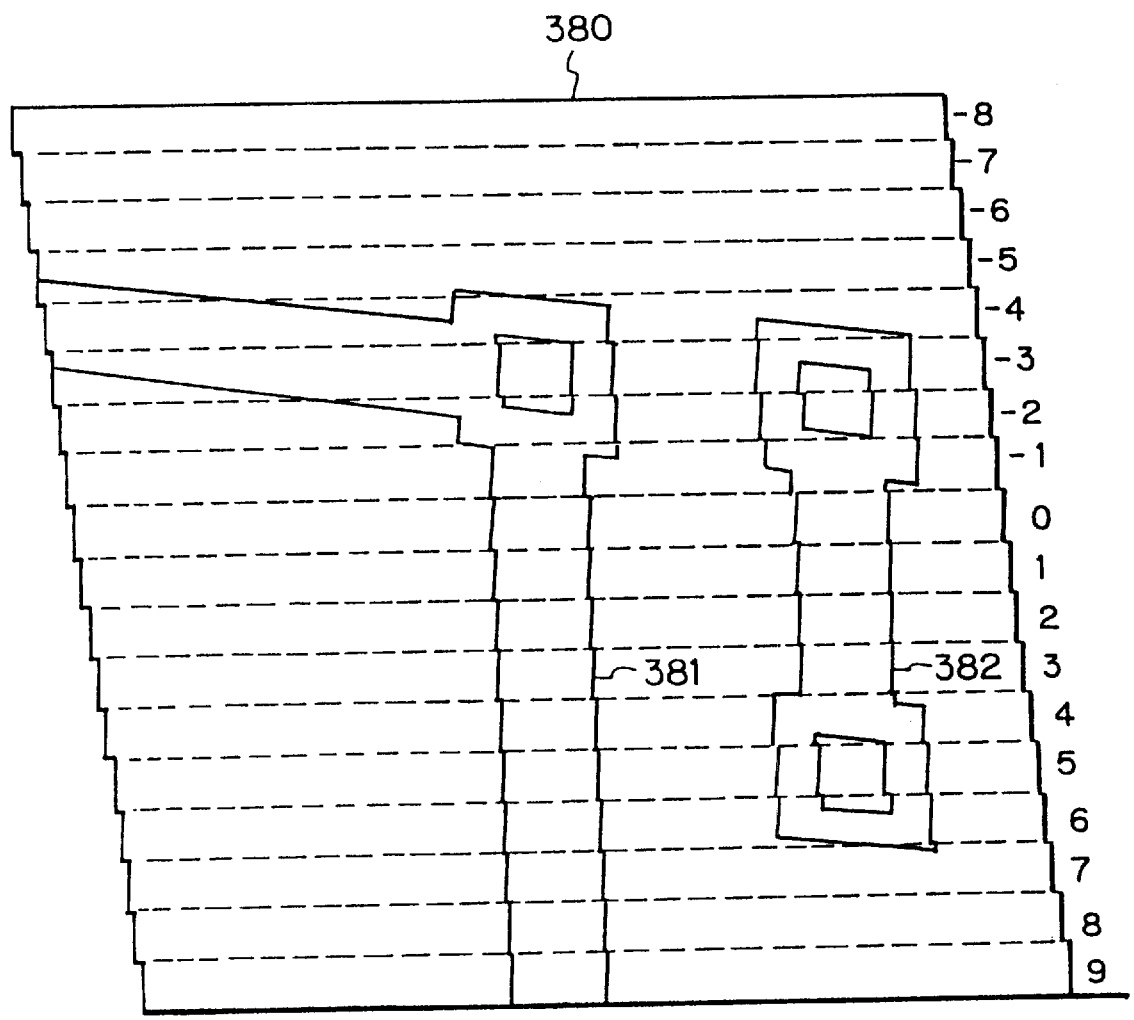
FIG. 28 shows the virtual rotation of an axis Y of a secondary electron image.

According to the second technique, the means 306 shifts rows of pixels in parallel with the axis X of the X-Y coordinate system, to rotate the axis Y with the axis X being fixed as shown in FIG. 28. According to this technique, it is not necessary to change the linear transformation parameters to obtain a rotated secondary electron image, so that a projected luminance distribution with the rotated axis Y is obtainable in a short time.

Secondary electron image correctors according to embodiments of the third aspect of the present invention will be explained with reference to the drawings.

First Embodiment

Figure 21:
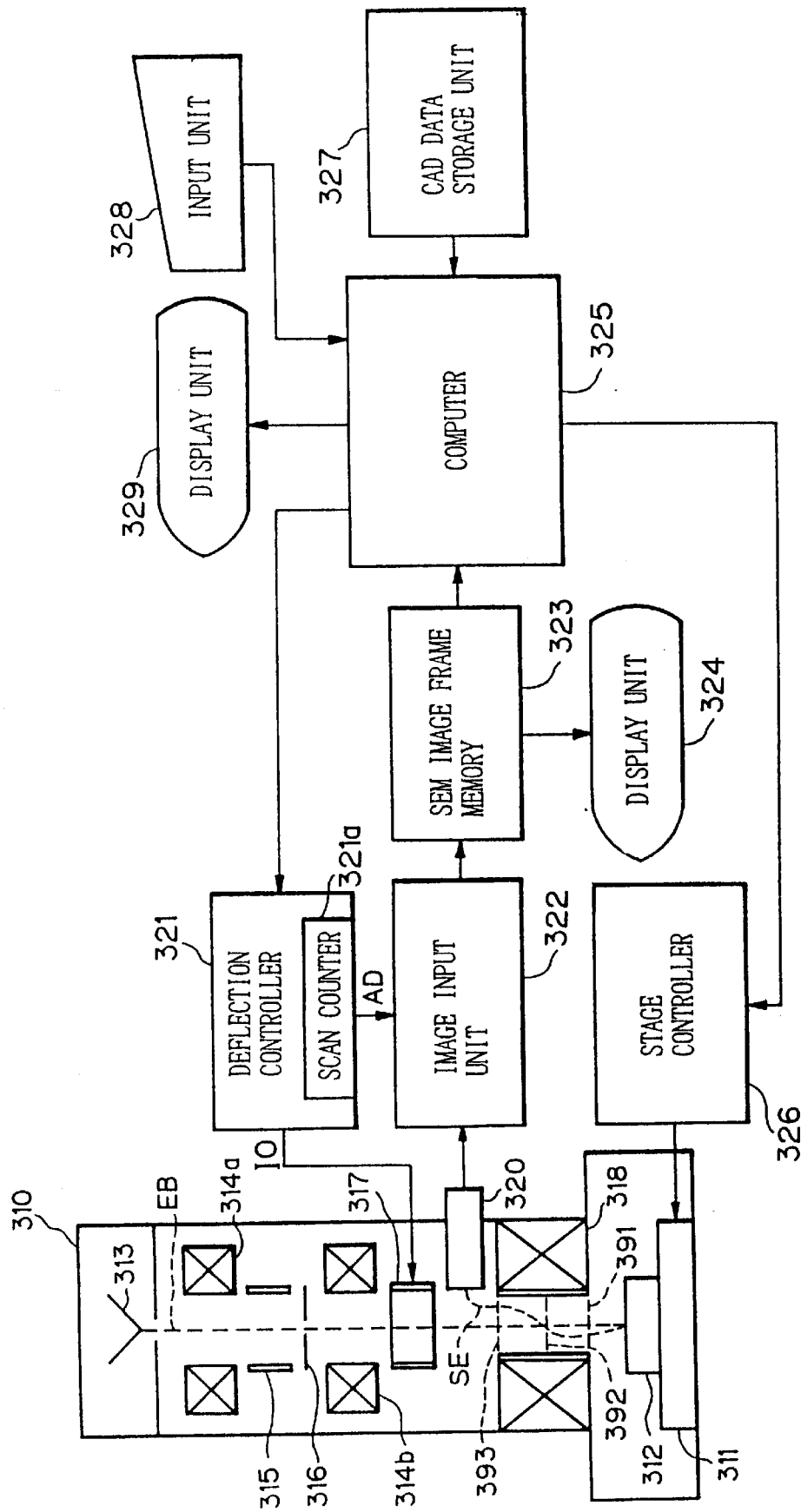
FIG. 21 shows an electron beam tester employing the secondary electron image corrector of FIG. 20.

FIG. 21 shows an electron beam tester for measuring a voltage by specifying a measuring point on wiring patterns prepared from CAD data and by automatically determining a corresponding measuring point on a secondary electron image.

An electron beam unit 310 detects a voltage at the measuring point on a sample 312 and the quantity of secondary electrons according to a voltage applied to an energy analytic grid 393. A stage 311 carries the sample 312. An electron gun 313 emits an electron beam EB toward the sample 312. The electron beam EB is converted into pulses through a capacitor magnetic field lens 314a, a blanking deflector 315, and a blanking aperture 316. The pulses are passed through a capacitor magnetic field lens 314b, a deflector 317, and an object magnetic field lens 318, and focused at the measuring point on the sample 312. The measuring point emits secondary electrons SE, which are passed through a pullout grid 391, a control grid 392, and the energy analytic grid 393, and are detected by a secondary electron detector 320 to provide a secondary electron image.

The point on the sample 312 irradiated with the electron beam is controlled by a drive current supplied from a deflection controller 321 to coils of the magnetic field deflector 317. Magnification of the secondary image is inverse proportion to an amplitude IO of the drive current. The deflection controller 321 has a scan counter 321a for providing a count AD corresponding to the electron beam scanning position. The scan counter 321a counts pulses of a clock signal CK and provides the count AD to an image input unit 322. The count AD from the scan counter 321a comprises, for example, 18 bits including 9 upper bits Y and 9 lower bits X. Theoretically, a current of IO(X−256)/256 is supplied to an X deflection coil of the deflector 317 and a current of IO(Y−256)/256 is supplied to a Y deflection coil of the deflector 317.

The image input unit 322 amplifies an output of the secondary electron detector 320, converts the amplified output into digital data, and writes the digital data as luminance L at an address AD in a SEM image frame memory 323. The contents of the SEM image frame memory 323 are supplied to a display unit 324, which displays the secondary electron image. Also, a computer 325 reads and processes the contents of the SEM image frame memory 323.

A CAD data storage unit 327 stores CAD data for providing photomask patterns of wiring patterns. The computer 325 reads CAD data of a specified region out of the CAD data storage unit 327, determines a target position of the stage 311, sets the target position in a stage controller 326, matches the secondary electron image with the CAD data, and determines a measuring point on the secondary electron image according to a measuring point set on the CAD data.

The measuring point on the CAD data is entered through an input unit 328, which may be a keyboard or a storage unit. A display unit 329 displays the entered data and other data.

Figure 22:
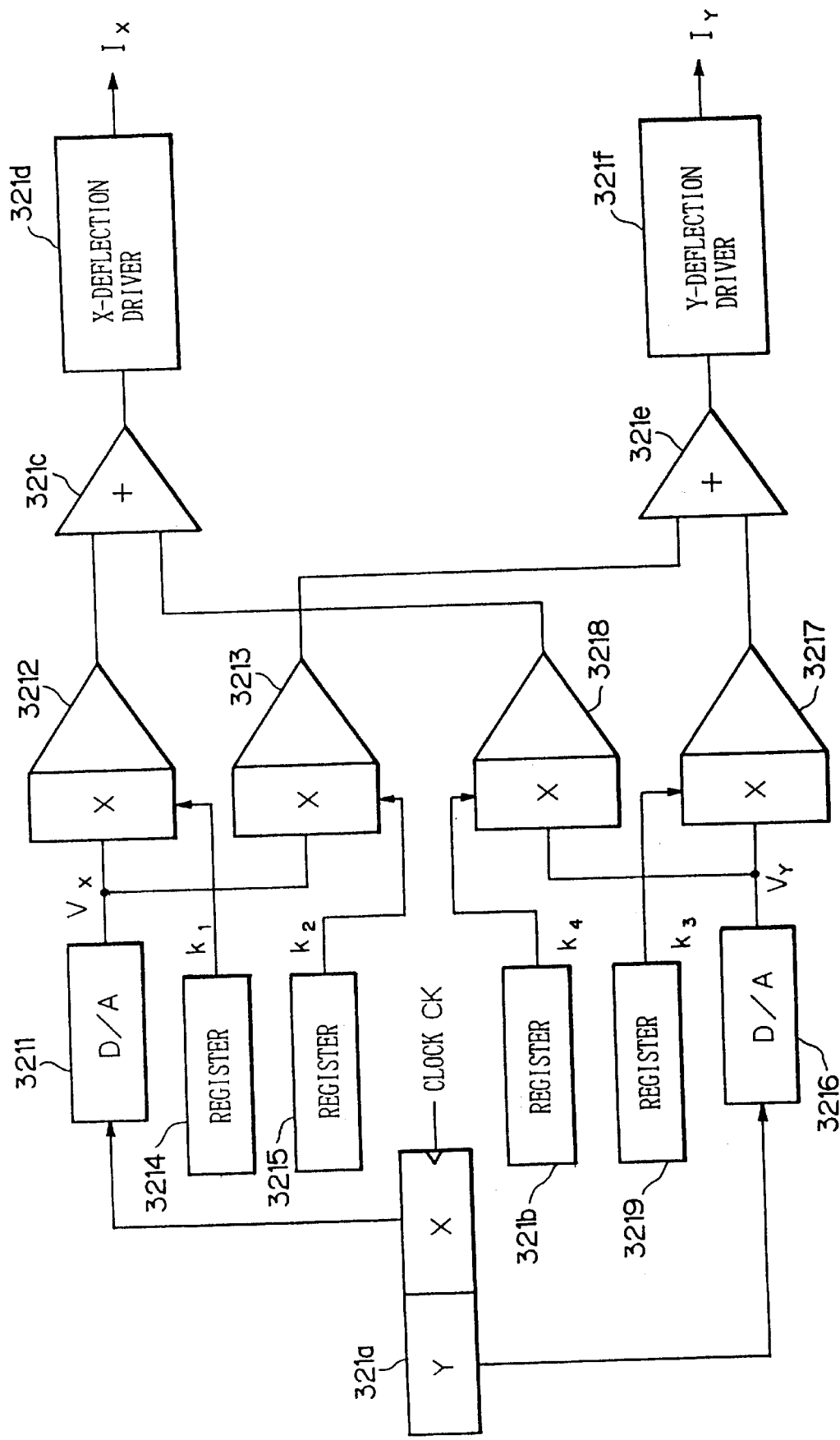
FIG. 22 is a block diagram showing a deflection controller shown in FIG. 21.

FIG. 22 shows an arrangement of the deflection controller 321.

The lower 9 bits X of the count AD provided by the scan counter 321a are supplied to a D/A converter 3211 to provide a voltage Vx. The voltage Vx is supplied to multipliers 3212 and 3213. The multiplier 3212 amplifies the voltage Vx by a value k1 set in a register 3214. The multiplier 3213 amplifies the voltage Vx by a value k2 set in a register 3215. Similarly, the upper 9 bits Y of the count AD are supplied to a D/A converter 3216, which provides a voltage Vy. The voltage Vy is supplied to multipliers 3217 and 3218. The multiplier 3217 amplifies the voltage Vy by a value k3 set in a register 3219. The multiplier 3218 amplifies the voltage Vy by a value k4 set in a register 321b.

An adder 321c receives output voltages of the multipliers 3212 and 3218 and adds them to each other. An X deflector driver 321d proportionally converts an output voltage of the adder 321c into a current Ix. An adder 321e receives output voltages of the multipliers 3213 and 3217 and adds them to each other. A Y deflector driver 321f proportionally converts an output voltage of the adder 321e into a current Iy.

The currents Ix and Iy are supplied to coils of the X and Y deflectors 317, respectively. These currents Ix and Iy are expressed as follows:

$$Ix = \alpha(k1 Vx + k4 Vy) \tag{1}$$

$$Iy = \alpha(k2 Vx + k3 Vy) \tag{2}$$

where $\alpha$ is a constant. Theoretically, k1=1, k2=0, k3=1, and k4=0.

The registers 3214, 3215, 3219, and 321b are set by the computer 325. These registers are properly set to correct deformation of the secondary electron image. The secondary electron image is deformed if there is an error in orthogonality of the X and Y deflection coils of the deflector 317, or if there is a difference in the sensitivity characteristics of the X and Y deflection coils, or if there is an error in parallelism between an axis X of the stage 311 and an axis X of the sample 312 placed on the stage 311.

The technique of correcting the deformation of the secondary electron image by rotating the axis Y will be explained with reference to FIGS. 24 and 25.

Figure 24A:
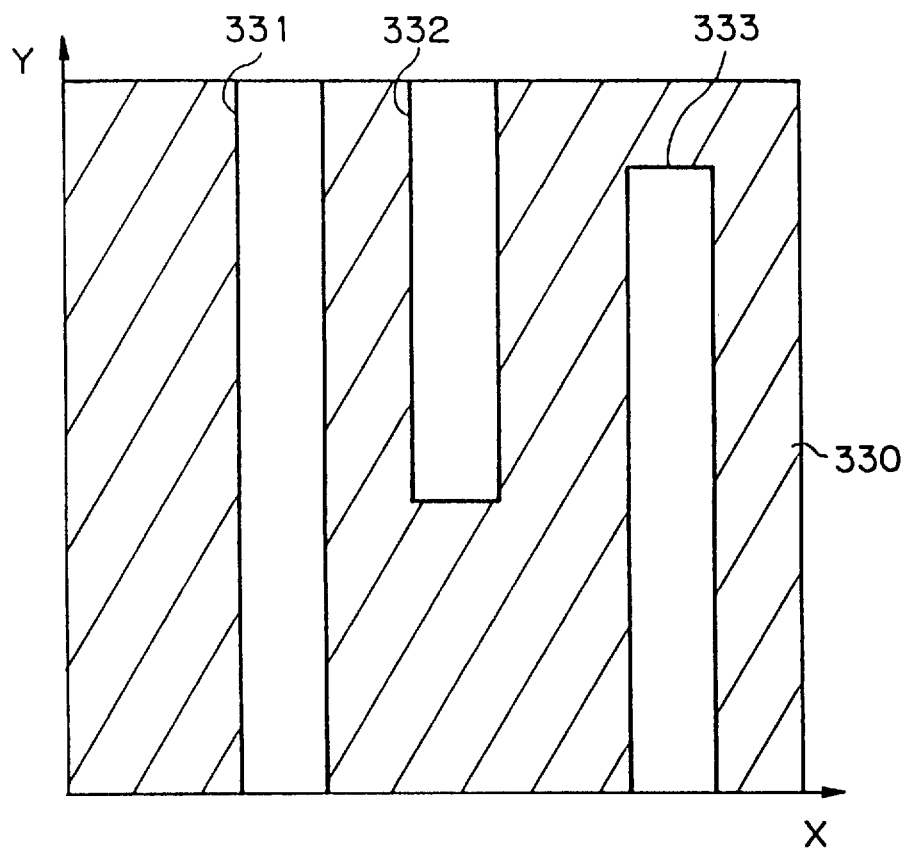
FIG. 24(A) shows a secondary electron image.

A secondary electron image 330 shown in FIG. 24(A) involves wiring patterns 331, 332, and 333 extending in parallel with an axis Y. Hatched portions in the figure represent dark areas. Each pixel of the secondary electron image 330 expresses multivalued luminance. A pixel at coordinates (X, Y) has luminance S(X, Y). The secondary electron image 330 ranges $0 \leq X \leq N$ and $0 \leq Y \leq N$, where N is, for example, 511.

Figure 24B:
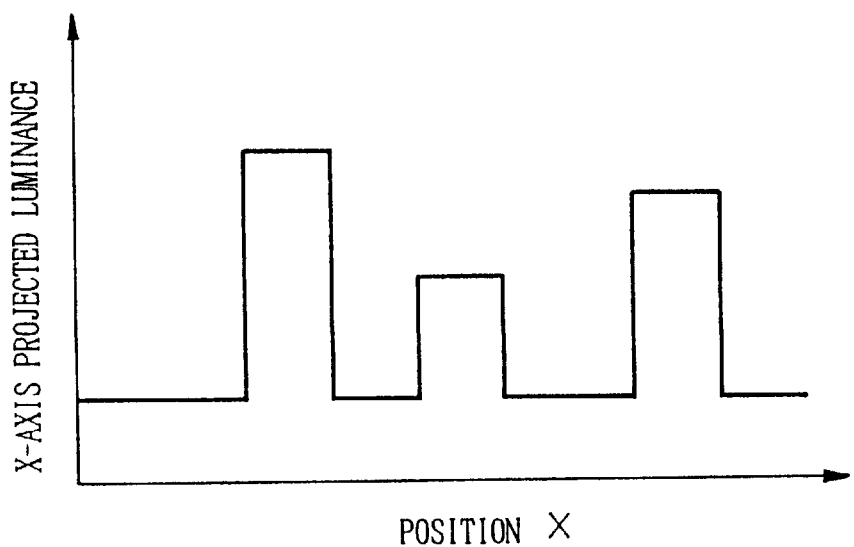
FIG. 24(B) shows X-axis projected luminance of the image of FIG. 24(A)

FIG. 24(B) shows a projected luminance distribution P(X) of the image 330, which is expressed as follows:

$$P(X) = \Sigma_{y=0, N} S(X, Y) \tag{3}$$

Figure 25A:
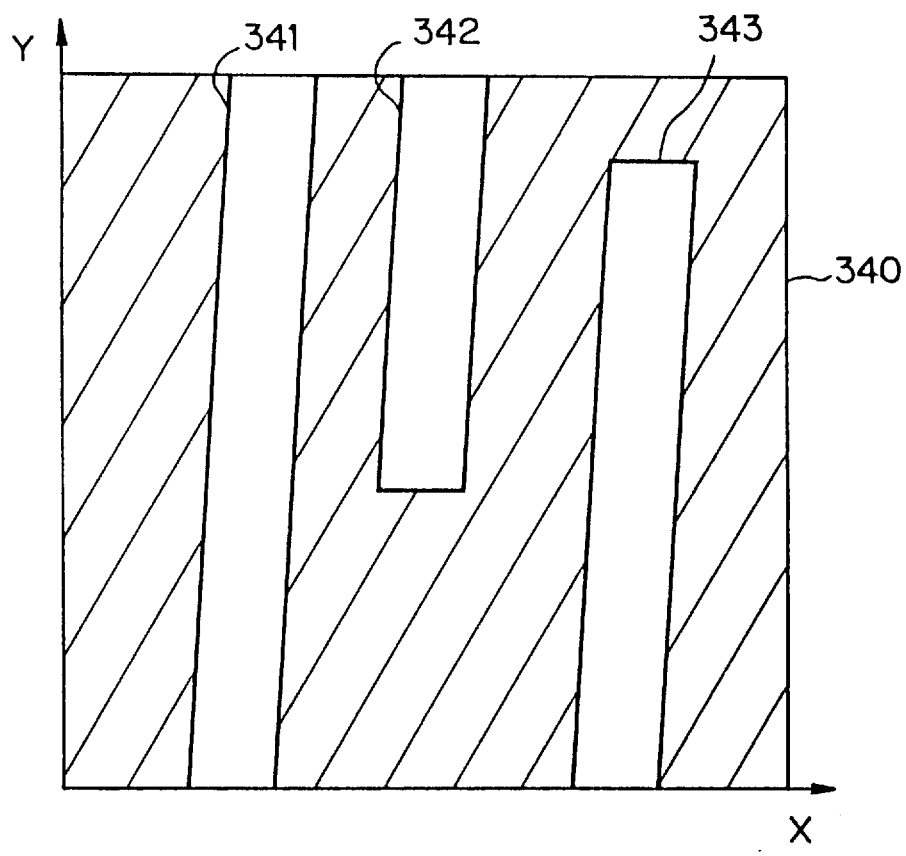
FIG. 25(A) shows another secondary electron image.
Figure 25B:
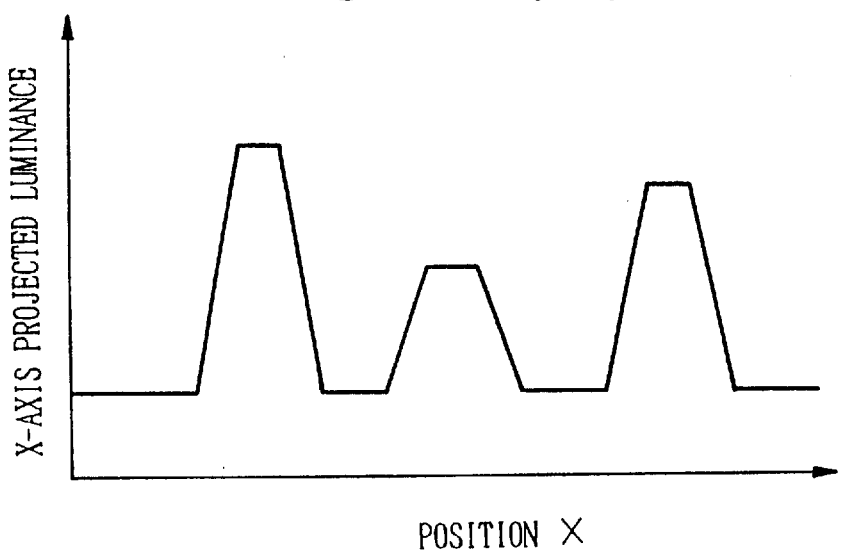
FIG. 25(B) shows X-axis projected luminance of the image of FIG. 25(A)

FIG. 25(A) shows a secondary electron image 340 involving wiring patterns 341, 342, and 343 obliquely extending with respect to an axis Y. FIG. 25(B) shows a projected luminance distribution P(X) of the image 340 on the axis X. The distribution has peaks each having gently sloping edges and a wide edge width. A parallelism value d representing parallelism between a wiring pattern and the axis Y is defined by n-degree moment or by a sum of "n"th power of differences as follows:

$$d = \Sigma_{x=0, N} |P(X) - Pm|^n \tag{4}$$

$$d = \Sigma_{x=0, N-1} |P(X+1) - P(X)|^n \tag{5}$$

As is apparent in FIGS. 24 and 25, the more a wiring pattern is in parallel with the axis Y, the larger the parallelism value d of the wiring pattern. A given secondary electron image is rotated while computing parallelism values d's, to find optimum linear transformation parameters k1 to k4 that achieve a maximum parallelism value d. Then, the axis Y is rotated according to the optimum parameters, to automatically correct deformation of the secondary electron image. It is also possible to correct the deformation by rotating the axis X in the same manner.

The rotation angle of the axis Y may be changed by actually rotating the secondary electron image by changing the linear transformation parameters k1 to k4, or by virtually rotating the secondary electron image without changing the linear conversion parameters k1 to k4. A procedure of computing a deformation correction quantity by rotating the axis Y will be explained with reference to FIG. 23.

(Step S0)

A rotation angle A of the axis Y is initialized to a minimum value Amin, which is, for example, -0.7 degrees.

(Step S1)

Linear transformation parameters k1 to k4 corresponding to the rotation angle A are computed and set in the registers 3214, 3215, 3219, and 321b, respectively. The sample is scanned with the electron beam EB to provide a secondary electron image. According to the equation (3), X-axis projected luminance P(X) is computed for X=0 to N.

(Step S2)

A parallelism value d(A) is calculated according to the equation (4) or (5).

(Step S3)

The rotation angle A is increased by ΔA. The ΔA is, for example, 0.2 degrees.

(Step S4)

If $A \leq Amax$, the flow returns to the Step S1. The Amax is, for example, 0.7 degrees.

Figure 26:
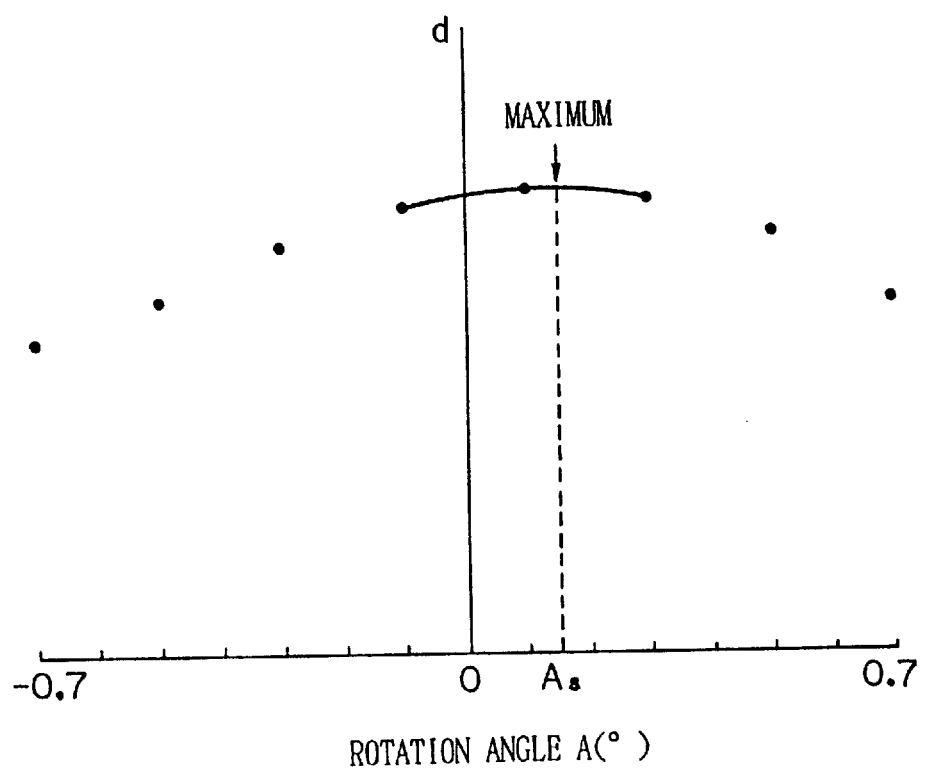
FIG. 26 shows a relationship between a parallelism level and an angle of rotation of an axis Y.

The steps S1 to S4 are repeated to obtain parallelism values d(A)'s as shown in FIG. 26.

(Step S5)

If A>Amax, a maximum parallelism value d(A) is obtained. In FIG. 26, the maximum parallelism value is d(0.1). Then, the parallelism values d(A)'s are subjected to quadratic curve approximation around the maximum value.

(Step S6)

Figure 27A:
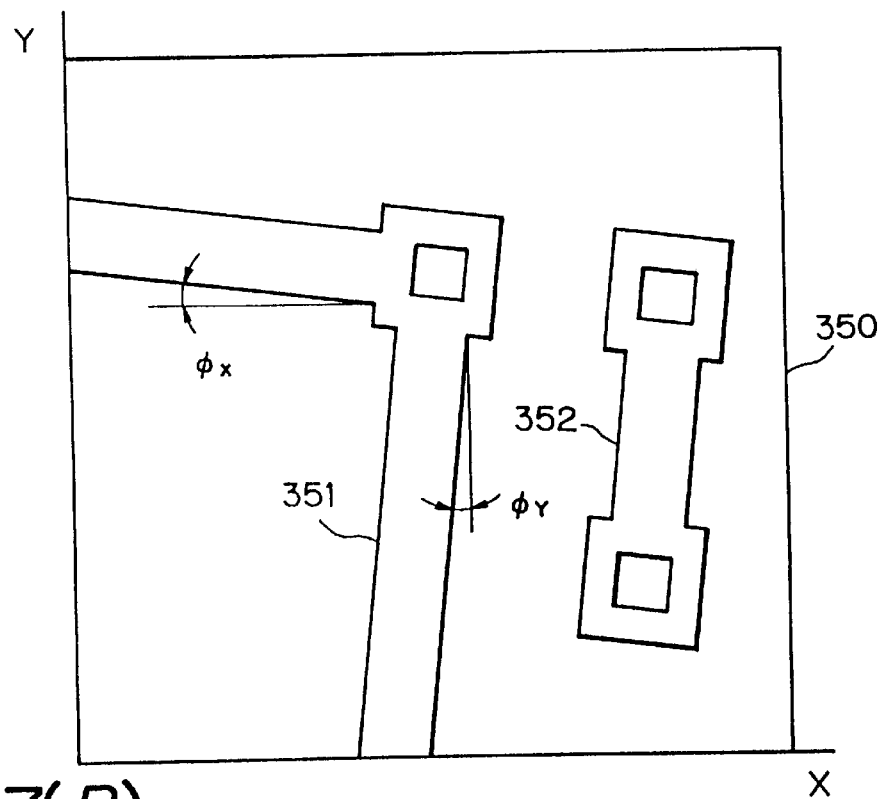
FIGS. 27(A) and 27(B) are secondary electron images before and after rotating an axis Y.
Figure 27B:
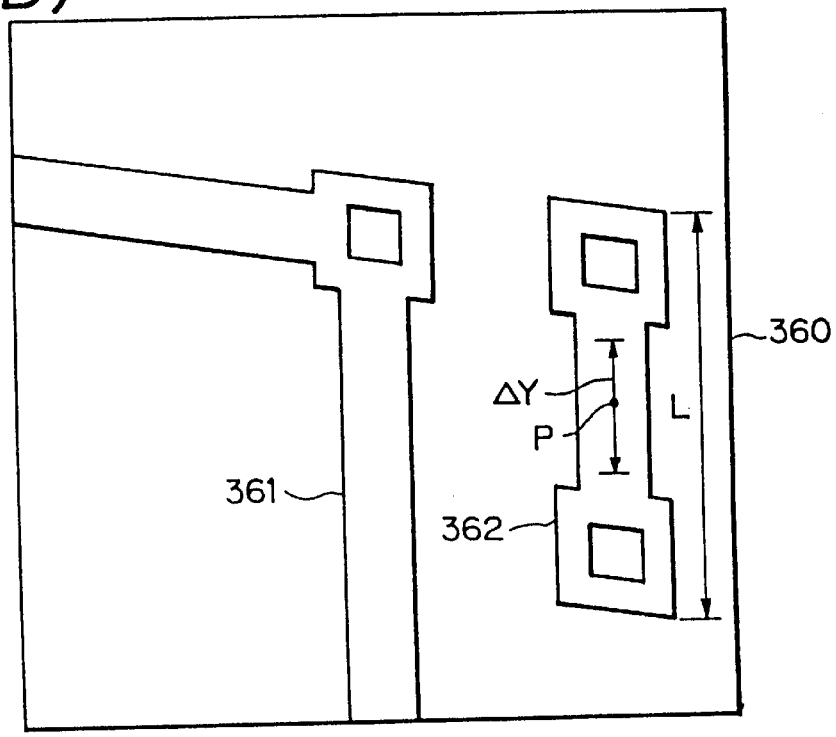

A rotation angle As corresponding to the maximum of the quadratic curve is obtained. Linear transformation parameters k1 to k4 corresponding to the rotation angle As are set in the registers 3214, 3215, 3219, and 321b of FIG. 22, respectively, to provide a corrected secondary electron image. As a result, as shown in FIGS. 27(A) and 27(B), wiring patterns 351 and 352 contained in a secondary electron image 350 before correction become wiring patterns 361 and 362 contained in a secondary electron image 360 after the correction. Most of wiring patterns formed from CAD data are in parallel with one of the X and Y axes of the rectangular coordinate system. In FIG. 27(A), φx is an angle formed between a wiring pattern and the axis X, and φy is an angle formed between a wiring pattern and the axis Y.

The axis X is also rotated in the same manner to correct the deformation. In some case, the deformation is correctable by rotating only one of the X and Y axes. For example, in FIG. 27(B), a measuring point P is located on a wiring pattern 362. In this case, if the length L of the wiring pattern 362 is longer than a shift error ΔY in the direction of the axis Y, the measuring point P can be located at the center of the width of the wiring pattern 362 even if the measuring point P is shifted in the direction of the axis Y.

According to the first embodiment of the third aspect of the present invention, deformation of a secondary electron image is automatically and accurately corrected within an error of about 0.1 to 0.2 degrees in the rotation angle of an axis X or Y.

Second Embodiment

Figure 23:
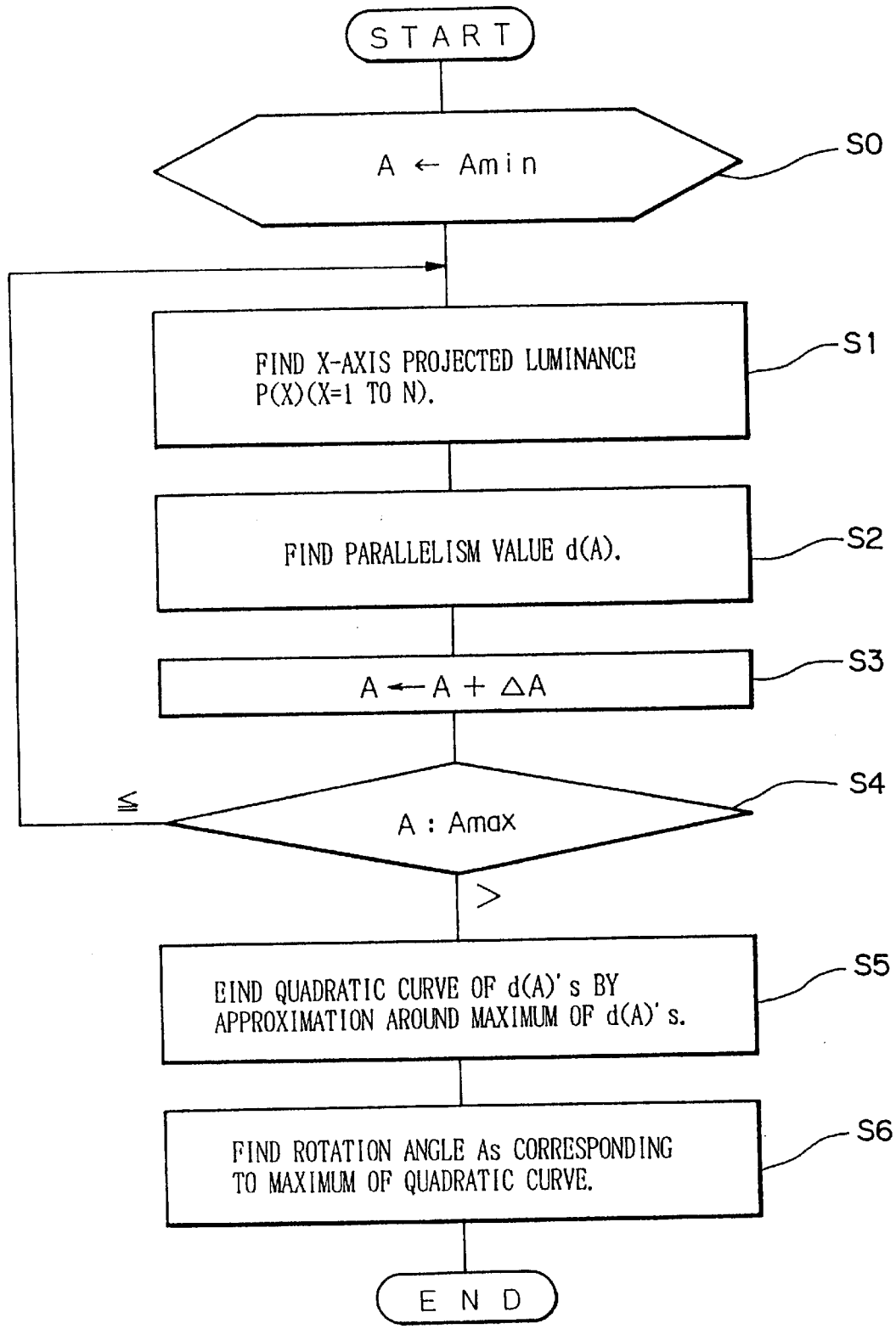
FIG. 23 is a flowchart showing a process of computing the rotation of an axis Y to correct deformation.

Unlike the first embodiment that actually rotates a second electron image by changing the linear transformation parameters k1 to k4 as shown in FIG. 23, the second embodiment virtually rotates the second electron image without changing the linear conversion parameters k1 to k4. The second embodiment will be explained with reference to FIG. 28.

In the figure, the secondary electron image 350 shown in FIG. 27(A) is changed to a secondary electron image 380, which corresponds to the secondary electron image 360 of FIG. 27(B), by shifting rows of pixels in parallel with the axis X pixel by pixel. In FIG. 28, numeric values -8 to 9 indicate the numbers of pixels shifted toward the right in individual rows of pixels.

To compute the parallelism value d and determine the rotation angle As, it is not necessary to actually shift rows of the pixels. Instead of the equation (1), the X-axis projected luminance P(X) is obtainable as follows:

$$P(X) = \Sigma_{y=0, N} S(X - Y \tan A, Y/\cos A) \tag{6}$$

The X-axis projected luminance P(X) is computed according to this equation, and then parallelism value d(A)'s are calculated according to the equation (4) or (5), to find a maximum parallelism value d among them. Thereafter, a rotation angle As corresponding to the maximum parallelism value d is found.

In this way, the third aspect of the present invention rotates an axis Y of a secondary electron image, forms a projected luminance distribution of the image, calculates parallelism values of wiring patterns of the image with respect to the axis Y. and automatically and accurately corrects deformation of the secondary electron image. As a result, wiring patterns prepared from CAD data are simply and accurately matched with the wiring patterns of the secondary electron image, to correctly determine a measuring point on the secondary electron image.

The fourth aspect of the present invention relates to an LSI wiring pattern tester for measuring a voltage of internal wiring of an LSI chip with use of an electron beam. In particular, the fourth aspect of the present invention relates to a wiring pattern tester for efficiently measuring the voltage with use of mask patterns of design data of the LSI.

To automatically position an electron beam on a wiring pattern to be measured of an LSI chip, pattern matching techniques are employed to match a region of a secondary electron image (a SEM image) of the chip with a corresponding region of mask patterns of the chip. One of the pattern matching techniques extracts wiring edges of the SEM image, projects the edges in X and Y directions to provide projected data, matches the projected data with projected data prepared from the mask patterns, and correctly adjusts an electron beam in the two directions.

To extract edges from the monochrome SEM image, a differential operation is carried out. In the SEM image, wiring patterns having a positive level are dark due to voltage contrast, so that luminance of edges detected by the differential operation is low. Accordingly, the effective length of each edge formed from projected data becomes shorter. The voltage contrast and projection will be explained with reference to FIGS. 31(A) to 31(C).

Figure 31A:
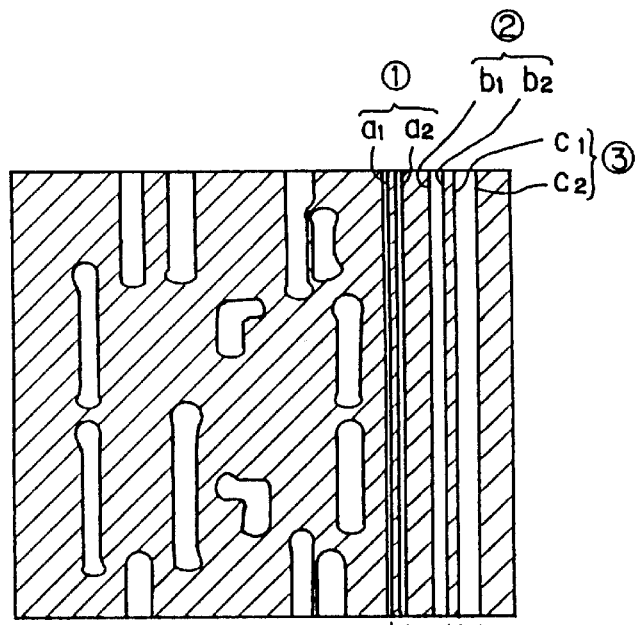
FIGS. 31(A) to 31(C) explain an influence of voltage contrast on an image of edges.
Figure 31B:
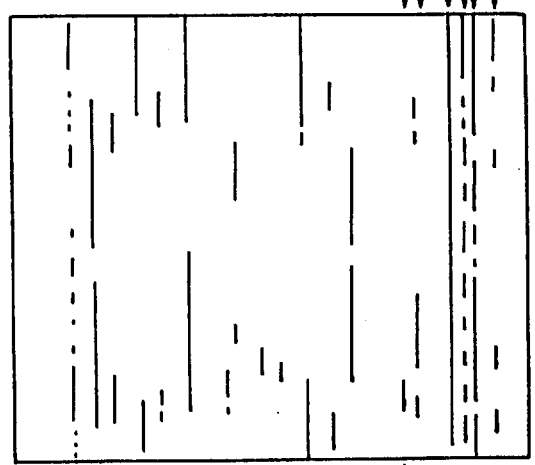
Figure 31C:
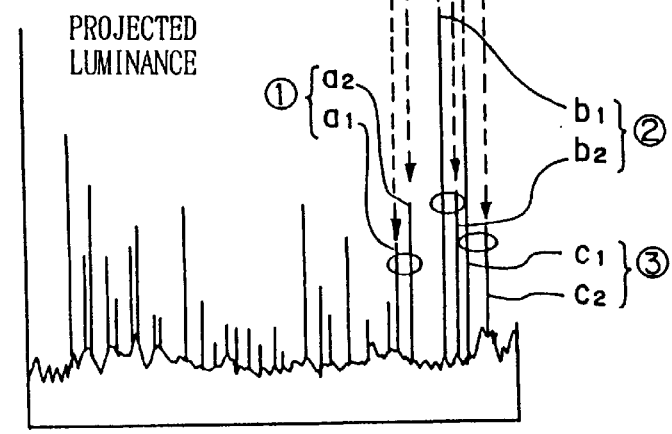

FIG. 31(A) shows a SEM image of an LSI substrate, FIG. 31(B) shows an image obtained by differentiating the SEM image along a horizontal axis, and FIG. 31(C) is a view obtained by projecting the differentiated image onto the horizontal axis.

In FIG. 31(A), wiring patterns (1), (2), and (3) on the right side have the same length. The pattern (1) receives a positive bias so that it is darker than the other two patterns (2) and (3). Accordingly, in the projected image of FIG. 32(C), edges a1 and a2 of the pattern (1) are shorter than edges b1, b2, c1, and c2 of the patterns (2) and (3). In this way, the lengths of edges are not correctly projected due to the voltage contrast. In addition, the edges b1 and b2 of the pattern (2) and the edges c1 and c2 of the pattern (3) vary from one to another.

To cancel the influence of the voltage contrast, an image of edges obtained by differentiation may be converted into a binary image, which provides projected data. This technique will be explained with reference to FIGS. 32(A) to 32(C).

Figure 32A:
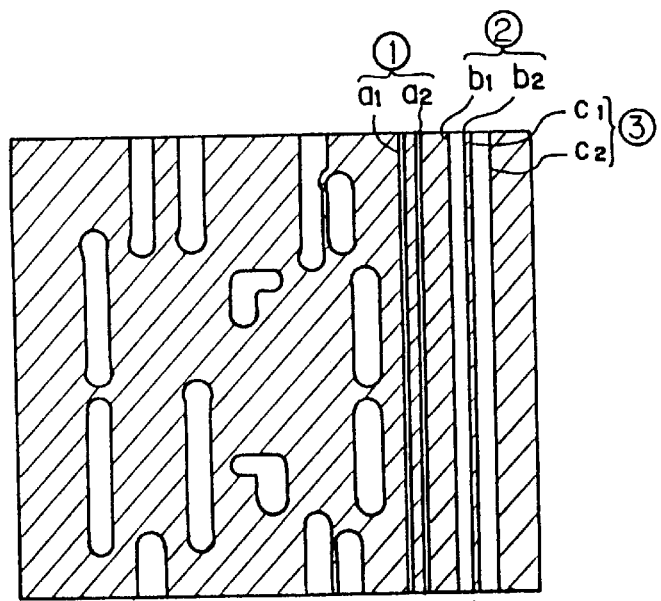
FIGS. 32(A) to 32(C) show edge images after removing the influence of the voltage contrast.
Figure 32B:
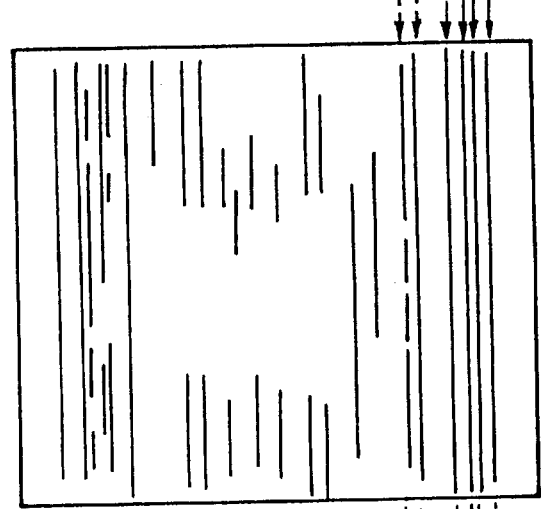
Figure 32C:
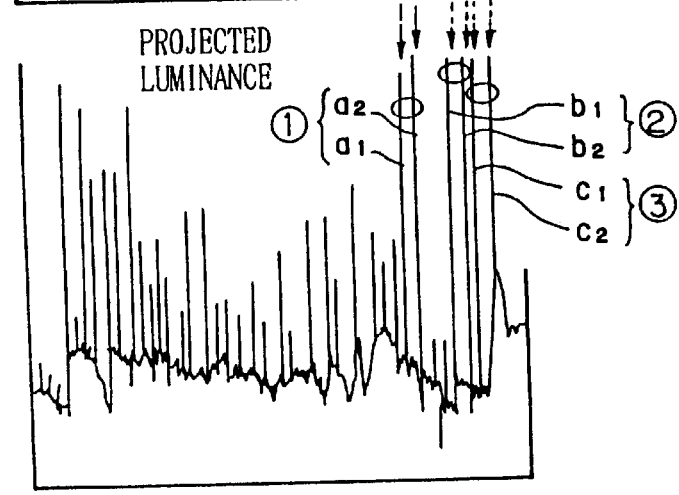

FIG. 32(A) shows a SEM image of an LSI substrate, similar to FIG. 31(A). The SEM image of FIG. 32(A) is differentiated along a horizontal axis and converted into a binary image shown in FIG. 32(B). The binary image of FIG. 32(B) is projected along the horizontal axis, to provide projected data as shown in FIG. 32(C). Edges a1, a2, b1, b2, c1, and c2 of wiring patterns (1), (2), and (3) have the same length through all figures. This means that the influence of the voltage contrast has been eliminated.

This binary process of the edge image, however, has a problem.

Namely, edges usually occupy a very small area in an image and, therefore, an image of the edges does not always provide a bimodal luminance histogram. It is very difficult to determine a threshold used for preparing the binary image according to usual histogram analyzing methods such as a mode method and a discrimination threshold method. These conventional methods do not correctly extract edges.

An object of the fourth aspect of the present invention is to simply and correctly determine a threshold used for preparing a binary image, carry out a correct pattern matching operation, and efficiently test LSIs.

Figure 29:
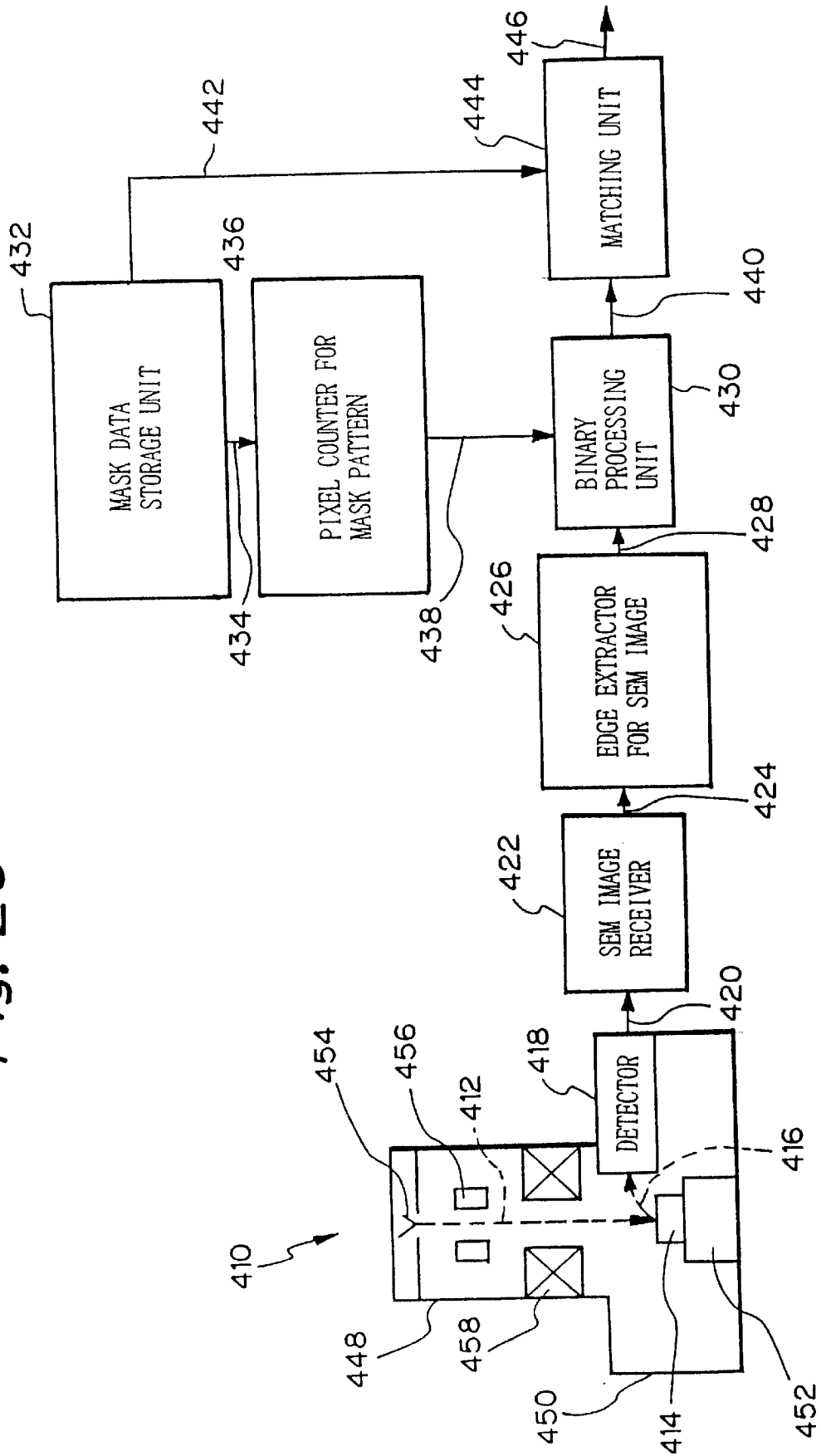
FIG. 29 is a block diagram showing an electron beam apparatus employing a wiring pattern tester, according to the fourth aspect of the present invention.

FIG. 29 is a block diagram showing a wiring pattern tester according to the fourth aspect of the present invention. The tester comprises a mask data storage unit 432 for storing mask data, i.e., design data of a sample 414 to be tested, a pixel counter 436 for counting the number of pixels of edges of wiring patterns prepared from the stored mask data, a SEM image forming unit 422 for obtaining a SEM image of the sample 414, an edge extractor 426 for differentiating the SEM image to extract edges of the wiring patterns, a binary processing unit 430 for determining a threshold for preparing a binary image according to the edges of the wiring patterns and the counted number of pixels of the edges and preparing a binary image of the edges of the wiring patterns according to the threshold, and a matching unit 444 for projecting the binary edge image in the wiring pattern extending direction, matching the projected data with projected edge data prepared from the mask data, and adjusting the positions of the sample 414 and an electron beam 412 relative to each other.

Operations of the tester will be explained with reference to FIG. 29. An electron beam unit 410 emits the electron beam 412 toward the LSI sample 414. The LSI sample 414 produces secondary electrons 416, which are detected by a detector 418. The detector 418 provides a detection signal 420 to the SEM image forming unit 422, which forms a monochrome SEM image 424. The SEM image 424 is supplied to the edge extractor 426, which differentiates the SEM image into an edge image 428.

The edge image 428 is projected to provide linear data. The apparent length of each edge contained in the linear data is determined by the actual length thereof and voltage contrast. since the voltage contrast influences luminance, a wiring edge having a positive level looks shorter in the projected data than a wiring edge whose length is equal to the wiring edge in question but having no voltage. The edges that look shorter cannot play a positive role in a pattern matching operation to be done with edge data extracted from the mask data, to thereby make the pattern matching operation incorrect.

To solve this problem, the edge image 428 from the edge extractor 426 is supplied to the binary processing unit 430, which provides a binary edge image to cancel fluctuations in luminance caused by the voltage contrast.

Figure 30:
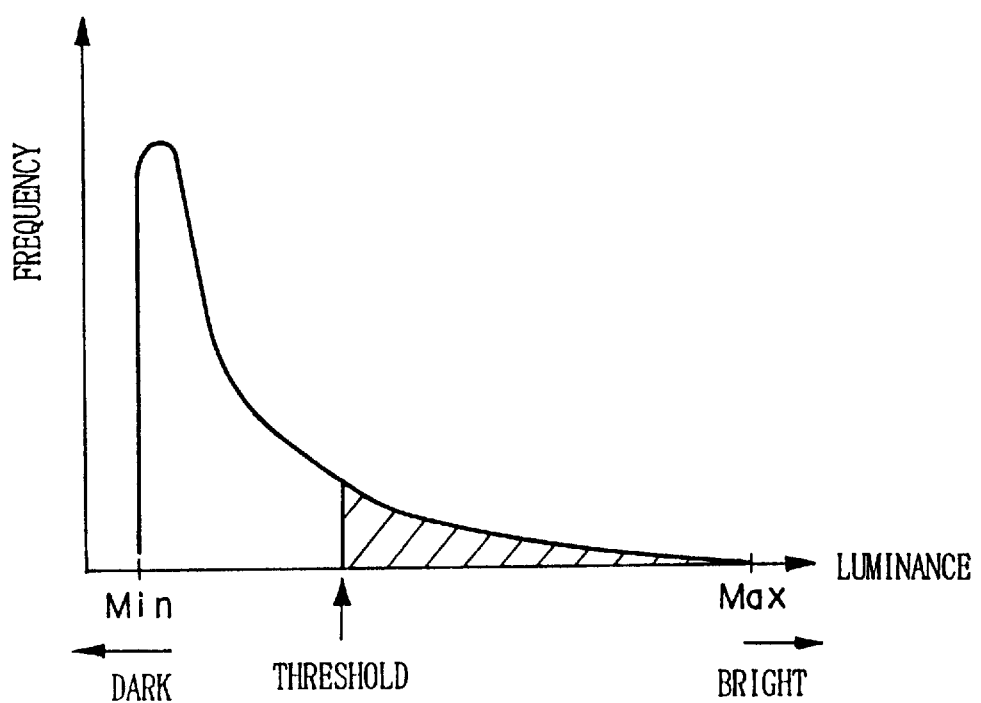
FIG. 30 is a histogram of luminance of edge images.

An image of edges usually involves significant luminance and noise. If the number of pixels of the edges is obtainable, it will be possible to find an optimum threshold for converting the edge image into a binary image from which the edges alone can be extracted. FIG. 30 shows a luminance histogram prepared from the edge image. In the figure, the numbers of pixels are accumulated from the higher luminance side of the figure, and luminance at which the cumulative number of pixels is equal to the actual number of pixels of the edges is set as the threshold.

In practice, the number of pixels of the edges is unknown. Accordingly, the number of pixels of the edges is calculated from the mask data that substantially covers a region where the edges are supposed to be present. since wiring patterns prepared from the mask data are graphical data, it is easy to extract edges out of the wiring patterns of the mask data and calculate the lengths and the number of pixels of the edges. More precisely, the mask data storage unit 432 provides patterns 434 from the mask data of the LSI sample 414. The pixel counter 436 reads the patterns 434 and counts the number of pixels of edges of the patterns 434.

The binary processing unit 430 prepares a luminance histogram (FIG. 30) of the edge image 428 provided by the edge extractor 426, and according to the histogram and a pixel number 438 counted by the pixel counter 436, determines a threshold for preparing a binary image. According to this threshold, the edge image 428 is converted into a binary image 440 from which edges are extracted.

The matching unit 444 matches the binary edge image 440 with edge data prepared from the mask data 442 of the mask data storage unit 432. According to an output signal 446 from the matching unit 444, the electron beam unit 410 adjusts the positions of the LSI sample 414 and electron beam 412 relative to each other.

An embodiment of the fourth aspect of the present invention will be explained with reference to the drawings.

In FIG. 29, the electron beam unit 410 comprises an electron beam body 448 and a chamber 450. The chamber 450 incorporates a stage 452 on which the sample LSI 414 is placed. An electron beam gun 454 is disposed inside the electron beam body 448 and emits an electron beam 412. The electron beam 412 is passed through beam deflection means 456 and a lens 458 and irradiates the sample LSI 414 placed on the stage 452.

Then, the sample LSI 414 produces secondary electrons 416, which are detected by the detector 418. The detector 418 provides a detected signal 420, which is supplied to the SEM image forming unit 422 to form a SEM image 424 of the sample LSI 414.

The edge extractor 426 receives the SEM image 424 from the SEM image forming unit 422 and differentiates the SEM image to provide an edge image. The extractor 426 separately extracts edges perpendicular to a horizontal axis and edges perpendicular to a vertical axis, to maintain a S/N ratio of projected data. The binary processing unit 430 carries out a binary process on each group of the edges, and the matching unit 444 provides projected edge data.

The mask data storage unit 432 provides the pixel counter 436 with the mask data pattern 434, and the pixel counter 436 counts the number of pixels of wiring edges of the pattern data. The counted number of pixels is used by the binary processing unit 430 to determine a threshold. The mask data storage unit 432 is an external storage unit. The edge extractor 426, pixel counter 436, binary processing unit 430, and matching unit 444 are realized in an image processing computer.

The binary processing unit 430 prepares a luminance histogram (FIG. 30) from the edge image 428 provided by the edge extractor 426 and, according to the histogram and the pixel count 438 from the counter 436, determines a threshold (FIG. 30) used for preparing a binary image. In the histogram of FIG. 30, the threshold is equal to a luminance at which a cumulative number of pixels (a hatched portion) is equal to the pixel count 438 provided by the counter 436. According to the threshold thus determined, the edge image 428 provided by the extractor 426 is converted into a binary image.

An area covered by the SEM image and a corresponding area covered by the mask data pattern are not strictly identical with each other. Namely, the numbers of pixels processed in the binary processing unit 430 do not always correspond to each other. To solve this problem, an offset value may be added to the counted number of pixels. Each edge of wiring patterns on the edge image obtained by differentiating the SEM image has a width of several pixels, so that the counted number of pixels may be multiplied by the edge width.

The threshold determining operation is carried out separately for edges perpendicular to a horizontal axis and edges perpendicular to a vertical axis. A pattern matching operation is carried out on each edge data separately prepared, thereby realizing two-dimensional matching.

According to the threshold determined, the binary processing unit 430 converts the edge image 428 provided by the edge extractor 426 into a binary edge image 440, which is supplied to the matching unit 444 to provide projected data. At the same time, the matching unit 444 prepares projected edge data according to the mask data 442 provided by the mask data storage unit 432. The matching unit 444 carries out a pattern matching operation on the projected edge data prepared from the binary edge image 440 and the reference projected edge data prepared from the mask data 442. According to a result of the matching operation, the electron beam unit 410 finds a deviation between the positions of the sample LSI 414 and electron beam 412. Namely, according to the output Signal 446 from the matching unit 444, the positions of the sample LSI 414 and electron beam 412 are corrected relative to each other. More precisely, the beam deflection means 456 in the electron beam unit 410 is activated according to the output Signal 446, to correctly orient the electron beam 412 toward the sample LSI 414.

As explained above, the fourth aspect of the present invention counts the number of pixels of edges of wiring patterns on mask data, determines a threshold according to the counted number of pixels of the edges, and converts an edge image into a binary edge image according to the threshold. The fourth aspect of the present invention Simply and correctly determines the threshold used for preparing the binary image and correctly carries out a pattern matching operation.

The fifth aspect of the present invention relates to a method of and an apparatus for detecting edges of an object before carrying out a pattern matching operation.

As explained before, the pattern matching apparatus compares binary patterns with reference patterns. This sort of apparatus finds zero crossing positions on a Laplacian-filtered object image, and determines the zero crossing positions as edges of the object image. When the filtered image involves no noise, the zero crossing positions correctly correspond to edges. In practice, however, the filtered image usually involves noise. The noise containing image does not correctly provide edges. This may deteriorate edge detecting accuracy and pattern matching quality.

It is required, therefore, to provide a method of and an apparatus for accurately detecting edges and correctly carrying out a pattern matching operation even if an object image involves blur, without depending only on a Laplacian filtering process when extracting edges out of the object image.

Figure 44A:
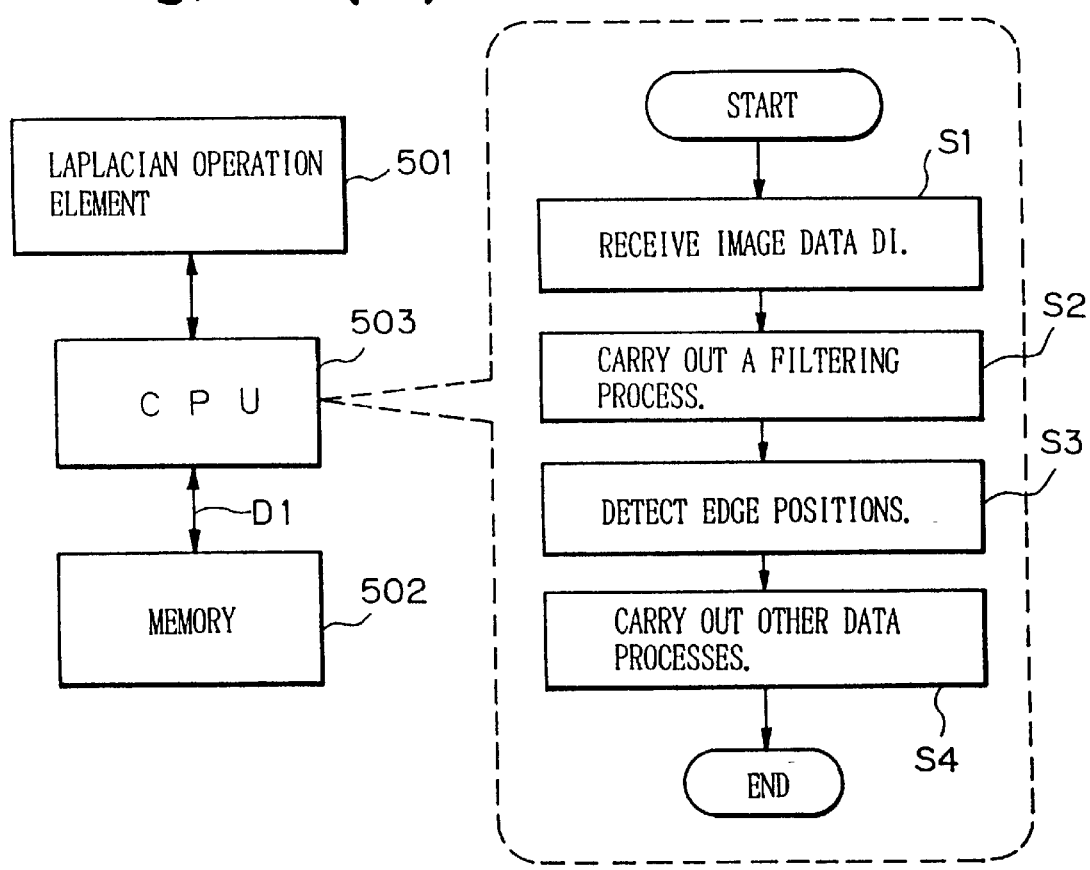
FIGS. 44(A) and 44(B) explain an image process according to a prior art.
Figure 44B:
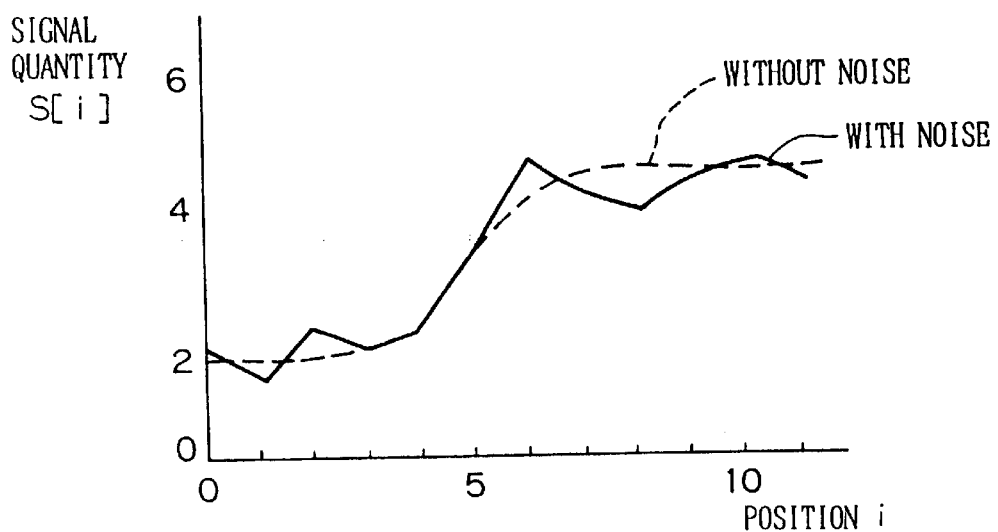

FIGS. 44(A), 44(B), 45(A), and 45(B) explain a prior art, in which FIGS. 44(A) and 44(B) show an image processing operation according to the prior art.

In particular, FIG. 44(A) shows an arrangement of an image processor employed for a pattern matching apparatus.

The apparatus of FIG. 44(A) detects edges of an image photographed by, for example, a camera, before matching binary image patterns thereof with reference patterns. This apparatus comprises a Laplacian operation element 501, a memory 502, and a central processing unit (CPU) 503.

The apparatus reads gray scale (black and white) image data D1 from the memory 502, quadratically differentiates the image data D1 by the Laplacian operation element 501, and detects edges according to the quadratically differentiated values.

Step S1 of FIG. 44(A) reads the image data D1 from the memory 502.

Step S2 filters the image data D1. This filtering process is a Laplacian filtering process (linear filtering process), which usually employs a filtering core of 3×3 between eight adjacent pixels and carries out a convolution operation on the image data D1.

Step S3 detects edge positions in the image. This process finds zero crossing positions of the Laplacian filtered image data D1 as edges. When a Signal S(i) representing the image data D1 (=d(i)) involves no noise n(i) as indicated with a dotted line in FIG. 44(B), the zero crossing positions are correctly found.

Step S4 carries out data processes such as a pattern matching process.

In this way, the prior art finds the zero crossing positions on the Laplacian filtered image data D1 and determines zero crossing positions as edges of the image.

Figure 45A:
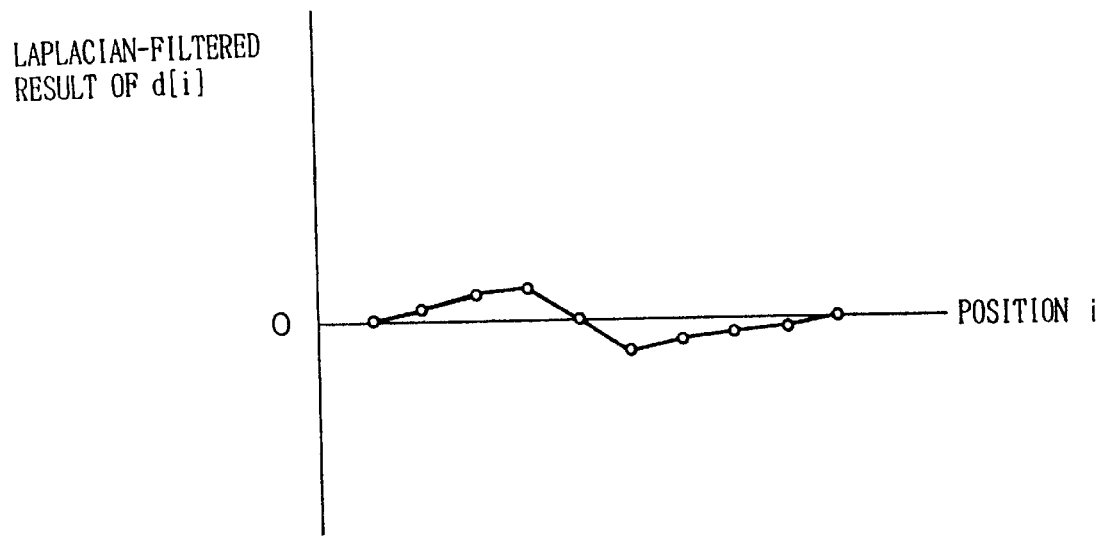
FIGS. 45(A) and 45(B) explain the problems of the conventional image process in detecting edges.

When the Signal S(i) representing the image data D1 (=d(i)) involves no noise n(i) as indicated with the dotted line in FIG. 44(B), zero crossing positions, i.e., edges of the image are correctly obtained as shown in FIG. 45(A) from the Laplacian filtered image data D1.

Figure 45B:
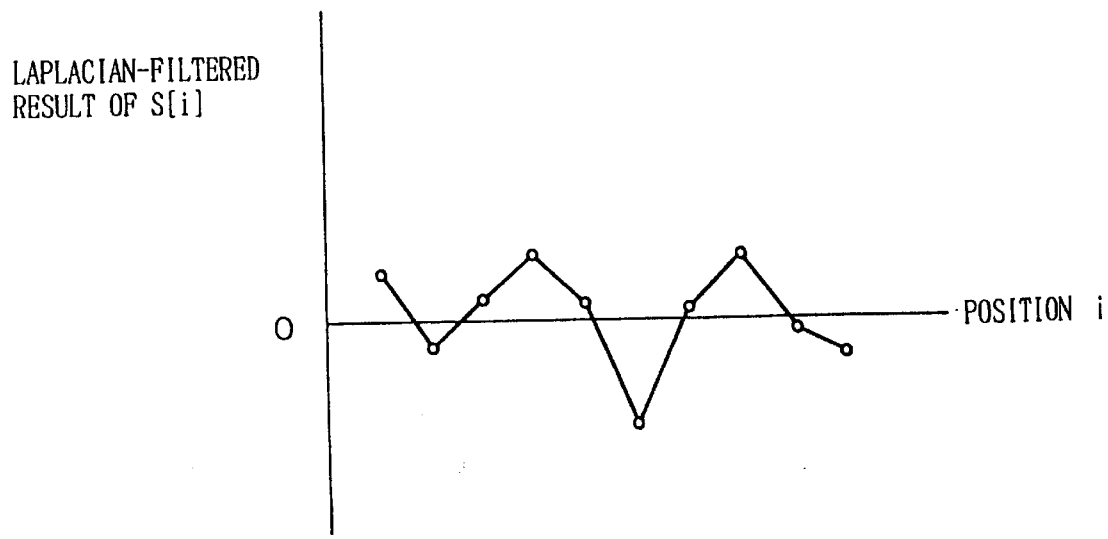

In practice, however, the image data D1 (=d(i)) provides a Signal S(i) that involves noise n(i) as indicated with a continuous line in FIG. 44(B). When the image data D1 provides the Signal S(i)=n(i)+d(i) and when this Signal is Laplacian-filtered, there will be a larger number of zero crossing positions (for example, five as shown in FIG. 45(B)).

This may cause a first problem that edges are not clearly and correctly detected particularly when the image involves blur, i.e., when a change in gray scale between adjacent pixels is smaller than noise n(i).

It is important for a pattern matching operation to correctly carry out a weighting process to secure the accuracy of a correlation process. Accordingly, it is necessary to consider information about the clearness (a gray scale changing ratio) of edges when detecting the edges.

There is a second problem that a pattern matching apparatus employing, as its essential part, the conventional image processor of FIG. 44(A) may demonstrate poor edge detection accuracy, to hinder a correct pattern matching operation.

An object of the fifth aspect of the present invention is to accurately detect edges and correctly carry out a pattern matching operation even if an object image involves blur, without depending only on the Laplacian filtering process.

Figure 33A:
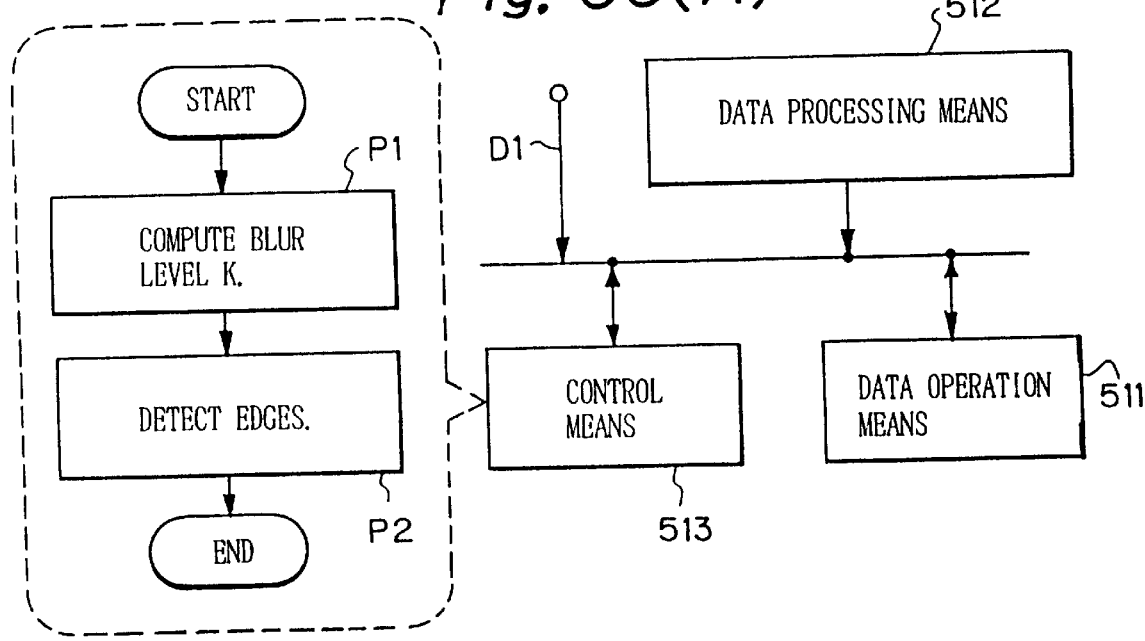
FIGS. 33(A) to 33(C) show a basic arrangement of a pattern matching processor according to the fifth aspect of the present invention.
Figure 33B:
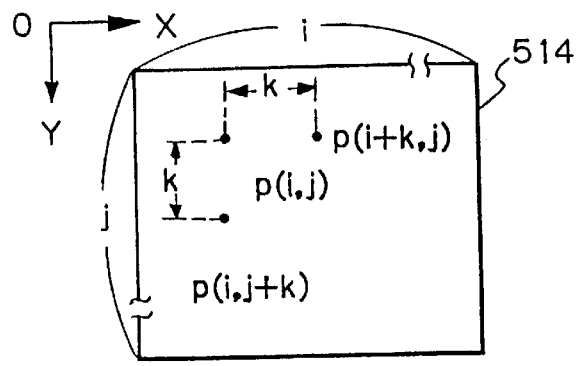
Figure 33C:
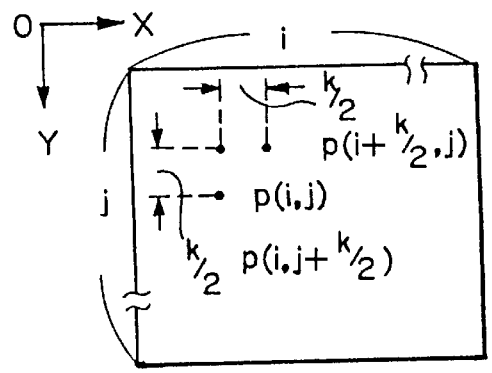

FIGS. 33(A) to 33(C) show an image processing method and an image processor employed for a pattern matching apparatus, according to the fifth aspect of the present invention.

The image processor of FIG. 33(A) comprises data operation means 511 for calculating a blur level k according to image data D1 of an object image 514, data processing means 512 for detecting edge likelihood of the object image 514 according to the blur level k, and control means 513 for controlling inputs and outputs to and from the data operation means 511 and data processing means 512. With this arrangement, the image processor extracts clear edges out of the object image 514.

A flowchart encircled by a dotted line in Fig. 33(A) show a first image processing method. Step S1 calculates the blur level k according to the image data D1 of the object image 514. Step S2 detects edges in the object image 514 according to the blur level k.

The process of calculating the blur level k according to the first image processing method will be explained. This method computers absolute differences for all pixels (i, j) of a given image p[i, j],to determine the blur level k. An image p[i+k, j] is distanced away from the image p[i, j] by k pixels (k being an optional number) in the direction of an axis X. An image p[i, j+k] is distanced away from the image p[i, j] by k pixels in the direction of an axis Y. Then, absolute differences for all pixels (i, J) Are calculated as follows:

$$dpx^k[i, j] = |p[i+k, j] - p[i, j]|$$

$$dpx^k[i, j] = |p[i, j+k] - p[i, j]|$$

A maximum difference "$max^k$" is selected among these absolute differences calculated with the optional pixel number k. With at least two different k's, maximum differences $max^k$'s are calculated, and a maximum "max" is selected among the maximum differences $max^k$'s. The maximum max is multiplied by a threshold $\alpha$ ($0.7<\alpha<0.9$). Among the optional pixel numbers k'0 s, those which satisfy "$max^k \geq \alpha \cdot max$" are selected. Namely, if $\alpha \cdot max$ is equal to $max^k$, or if $max^k$ is greater than a-max, the corresponding k is selected. Among the selected k's, a minimum k is selected as the blur level k.

A second image processing method will be explained with reference to FIG. 33(C). This method computes absolute edge likelihood differences for all pixels (i, j) of a given image p[i, j], to find the blur level k. An image p[i+K/2, j] is distanced away from the image p[i, j] by k/2 pixels (k being an optional number) in the direction X, and an image p[i, j+k/2] is distanced away from the image p[i, j] by k/2 pixels in the direction Y. Then, absolute edge likelihood differences for all pixels (i, j) are calculated as follows:

$$eLx^k[i, j] = |p[i+k/2, j] - p[i, j]| + |p[i-k/2, j] - p[i, j]|$$

$$eLy^k[i, j] = |p[i, j+k/2] - p[i, j]| + |p[i, j] - p[i, j-k/2]|$$

According to these absolute edge likelihood differences, the blur level k is found.

A third image processing method will be explained. This method computes absolute differences for all pixels (i, j) of a given image p[i, j], to find the blur level k. The image p[i, j] is projected onto the axis X to form a projected image px[i], and onto the axis Y to form a projected image py[j]. An image px[i+k] is distanced away from the projected image px[i] by k pixels (k being an optional number) in the direction of the axis X. An image py[j+k] is distanced away from the projected image py[j] by k pixels in the direction of the axis Y. Then, absolute differences for all pixels (i, j) are calculated as follows:

$$dpx^k[i] |px[i+k] px[i]|$$

$$dpy^k[j] |py[j+k] py[j]|$$

According to these absolute differences, the blur level k is found.

A fourth image processing method will be explained. This method provides edge likelihood images for all pixels (i, j) of a given image p[i, j], to find the blur level k. The image p[i, j] is projected onto the axis X to form a projected image px[i], and onto the axis Y to form a projected image py[j]. An image px[i+k/2] is distanced away from the projected image px[i] by k/2 pixels (k being an optional number) in the direction of the axis X. An image py[j+k/2] is distanced away from the projected image py([j] by k/2 pixels in the direction of the axis Y. Then, edge likelihood images for all pixels (i, j) are obtained as follows:

$$eLx^k[i] = |px[i+k/2]-px[i]| + |px[i]-px[j-k/2]|$$

$$eLy^k[j] = |py[j]| - |py[j]-py[j-k/2]|$$

According to these edge likelihood images, the blur level k is found.

An edge detection process according to the first to fourth image processing methods will be explained. According to the determined blur level k found, the image p[i, j] is projected on the axes X and Y to form edge likelihood images eLx[i, j] and eLy[i, j] as follows:

$$eLx[i, j] = |p[i, j+k/2]-p[i, j]| + |p[i, j]-p[i-k/2, j]|$$

$$eLy[i, j] = |p[j+k/2]-p[i, j]| + |p[i, j]-p[j-k/2]|$$

The edge likelihood images eLx[i, j] and eLy[i, j] are multiplied by weight coefficients βx[i, j] and βy[i, j], respectively, to provide edge likelihood evaluation images as follows:

$$DLx[i, j] = \beta x[i, j](|p[i+k/2]p[i, j]| + |p[i, j]-p[i-k/2]|)$$

$$Dly[i, j] = \beta y[i, j](|p[j+k/2]-p[i, j]| + |p[i, j]-p[j-k/2]|)$$

According to these edge likelihood evaluation images, other data are processed.

The weight coefficients are expressed as follows:

$$\beta x[i, j] = \beta[b1]$$

$$\beta y[i, j] = \beta[b2]$$

where the first and second coefficients b1 and b2 are obtained as follows:

$$b1 = \frac{\|p[i+k/2,j] - p[i,j]\| - \|p[i,j] - p[i-k/2,j]\|}{|p[i+k/2,j] - p[i,j]| + |p[i,j] - p[i-k/2,j]|}$$

$$b2 = \frac{\|p[i,j+k/2] - p[i,j]\| - \|p[i,j] - p[i,j-k/2]\|}{|p[i,j+k/2] - p[i,j]| + |p[i,j] - p[i,j-k/2]|}$$

The b1 and b2 are each 0 when the denominator is 0.

As shown in FIG. 33(A), the image processor according to the present invention comprises the data operation means 511, data processing means 512, and control means 513, to extract edges out of the object image 514.

The image data D1 of the object image 514 is transferred through the control means 513 to the data operation means 511, which computes the blur level k. According to the blur level k, the data processing means 512 detects edge likelihood of the object image 514.

Even if the object image 514 is blurred, the present invention more clearly extracts edges of the object image 514 than the prior art, by optimizing a differential span in edge detection to k/2.

As a result, the present invention correctly prepares evaluation data for a pattern matching operation.

According to the first image processing method of the present invention, the Step S1 of FIG. 33(A) computes the blur level k, and the step S2 detects edges out of the object image 514 according to the blur level k.

The image data D1 of the object image 514 includes pixels (i, j) of a given image p[i, j] as shown in FIG. 33(B). An image p[i+k, j] is separated away from the image p[i, j] by k pixels (k being an optional number) in the direction X. An image p[i, j+k] is separated away from the image p[i, j] by k pixels in the direction Y. Then, absolute differences for all pixels (i, j) are calculated as follows:

$$dpx^k[i, j] = |p[i+k, j]-p[i, j]|$$

$$dpy^k[i, j] = |p[i, j+k]-p[i, j]|$$

A maximum difference "max$^k$" is selected among these absolute differences calculated with the optional pixel number k. With at least two different k's, maximum differences max$^k$'s are calculated, and a maximum "max" is selected among the maximum differences max$^k$'s.

The maximum max is multiplied by the threshold 60 ($0.7 \leq \alpha \leq 0.9$). Among the optional pixel numbers k's, those which satisfy "max$^k$<α·max" are selected. Namely, if α·max is equal to max$^k$, or if max$^k$ is greater than α·max, the corresponding k is selected. Among the selected k's, a minimum k is selected as the blur level k.

According to the blur level k, the image p[i, j] is projected on the axes X and Y to form edge likelihood images eLx[i, j] and eLy [i, j] as follows:

$$eLx[i, j] = |p[i+k/2, j]-p[i, j]| + |p[i, j]-p[i-k/2, j]|$$

$$eLy[i, j] = |p[i, j+k/2]-p[i, j]| + |p[i, j]-p[i, j-k/2]|$$

Even if the object image 514 is blurred, i.e., even if a change in gray scale between adjacent pixels is smaller than noise n(i), edges of the object image 514 are enhanced and clearly extracted.

Accordingly, a pattern matching apparatus employing this image processing method as an essential part thereof accurately detects edges and correctly carries out a pattern matching operation.

The second image processing method of the present invention is applicable when calculating the blur level k in the Step S1 of FIG. 33(A). This method calculates absolute edge likelihood differences for all pixels (i, j) of a given image p[i, j], as shown in FIG. 33(C). An image p[i+k/2, j] is distanced away from the image p[i, j] by k/2 pixels (k being an optional number) in the direction X, and an image p[i, j+k/2] is distanced away from the image p[i, j] by k/2 pixels in the direction Y. Then, absolute edge likelihood differences for all pixels (i, j) are calculated as follows:

$$eLx[i, j] = |p[i+k/2, j]-p[i, j]| + |p[i, j]-p[i-k/2, j]|$$

$$eLy^k[i, j] = |p[i, j+k/2]-p[i, j]| + |p[i, j]-p[i, j-k/2]|$$

According to these absolute edge likelihood differences, the blur level k is determined.

Similar to the first image processing method, the image p([i, j] is projected on the axes X and Y to form edge likelihood images eLx[i, j] and eLy[i, j] according to the blur level k.

$$eLx[i, j] = |p[i+k/2, j]-p[i, j]| + |p[i, j]-p[i-k/2, j]|$$

$$eLy[i, j] = |p[i, j]-p[i, j+k/2]| + |p[i, j]-p[i, j-k/2]|$$

Similar to the first image processing method, the second image processing method clearly extracts edges out of the object image 514 even if the object image 514 is blurred.

Accordingly, a pattern matching apparatus employing this image processing method as an essential part thereof correctly carries out a pattern matching operation.

The third image processing method of the present invention is applicable when calculating the blur level k in the Step S1 of FIG. 33(A). This method calculates absolute differences for all pixels (i, j) of a given image p[i, j]. The image p[i, j] is projected onto the axis X to form a projected image px[i], and onto the axis Y to form a projected image py[j]. An image p[i+k, j] is distanced away from the projected image px[i] by k pixels (k being an optional number) in the direction of the axis X. An image p[i, j+k] is distanced away from the projected image py[j] by k pixels in the direction of the axis Y. Then, absolute differences for all pixels (i, j) are calculated as follows:

$$dpx^k[i]=|px[i+k]-px[i]|$$

$$dpy^k[j]=|py[j+k]-py[j]|$$

According to these absolute differences, the blur level k is determined.

Similar to the first and second image processing methods, the image p[i, j] is projected on the axes X and Y to form edge likelihood images eLx[i, j] and eLy[i, j] according to the blur level k.

$$eLx[i, j]=|p[i+k/2, j]-p[i, j]|+|p[i, j]-p[i-k/2, j]|$$

$$eLy[i, j]=|p[i, j+k/2]-p[i, j]|+|p[i, j]-p[i, j-k/2]|$$

Similar to the first and second image processing methods, the third image processing method clearly extracts edges out of the object image 514 even if the object image 514 is blurred.

Accordingly, a pattern matching apparatus employing this image processing method as an essential part thereof correctly carries out a pattern matching operation.

The fourth image processing method of the present invention is applicable when calculating the blur level k in the Step S1 of FIG. 33(A). This method obtains edge likelihood images for all pixels (i, j) of a given image p[i, j]. The image p[i, j] is projected onto the axis X to form a projected image px[i], and onto the axis Y to form a projected image py[j]. An image px[i+k/2] is distanced away from the projected image px[i] by k/2 pixels (k being an optional number) in the direction of the axis X. An image py[j+k/2] is distanced away from the projected image py[j] by k/2 pixels in the direction of the axis Y. Then, edge likelihood images for all pixels (i, j) are obtained as follows:

$$eLx^k[i]=|px[i+k/2]-px[i]|+|px[i]-px[j-k/2]|$$

$$eLy^k[i]=|py[j+k/2]-py[j]|+|py[i, j]-py[j-k/2]|$$

According to these edge likelihood images, the blur level k is determined.

Similar to the first to third image processing methods, the image p[i, j] is projected on the axes X and Y to form edge likelihood images eLx[i, j] and eLy[i, j] according to the blur level k.

$$eLx[i, j]=|p[i+k/2, j]-p[i, j]|+|p[i, j]-p[i-k/2, j]|$$

$$eLy[i, j]=|p[i, j+k/2]-p[i, j+k/2]|+|p[i, j]-p[i, j-k/2]|$$

Similar to the first to third image processing methods, the fourth image processing method clearly extracts edges out of the object image 514 even if the object image 514 is blurred.

Accordingly, a pattern matching apparatus employing this image processing method as an essential part thereof correctly carries out a pattern matching operation.

During the edge detection process of the step S2, each of the first to fourth image processing methods multiply the edge likelihood images eLx[i, j] and eLy[i, j] on the axes X and Y by weight coefficients βx[i, j] and βy[i, j], respectively.

The weight coefficients are expressed as follows:

$$\beta x[i, j]=\beta[b1]$$

$$\beta y[i, j]=\beta[b2]$$

where the first and second coefficients b1 and b2 are expressed as follows:

$$b1 = \frac{\||p[i + k/2,j] - p[i,j]| - |p[i,j] - p[i - k/2,j]|\|}{|p[i + k/2,j] - p[i,j]| + |p[i,j] - p[i - k/2,j]|}$$

$$b2 = \frac{\||p[i,j + k/2] - p[i,j]| - |p[i,j] - p[i,j - k/2]|\|}{|p[i,j + k/2] - p[i,j]| + |p[i,j] - p[i,j - k/2]|}$$

As a result, edge likelihood evaluation images on the axes X and Y are provided as follows:

$$DLx[i, j]=\beta x[i, j](|p[i+k/2, j]-p[i, j]|+|p[i, j]-p[i-k/2, j]|)$$

$$DLy[i, j]=\beta y[i, j](|p[i, j+k/2]-p[i, j]|+|p[i, j]-p[i, j-k/2]|)$$

According to these edge likelihood evaluation images, other data operations such as a pattern matching operation are accurately carried out.

In this way, the first to fourth image processing methods according to the fifth aspect of the present invention detect edges according to edge information as well as clearness information (gray scale changing ratio), correctly carry out the weighting process, and accurately correlate binary image patterns with reference patterns.

Embodiments according to the fifth aspect of the present invention will be explained with reference to FIGS. 34 to 43.

First Embodiment

Figure 34:
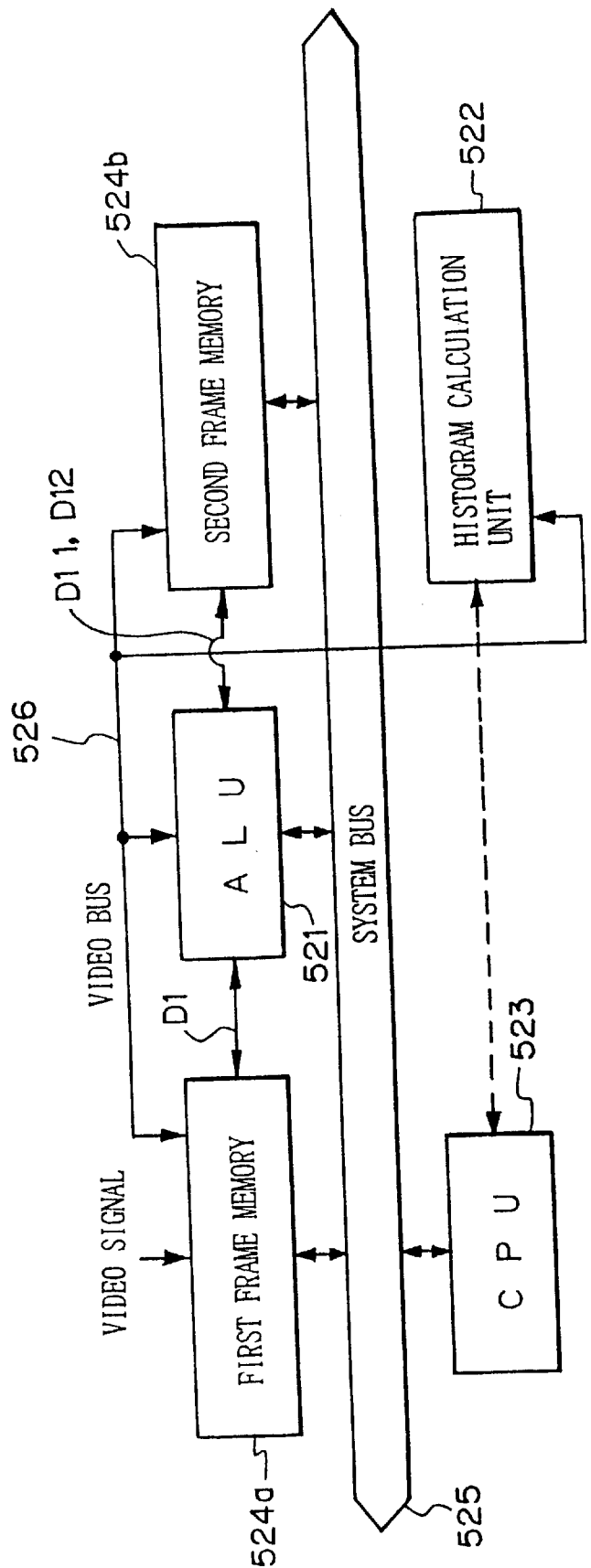
FIG. 34 is a block diagram showing an image processor employing the pattern matching processor of FIGS. 33(A) to 33(C)

FIG. 34 shows a basic arrangement of an image processor employed for a pattern matching apparatus, according to the first embodiment. The image processor comprises an arithmetic unit (ALU) 521, a histogram calculation unit 522, a central processing unit (CPU) 523, first and second frame memories 524a and 524b, a system bus 525, and a video bus 526.

The ALU 521 corresponds to the data operation means 511 of FIG. 33(A) and calculates a blur level k according to image data D1 of an object image 514.

The histogram calculation unit 522 corresponds to the data processing means 512 of FIG. 33(A) and detects edge likelihood of the object image 514 according to the blur level k.

The CPU 523 corresponds to the control means 513 of FIG. 33(A) and controls inputs and outputs to and from the ALU 521, histogram calculation unit 522, and first and second frame memories 524a and 524b. For example, the CPU 523 controls the extraction of edges out of the object image 514. The first and second frame memories 524a and 524b store the image data D1. The system bus 525 for transferring various kinds of data is connected to the ALU 521, first and second frame memories 524a and 524b, and CPU 523 but not to the histogram calculation unit 522. The video bus 526 for transferring various kinds of data is connected to the ALU 521, histogram calculation unit 522, and first and second frame memories 524a and 524b.

In this way, the image processor of FIG. 34 comprises the ALU 521, histogram calculation unit 522, CPU 523, first and second frame memories 524a and 524b, system bus 525, video bus 526, etc., to extract edges out of the object image 514. The ALU 521 calculates the blur level k of the image data D1 of the object image 514 under the control of the CPU 523. According to the blur level k, the histogram calculation unit 522 detects edge likelihood of the object image 514.

Even if the object image 514 is blurred, the first embodiment clearly extracts edges out of the object image 514 according to the edge likelihood prepared in consideration of the blur level k. Accordingly, the first embodiment prepares correct evaluation data used for a pattern matching operation.

An image processing operation of the first embodiment will be explained with reference to a flowchart shown in FIG. 35 and supplemental views of FIGS. 36 to 40.

Figure 35:
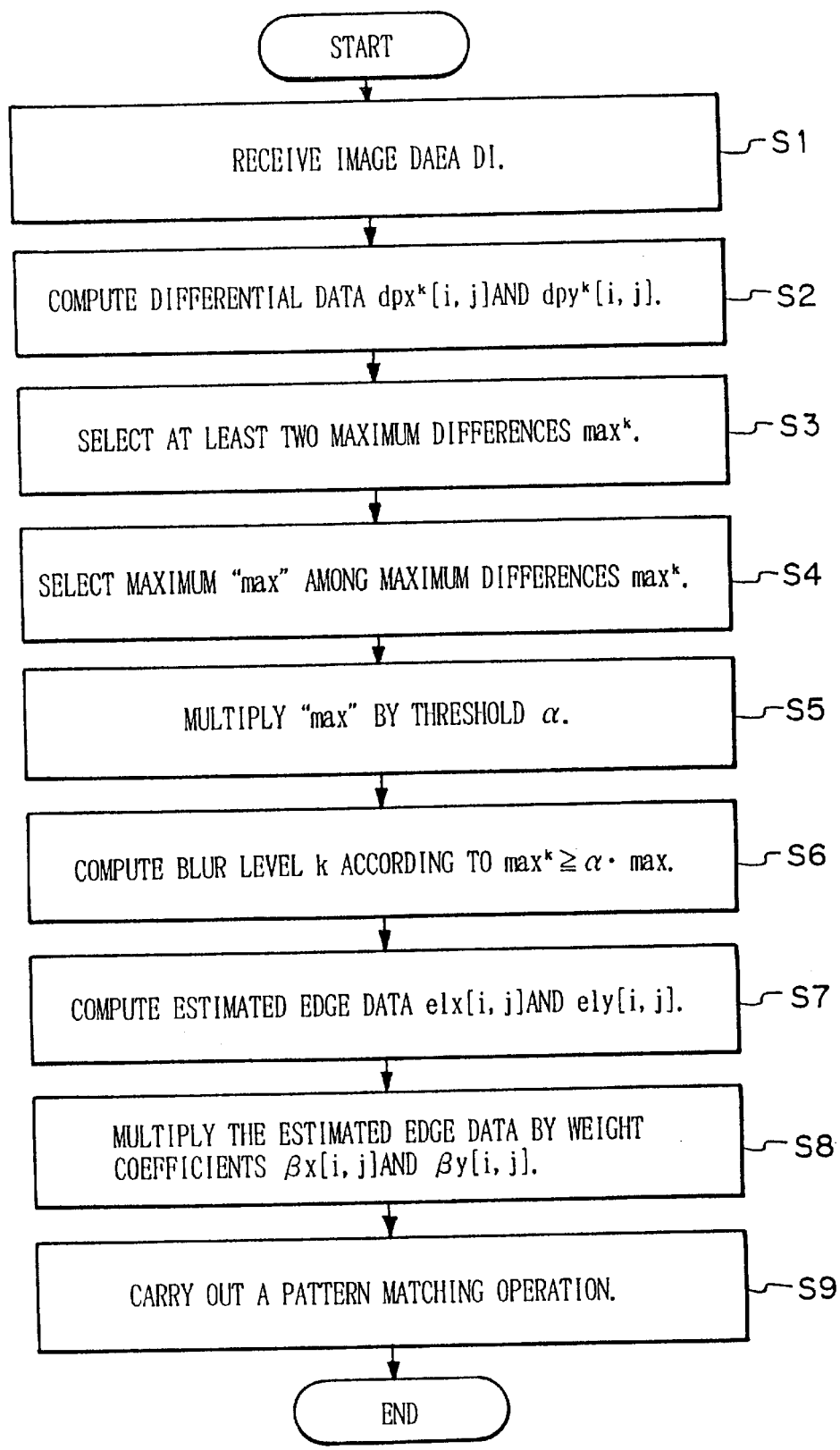
FIG. 35 is a flowchart showing a first embodiment of the fifth aspect of the present invention.
Figure 36C:
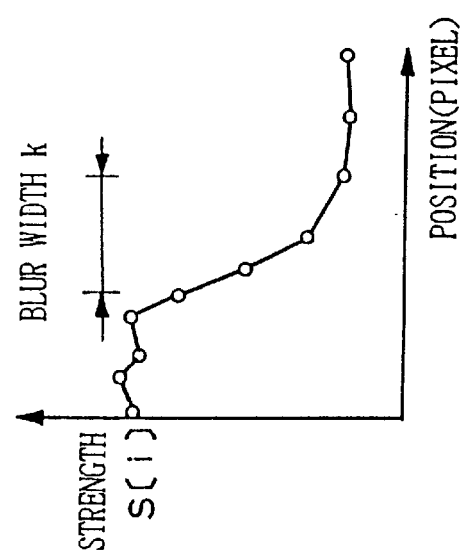
FIGS. 36(A) to 36(C) are a first group of supplemental views explaining a process of computing a blur level.
Figure 36B:
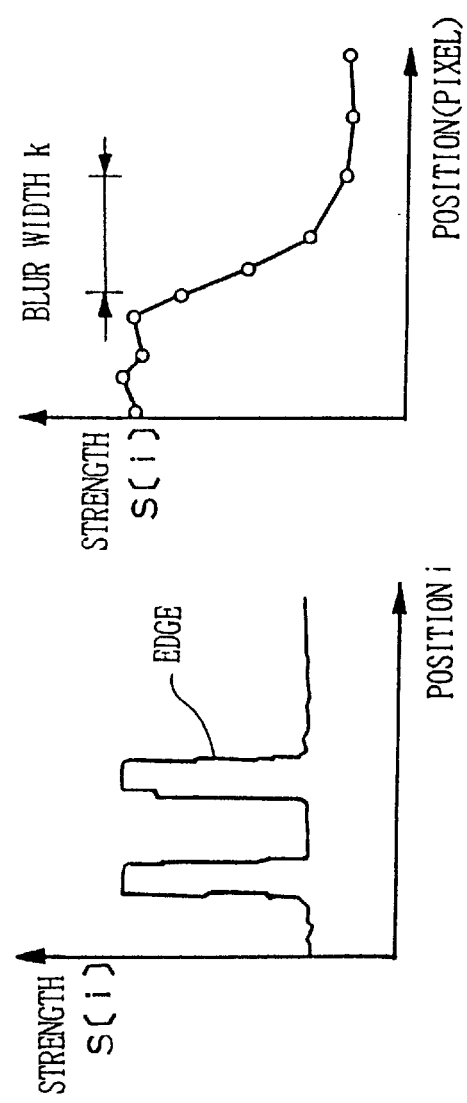
Figure 36A:
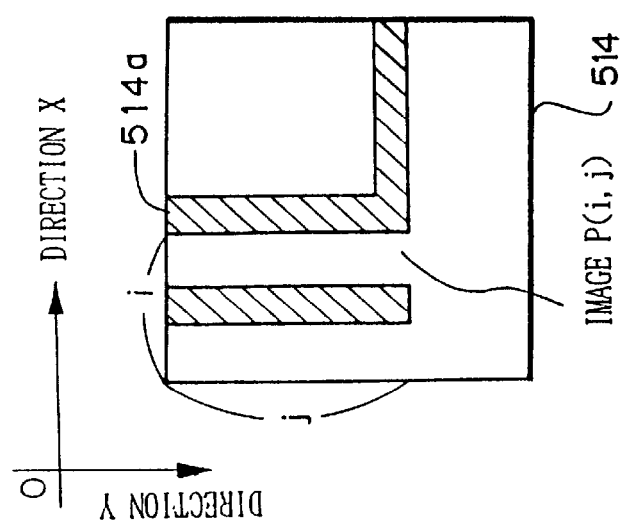
Figure 37A:
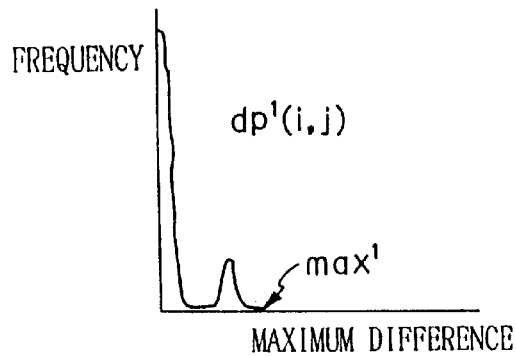
FIGS. 37(A) to 37(E) are a second group of supplemental views explaining the process of computing a blur level.
Figure 37B:
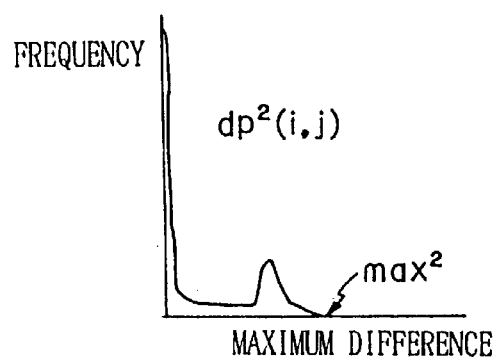
Figure 37C:
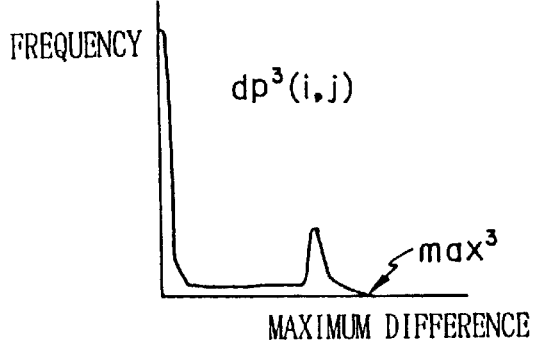
Figure 37D:
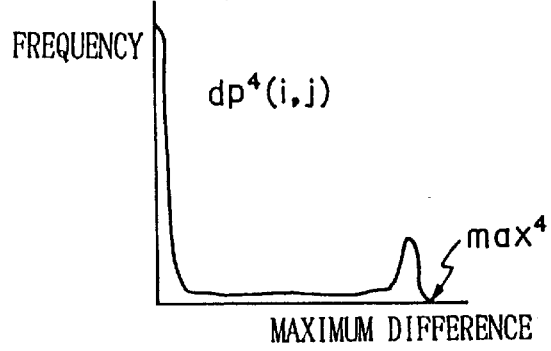
Figure 37E:
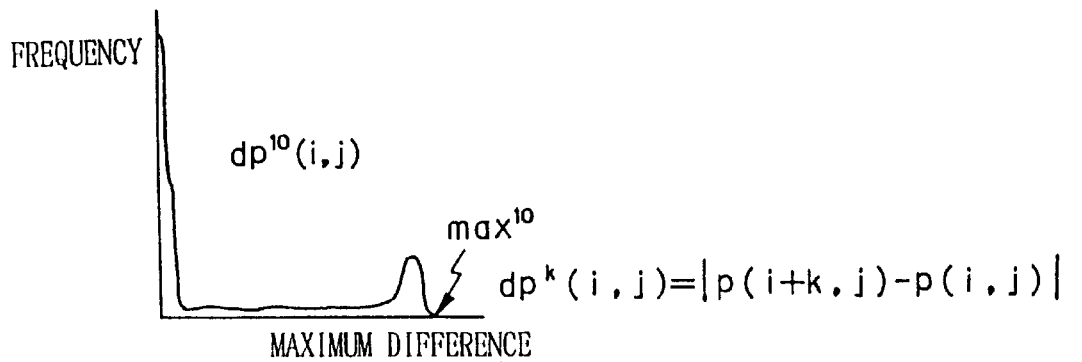

FIG. 36(A) shows the object image 514 of a semiconductor integrated circuit device. The object image 514 includes a wiring pattern 514a. Edges of this wiring pattern 514a are going to be extracted and subjected to a pattern matching operation. Steps S1 to S6 of FIG. 35 compute the blur level k of the image data D1 of the object image 514. Steps S7 and S8 detect edges in the object image 514 according to the blur level k, and step S9 carries out a pattern matching operation.

These steps will be explained more precisely. The step S1 of FIG. 35 receives the image data D1 related to a given image p[i, j] in the object image 514 and stores the same in the first frame memory 524a. The image data D1 may involve blur to provide a curve of FIG. 36(B) representing a relationship between Signal strength S[i] and X-axis positions i. In the figure, the Signal strength S[i] of the image data D1 rises at an edge of the wiring pattern 514a.

The blur level (the width of blur) k of the image data D1 extends over several pixels as shown in FIG. 36(C), which is an enlarged view showing a rise corresponding to the edge.

The step S2 calculates absolute differences (differential data) for all pixels (i, j) of the image p[i, j]. An image p[i+k, j] is located away from the image p[i, j] by k pixels (k being an optional number) in the direction of an axis X. An image p[i, j+k] is located away from the image p[i, j] by k pixels in the direction of an axis Y. Then, differential data for all pixels (i, j) are calculated as follows:

$$dpx^k[i, j] = |p[i+k, j] - p[i, j]| \qquad (11)$$

$$dpy^k[i, j] = |p[i, j+k] - p[i, j]| \qquad (12)$$

Namely, the contents of the first frame memory 524a are copied into the second frame memory 524b, and the contents of the second frame memory 524b are delayed by k pixels from the contents of the first frame memory 524a. The delayed image data D11 are supplied to the ALU 521, which calculates the differential data $dpx^k[i, j]$ and $dpy^k[i, j]$.

A maximum difference "$max^k$" is selected among the absolute data calculated with the optional pixel number k. The step S3 finds maximum differences $max^k$'s with at least two different k's. Upon receiving the differential data $dpx^k[i, j]$ and $dpy^k[i, j]$, the histogram calculation unit 522 calculates the frequency (histogram $hst^k[m]$) of the maximum difference $max^k$.

The CPU 523 stores the maximum difference $max^k$ in a mapped memory 502 through the accessible system bus 525. The CPU 523 finds maximum differences $max^k$'s according to the histograms $hst^k[m]$ of the differential data $dpx^k[1, j]$ and $dpy^k[i, j]$ calculated with the at least two different k's, which may range from 1 to 10.

FIGS. 37(A) to 37(E) show histograms of differential data calculated with five different k's (k=1 to 4, and 10). The histogram for the differential data $dpy^4[i, j]$ is substantially identical to the histogram of the differential data $dpx^{10}[i, j]$.

The step S4 finds a maximum "max" among the at least two maximum differences $max^k$'s. Here, a maximum value selected with all k's ranging from 2 to 11 is expressed as "dpmax."

The step S5 multiplies the maximum "max" by a threshold α (0.7<α<0.9). For example, the blur level (blur width) k is determined from the maximum dpmax for all k's ranging from 2 to 10 and a threshold of α=90%.

The step S6 selects k's that satisfy "$max^k \geq \alpha \cdot max$." This means that, if α·max is equal to $max^k$, or if $max^k$ is greater than α·max, the corresponding k is selected. Among the selected k's, the step S6 selects a minimum k as the blur level k.

The step S7 calculates, according to the blur level k, an edge likelihood image (estimated edge data) eLx[i, j] of the image p[i, j] on the axis X and an edge likelihood image (estimated edge data) eLy[i, j] of the image p[i, j] on the axis Y. When the blur level k is 4, the estimated edge data will be as follows:

$$eLx[i, j] = |p[i, j+2] - p[i, j]| + |p[i, j-2] - p[i, j]| \qquad (13)$$

$$eLy[i, j] = |p[i, j+2] - p[i, j]| + |p[i, j] - p[i-2, j]| \qquad (14)$$

Namely, the contents of the first frame memory 524a are copied into the second frame memory 524b, and the contents of the second frame memory 524b are delayed by k/2 pixels from the contents of the first frame memory 524a. The delayed image data D12 are provided to the ALU 521, which calculates the estimated edge data eLx[i, j] and eLy[i, j]. For example, a sum of pixels delayed by k/2 pixels is found and again stored in the first frame memory 524a.

Figure 38A:
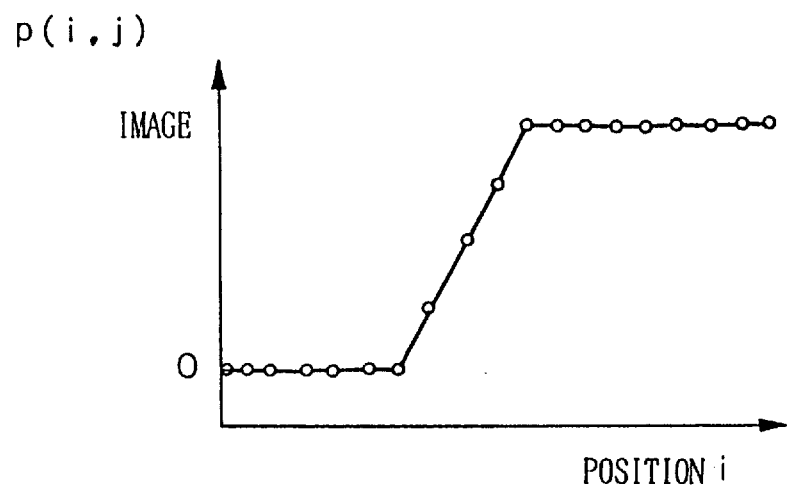
FIGS. 38(A) and 38(B) are a first group of supplemental views explaining an edge detecting process.
Figure 38B:
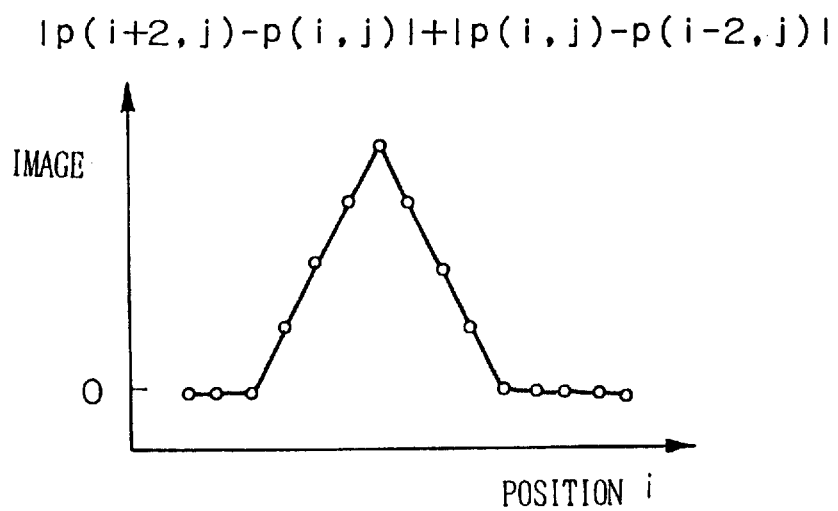
Figure 39A:
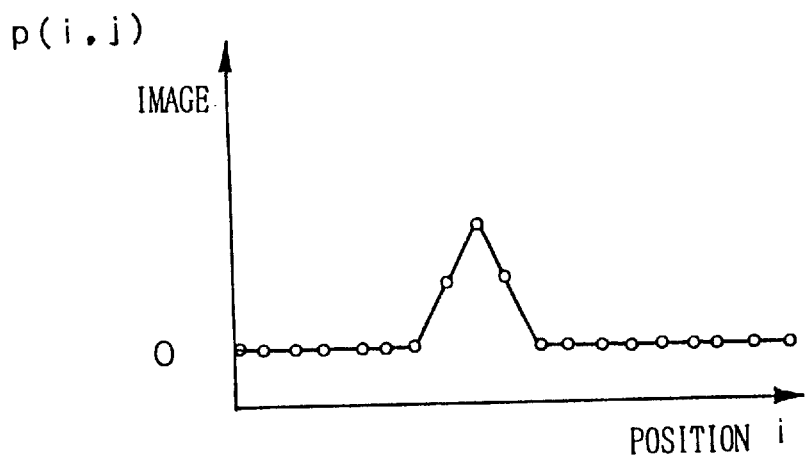
FIGS. 39(A) and 39(B) are a second group of supplemental views explaining the edge detecting process.
Figure 39B:
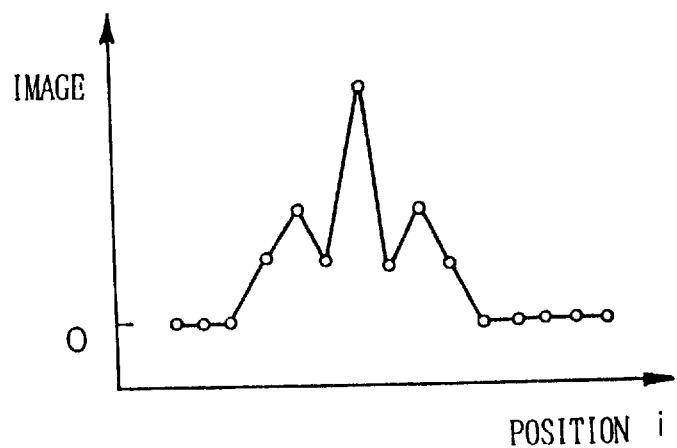

FIG. 38(A) shows image data of a rising edge portion of the wiring pattern 514a of the object image 514, and FIG. 38(B) shows estimated edge data eLx[i, j] corresponding to the rising edge portion. FIG. 39(A) shows an edge peak of the object image 514, and FIG. 39(B) shows estimated edge data eLx[i, j] corresponding to the edge peak.

The step S8 multiplies the edge likelihood images eLx[i, j] and eLy[i, j] by weight coefficients βx[i, j] and βy[i, j], respectively, as follows:

$$DLx[i, j] = \beta x[i, j](|p[i+2, j] - p[i, j]| + |p[i, j] - p[i-2, j]|) \qquad (15)$$

$$DLy[i, j] = \beta y[i, j](|p[i, j+2] - p[i, j]|) + |p[i, j] - p[i, j-2]|) \qquad (16)$$

The weight coefficients are obtained as follows:

$$\beta x[i, j] = \beta[b1]$$

$$\beta y[i, j] = \beta[b2]$$

where the first and second coefficients b1 and b2 are obtained as follows:

$$b1 = \frac{||p[i+2,j] - p[i,j]| - |p[i,j] - p[i-2,j]||}{|p[i+2,j] - p[i,j]| + |p[i,j] - p[i-2,j]|} \qquad (17)$$

$$b2 = \frac{||p[i,j+2] - p[i,j]| - |p[i,j] - p[i,j-2]||}{|p[i,j+2] - p[i,j]| + |p[i,j] - p[i,j-2]|} \qquad (18)$$

Here, the weight coefficients β[b1] and β[b2]=[b] are monotonously decreasing functions. For example, they are expressed as follows:

$$\beta[b] = 1/(1+b)$$

$$\beta[b] = e^{-\gamma b} (\gamma > 0)$$

Figures 40A, 40B:
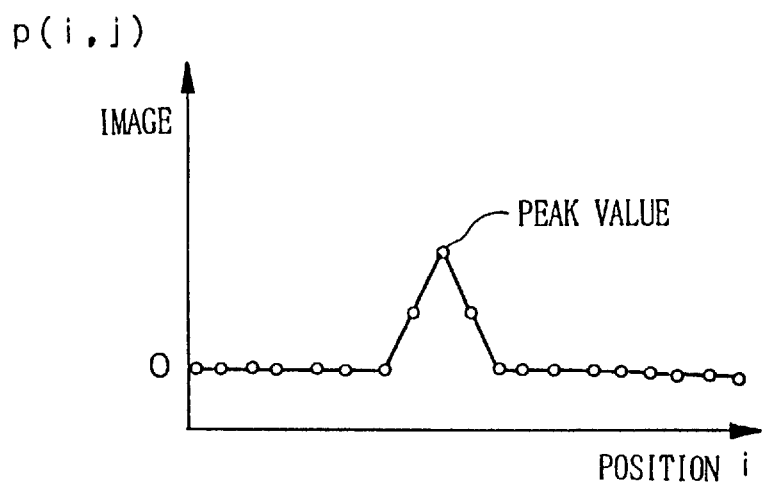
FIGS. 40(A) and 40(B) are a third group of supplemental views explaining the edge detecting process.

FIG. 40(A) corresponds to FIG. 39(A) and shows an edge peak value of the object image 514, and FIG. 40(B) shows edge data corresponding to the edge peak value, obtained by multiplying the estimated edge data eLx[i, j] by the weight coefficient βx[i, j].

The evaluation images DLx[i, j] and DLy[i, j] for evaluating the estimated edge data are stored in the first frame memory 524a.

The step S9 carries out a pattern matching operation according to the evaluation images DLx[i, j] and DLy[i, j].

In this way, the steps S1 to S6 of the embodiment of FIG. 35 calculate the blur level k, and according to the blur level k, the steps S7 and S8 detect edges out of the object image 514.

As mentioned above, the image data DI includes pixels (i, j) of a given image p[i, j]. For all of the pixels, absolute differences are calculated. An image p[i+k, j] is distanced away from the image p[i, j] by k pixels (k ranging from 2 to 10) in the direction of the axis X. An image p[i, j+k] is distanced away from the image p[i, j] by k pixels in the direction of the axis Y. Then, absolute differences for all pixels (i, j) are calculated as follows:

$$dpx^k[i, j]=|p[i+k, j]-p[i, j]|$$

$$dpy^k[i, j]=|p[i, j+k]-p[i, j]|$$

A maximum difference "$max^k$" is selected among these absolute differences calculated with the optional pixel number k. With at least two different k's, maximum differences $max^k$'s are calculated, and a maximum "max" is selected among the maximum differences $max^k$'s.

The maximum max is multiplied by the threshold α (0.7<α≦0.9). Among the optional pixel numbers k's, those which satisfy "$max^k \geq \alpha \cdot max$" are selected. Namely, if α·max is equal to $max^k$, or if $max^k$ is greater than α·max, the corresponding k is selected. Among the selected k's, a minimum k is selected as the blur level k.

According to the blur level k, an edge likelihood image eLx[i, j] of the image p[i, j] on the axis X and an edge likelihood image eLy[i, j] of the image p[i, j] on the axis Y are computed. When the blur level k is 4, the edge likelihood images will be as follows:

$$eLx[i, j]=|p[i+2, j]-p[i, j]|+|p[i, j]-p[i-2, j]|$$

$$eLy[i, j]=|p[i, j+2]-p[i, j]|+|p[i, j]-p[i, j-2]|$$

Even if the object image 514 involves blur, i.e., even if a signal change is small due to a change in gray scale between adjacent pixels and noise n(i), the edges of the object image 514 are enhanced and more clearly extracted than in the prior art.

Accordingly, a pattern matching apparatus employing this image processing method as an essential part thereof accurately detects edges and correctly carries out a pattern matching operation.

Second Embodiment

Figure 41:
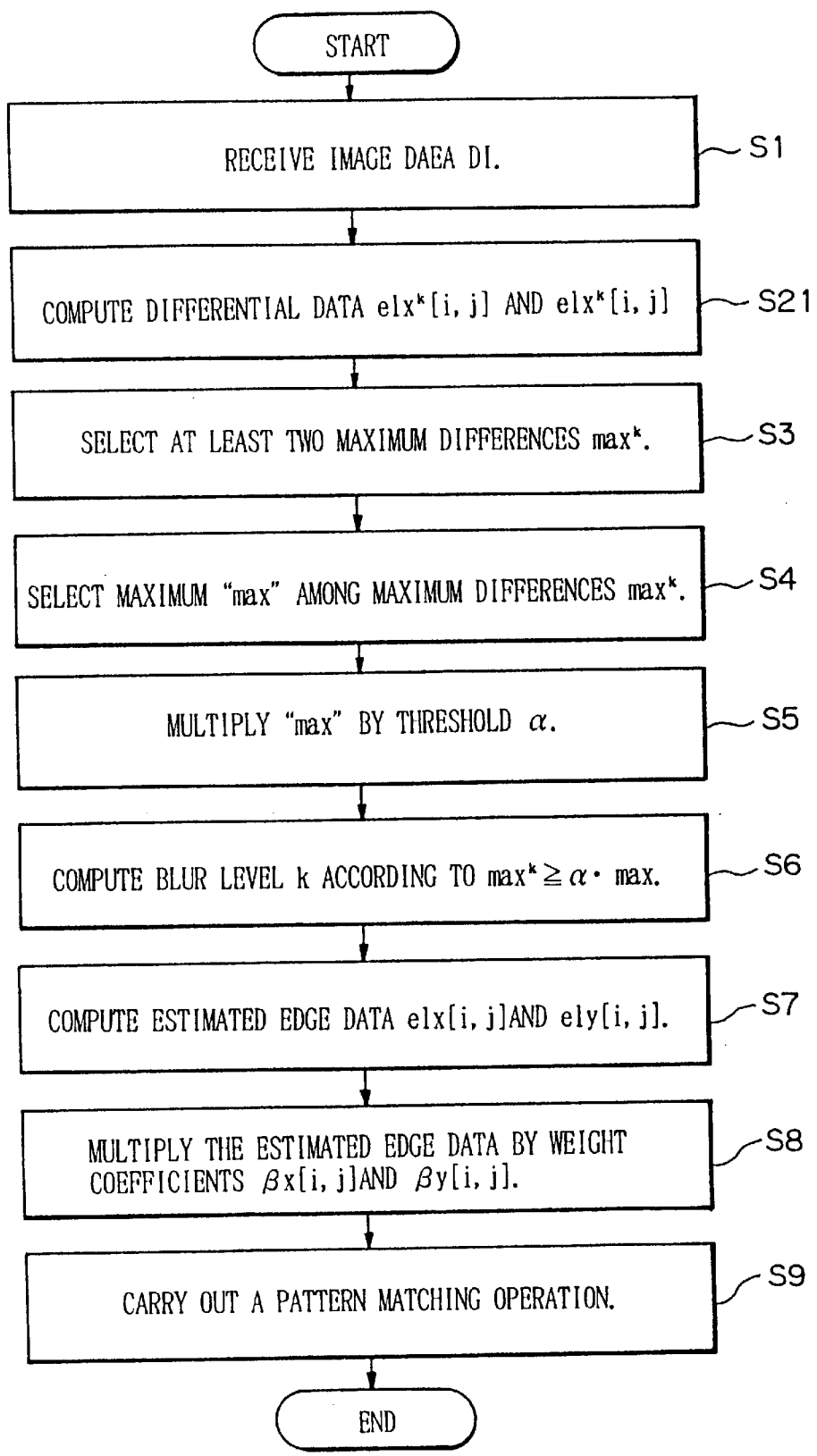
FIG. 41 is a flowchart showing a second embodiment of the fifth aspect of the present invention.

FIG. 41 is a flowchart showing an image processing operation according to the second embodiment of the fifth aspect of the present invention. This embodiment differs from the first embodiment in that it calculates absolute edge likelihood differences for all pixels (i, j) of a given image p[i, j] when finding a blur level k. An image p[i+k/2, j] is distanced away from the image p[i, j] by k/2 pixels (k being an optional number) in the direction of an axis X. An image p[i, j+k/2] is distanced away from the image p[i, j] by k/2 pixels in the direction of an axis Y. Then, absolute edge likelihood differences for all pixels (i, j) are expressed as follows:

$$ELx[i, j]=|p[i+k/2, j]-p[i, j]|+|p[i, j]-p[i-k/2, j]|$$

$$eLy^k[i, j]=|p[i, j]-p[i, j]|+|p[i, j]-p[i, j-k/2]|$$

According to these absolute edge likelihood differences, the blur level k is found.

Similar to the first embodiment, the second embodiment extracts edges out of the object image 514 shown in FIG. 36(A) and carries out a pattern matching operation. Steps S1 to S6 of FIG. 41 compute the blur level k of the image data D1 of the object image 514. Steps S7 and S8 detect edges in the object image 514 according to the blur level k, and step S9 carries out a pattern matching operation.

These steps will be explained more precisely. The Step S1 receives the image data D1 related to a given image p[i, j] in the object image 514 and stores the same in the first frame memory 524a.

The step S2 calculates absolute edge likelihood differences for all pixels (i, j) of the image p[i, j]. An image p[i+k/2, j] is distanced away from the image p[i, j] by k/2 pixels (k being an optional number) in the direction of the axis X, and an image p[i, j+k/2] distanced from the image p[i, j] by k/2 pixels in the direction of the axis Y. Then, absolute edge likelihood differences for all pixels (i, j) are calculated as follows:

$$eLx^k[i, j]=|p[i+k/2, j]-p[i, j]|+|p[i, j]-p[i-k/2, j]| \quad (19)$$

$$eLy^k[i, j]=|p[i, j+k/2]-p[i, j]|+|p[i, j]-p[i, j-k/2]| \quad (20)$$

Namely, the contents of the first frame memory 524a are copied into the second frame memory 524b, and the contents of the second frame memory 524b are delayed by k pixels from the contents of the first frame memory 524a. The delayed image data D11 are supplied to the ALU 521, which calculates the differential data $eLx^k[i, j]$ and $eLy^k[i, j]$.

A maximum difference "$max^k$" is selected among these data calculated with the optional pixel number k. The step S3 finds maximum differences $max^k$'s with at least two different k's, respectively. Upon receiving the differential data $eLx^k[i, j]$ and $eLy^k[i, j]$, the histogram calculation unit 522 calculates histogram $hst^k[m]$ of the differential data.

The CPU 523 stores the maximum difference $max^k$ in the mapped memory 502 through the accessible system bus 525. The CPU 523 finds maximum differences $max^k$'s according to the histograms hstkn[m] of the differential data $eLx^k[i, j]$ and $eLy^k[i, j]$ calculated with the at least two different k's, which may range from 2 to 10(FIGS. 37(A) to 37(E)).

The step S4 finds a maximum value "max" among the at least two maximum differences $max^k$'s. Here, a maximum value selected with all k's ranging from 1 to 10 is expressed as "dpmax."

The step S5 multiplies the maximum value max by a threshold a (0.7<α<0.9). For example, the blur level (blur width) k is found from the maximum value dpmax for all k's ranging from 2 to 10 and a threshold of α=90%.

The step S6 selects k's that satisfy "$max^k \leq \alpha \cdot max$." This means that, if α·max is equal to $max^k$, or if $max^k$ is greater than α·max, the corresponding k is selected. Among the selected k's, the step S6 selects a minimum k as the blur level k.

The step S7 calculates, according to the blur level k, an edge likelihood image (estimated edge data) eLx[i, j] of the image p[i, j] on the axis X and an edge likelihood image (estimated edge data) eLy[i, j] of the image p[i, j] on the axis Y. When the blur level k is 4, the estimated edge data will be as follows:

$$eLx[i, j]=|p[i+2, j]-p[i, j]|+|p[i, j]-p[i-2, j]| \quad (21)$$

$$eLy[i, j]=|p[i, j+2]-p[i, j]|+|p[i, j]-p[i, j]| \quad (22)$$

Namely, the contents of the first frame memory 524a are copied into the second frame memory 524b, and the contents of the second frame memory 524b are delayed by k/2 pixels from the contents of the first frame memory 524a. The delayed image data D12 are provided to the ALU 521, which calculates the estimated edge data eLx[i, j] and eLy[i, j]. For example, an absolute difference of pixels delayed by k/2 pixels is found and again stored in the first frame memory 524a.

The step S8 multiplies the edge likelihood images eLx[i, j] and eLy[i,j] by weight coefficients βx[i, j] and βy[i, j], respectively, as follows:

$$DLx[i, j]=\beta x[i, j](|p[i+2, j]-p[i, j]|+|p[i, j]-p[i-2, j]|) \quad (23)$$

$$DLy[i, j]=\beta y[i, j](|p[i, j+2]-p[i, j]|+|p[i, j]-p[i, j-2]|) \quad (24)$$

The weight coefficients are obtained as follows (FIGS. 38 to 40):

$$\beta x[i, j]=\beta[b1]$$

$$\beta y[i, j]=\beta[b2]$$

where the first and second coefficients b1 and b2 are obtained as follows:

$$b1 = \frac{\||p[i+2,j]-p[i,j]| - |p[i,j]-p[i-2,j]|\|}{|p[i+2,j]-p[i,j]| + |p[i,j]-p[i-2,j]|} \quad (25)$$

$$b2 = \frac{\||p[i,j+2]-p[i,j]| - |p[i,j]-p[i,j-2]|\|}{|p[i,j+2]-p[i,j]| + |p[i,j]-p[i,j-2]|} \quad (26)$$

The evaluation images DLx[i, j] and DLy[i, j] for evaluating the estimated edge data are stored in the first frame memory 524a.

The step S9 carries out a pattern matching operation according to the evaluation images DLx[i, j] and DLy[i, j].

In this way, the steps S1 to S6 of the embodiment of FIG. 41 calculate absolute edge likelihood differences for all pixels (i, j) of a given image p[i, j], to find the blur level k. An image p[i+k/2, j] is distanced away from the image p[i, j] by k/2 pixels (k being an optional number) in the direction of the axis X. An image p[i, j+k/2] is distanced away from the image p[i, j] by k/2 pixels in the direction of the axis Y. Then, absolute edge likelihood differences for all pixels (i, j) are obtained as follows:

$$eLx[i, j]=|p[i+k/2, j]-p[i, j]|+|p[i-k/2, j]-p[i, j]|$$

$$eLy^k[i, j]=|p[i, j-k/2]-p[i, j]|+|p[i, j]-p[i, j-k/2]|$$

According to these absolute edge likelihood differences, the blur level k is determined.

Similar to the first embodiment, the steps S7 and S8 calculate, according to the blur level k, an edge likelihood image eLx[i, j] of the image p[i, j] on the axis X and an edge likelihood image eLy[i, j] of the image p[i, j] on the axis Y as follows:

$$eLx[i, j]=|p[i+2, j]-p[i, j]|+|p[i, j]-p[i-2, j]|$$

$$eLy[i, j]=|p[i, j+2]-p[i-2, j]51 +|p[i, j]|p[i, j-2]|$$

Accordingly, similar to the first embodiment, the second embodiment extracts clear edges from the object image 514 even if the object image 514 is blurred.

As a result, a pattern matching processor employing this image processing method as an essential part thereof correctly carries out a pattern matching operation.

Third Embodiment

Figure 42:
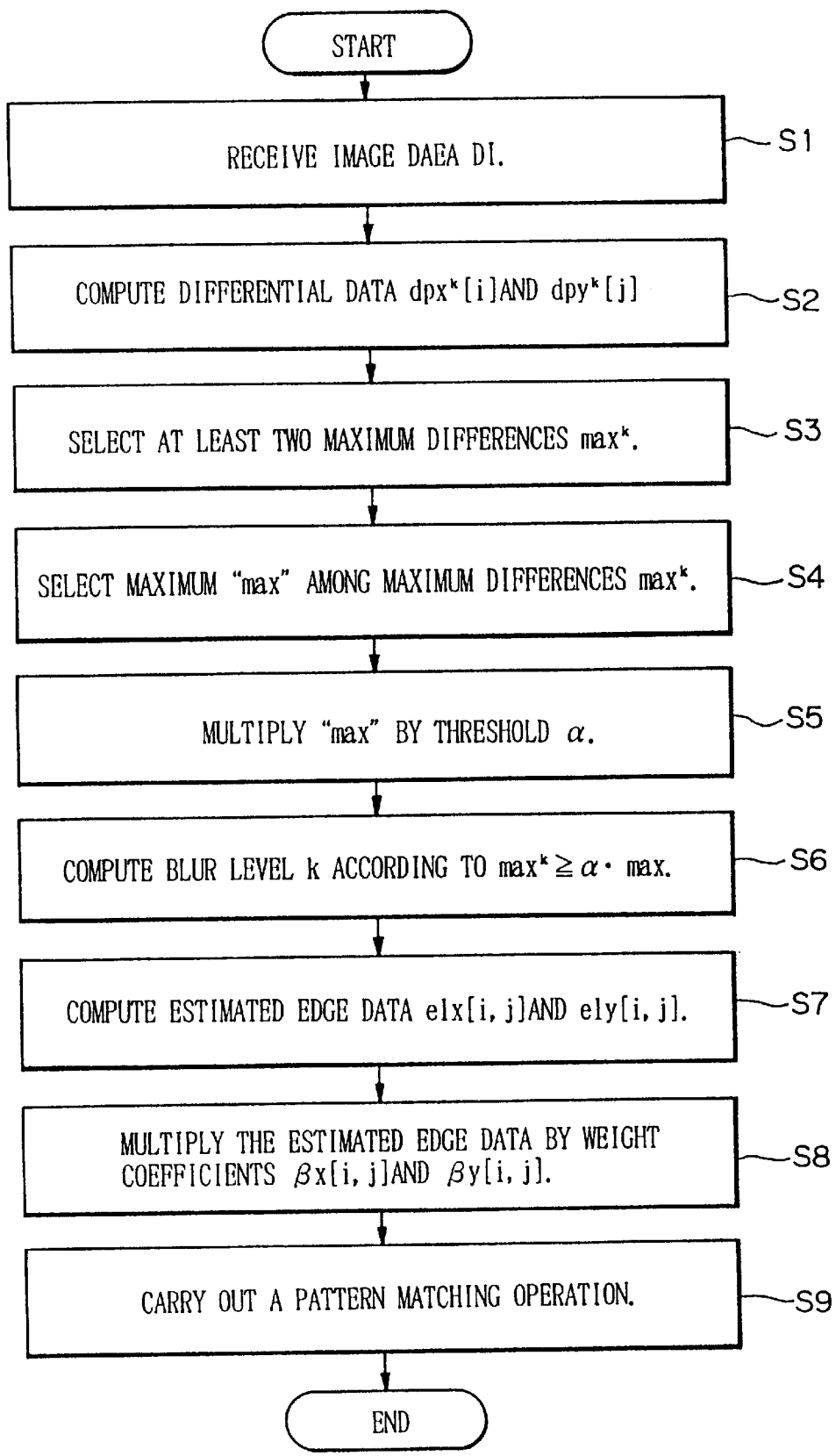
FIG. 42 is a flowchart showing a third embodiment of the fifth aspect of the present invention.

FIG. 42 is a flowchart showing an image processing operation according to the third embodiment of fifth aspect of the present invention. This embodiment differs from the first and second embodiments in that it calculates absolute differences for all pixels (i, j) of a given image p[i, j] when finding a blur level k. The image p[i, j] is projected onto an axis X to form a projected image px[i], and onto an axis Y to form a projected image py[j]. An image p[i+k, j] is distanced away from the projected image px[i] by k pixels (k being an optional number) in the direction of the axis X. An image p[i, j+k] is distanced away from the projected image py[j] by k pixels in the direction of the axis Y. Then, absolute differences for all pixels (i, j) are calculated as follows:

$$dpx^k[i]=|px[i+k]-px[i]|$$

$$dpy^k[j]=|py[j+k]-py[j]|$$

According to these absolute differences, the blur level k is determined.

Similar to the first and second embodiments, the third embodiment extracts edges out of the object image 514 and carries out a pattern matching operation. Steps S1 to S6 of FIG. 42 compute the blur level k of the image data D1 of the object image 514. Steps S7 and S8 detect the edges in the object image 514 according to the blur level k, and step S9 carries out a pattern matching operation.

These steps will be explained more precisely. The step S1 receives the image data D1 related to a given image p[i, j] in the object image 514 and stores the same in the first frame memory 524a.

The step S2 calculates absolute differences for all pixels (i, j) of the image p[i, j]. Namely, the image p[i, j] is projected onto the axis X to form a projected image px[i], and onto the axis Y to form a projected image py[j]. An image p[i+k, j] is distanced away from the projected image px[i] by k pixels (k being an optional number) in the direction of the axis X. An image p[i, j+k] is distanced away from the projected image py[j] by k pixels in the direction of the axis Y. Then, absolute differences for all pixels (i, j) are calculated as follows:

$$dpx^k[i]=|px[i+k]-px[i]| \quad (27)$$

$$dpy^k[j]=|py[j+k]-py[j]| \quad (28)$$

Namely, the contents of the first frame memory 524a are copied into the second frame memory 524b, and the contents of the second frame memory 524b are delayed by k pixels from the contents of the first frame memory 524a. The delayed image data D11 are supplied to the ALU 521, which calculates the differences $dpx^k[i]$ and $dpy^k[j]$.

A maximum difference "$max^k$" is selected among these absolute data calculated with the optional pixel number k. The step S3 finds maximum differences $max^k$'s with at least two different k's, respectively. Upon receiving the differential data $dpx^k[i, j]$ and $dpy^k[j, j]$, the histogram calculation unit 522 calculates a histogram $hst^k[m]$ of the differential data.

The CPU 523 stores the maximum difference $max^k$ in the mapped memory 502 through the accessible system bus 525. The CPU 523 finds maximum differences $max^k$'s according to the histograms $hst^k[m]$ of the differential data $dpx^k[i, j]$ and $dpy^k[i, j]$ calculated with the at least two different k's, which may range from 1 to 10 (FIGS. 37(A) to 37(E)).

The step S4 finds a maximum value "max" among the at least two maximum differences max 'S. Here, a maximum value selected with all k's ranging from 1 to 10 is expressed as "dpmax"

The step S5 multiplies the maximum value max by a threshold β(0.7<α<0.9). For example, the blur level (blur width) k is found from the maximum value dpmax for the k's ranging from 1 to 10 and a threshold of α=90%.

The step S6 selects k's that satisfy "$max^k \geq \beta \cdot max$". This means that, if α·max is equal to $max^k$, or if $max^k$ is greater than α·max, the corresponding k is selected. Among the selected k's, the step S6 selects a minimum k as the blur level k.

The step S7 calculates, according to the blur level k, an edge likelihood image (estimated edge data) eLx[i, j] of the image p[i, j] on the axis X and an edge likelihood image (estimated edge data) eLy([i, j] of the image p[i, j] on the axis Y. When the blur level k is 4, the estimated edge data will be as follows:

$$eLx[i, j]=|p[i+2, j]-p[i, j]|+|p[i, j]-p[i-2, j]| \quad (29)$$

$$eLy[i, j]=|p[i, j]-p[i, j]|+|p[i, j]-p[i, j-2]| \quad (30)$$

Namely, the contents of the first frame memory 524a are copied into the second frame memory 524b, and the contents of the second frame memory 524b are delayed by k/2 pixels from the contents of the first frame memory 524a. The delayed image data D12 are provided to the ALU 521, which calculates the estimated edge data eLx[i, j] and eLy[i, j]. For example, an absolute difference of pixels delayed by k/2 pixels is found and again stored in the first frame memory 524a.

The step S8 multiplies the edge likelihood images eLx[i, j] and eLy[i, j] by weight coefficients βx[i, j] and βy[i, j], respectively, as follows:

$$DLx[i, j]=\beta x[i, j](|p[i+2, j]-p[i, j]|+|p[i, j]-p[i-2, j]|) \quad (31)$$

$$DLy[i, j]=\beta y[i, j](|p[i, j+2]-p[i, j]|+|p[i, j]-p[i, j-2]|) \quad (32)$$

The weight coefficients are obtained as follows (FIGS. 38 to 40):

$$\beta x[i, j]=\beta[b1]$$

$$\beta y[i, j]=\beta[b2]$$

where the first and second coefficients b1 and b2 are obtained as follows:

$$b1 = \frac{||p[i+2,j]-p[i,j]|-|p[i,j]-p[i-2,j]||}{|p[i+2,j]-p[i,j]|+|p[i,j]-p[i-2,j]|} \quad (33)$$

$$b2 = \frac{||p[i,j+2]-p[i,j]|-|p[i,j]-p[i,j-2]||}{|p[i,j+2]-p[i,j]|+|p[i,j]-p[i,j-2]|} \quad (34)$$

The evaluation images DLx[i, j] and DLy[i, j] for evaluating the estimated edge data are stored in the first frame memory 524a.

The step S9 carries out a pattern matching operation according to the evaluation images DLx[i, j] and DLy[i, j].

In this way, the steps S1 to S6 of the embodiment of FIG. 42 calculate absolute differences for all pixels (i, j) of the given image p[i, j], to find the blur level k. Namely, the image p[i, j] is projected onto the axis X to form a projected image px[i], and onto the axis Y to form a projected image py[j]. An image p[i+k, j] is distanced away from the projected image px[i] by k pixels (k being an optional number) in the direction of the axis X. An image p[i, j+k] is distanced away from the projected image py[j] by k pixels in the direction of the axis Y. Then, absolute differences for all pixels (i, j) are calculated as follows:

$$dpx^k[i]=|px[+k]-px[i]|$$

$$dpy^k[j]=|py[j+k]-py[j]|$$

According to these absolute differences, the blur level k is determined.

Similar to the first and second embodiments, the third embodiment calculates, according to the blur level k, an edge likelihood image eLx[i, j] of the image p[i, j] on the axis X, and an edge likelihood image eLy[i, j] of the image pfi, [j] on the axis Y as follows:

$$eLx[i, j]=|p[i+k/2,j]-p[i, j]|+|p[i, j]-p[i-k/2,j]|$$

$$eLy[i, j]=|p[i, j+k/2]-p[i, j]|+|p[i, j]-p[i, j-k/2]|$$

Accordingly, similar to the first and second embodiments, the third embodiment extracts clear edges from the object image 514 even if the object image 514 is blurred.

As a result, a pattern matching processor employing this image processing method as an essential part thereof correctly carries out a pattern matching operation.

Fourth Embodiment

Figure 43:
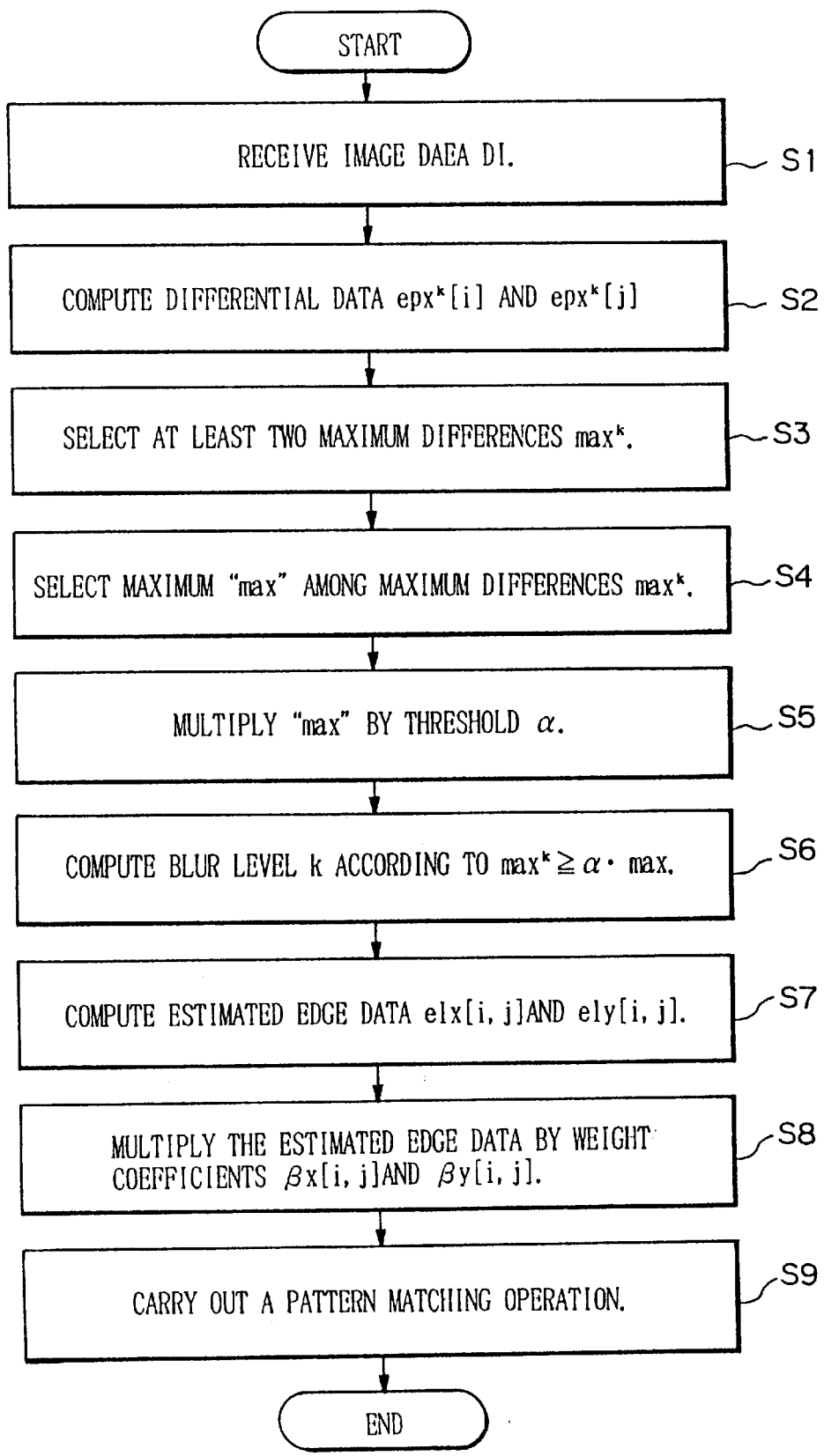
FIG. 43 is a flowchart showing a fourth embodiment of the fifth aspect of the present invention.

FIG. 43 is a flowchart showing an image processing procedure according to the fourth embodiment of the fifth aspect of the present invention. This embodiment differs from the first to third embodiments in that it calculates edge likelihood images for all pixels (i, j) of a given image p[i, j] when finding a blur level k. The image p[i, j] is projected onto an axis X to form a projected image px[i], and onto an axis Y to form a projected image py[j]. An image p[i+k/2, j] is distanced away from the projected image px[i] by k/2pixels (k being an optional number) in the direction of the axis X. An image p[i, j+k/2] is distanced away from the projected image py[j] by k/2 pixels in the direction of the axis Y. Then, edge likelihood images for all pixels (i, j) are obtained as follows:

$$eLx^k[i]=|p[i, j+k/2]-p[, j]|+|p[i, j]-p[i-k/2,j]|$$

$$eLy^k[j]=|p[i, j+k/2]-p[i,j]|+|p[i, j]-p[i, j-k/]|$$

According to these edge likelihood images, the blur level k is determined.

Similar to the first to third embodiments, the fourth embodiment extracts edges out of the object image 514 and carries out a pattern matching operation. Steps S1 to S6 of FIG. 43 compute the blur level k of the image data D1 of the object image 514. Steps S7 and S8 detect the edges in the object image 514 according to the blur level k, and step S9 carries out a pattern matching operation.

These steps will be explained more precisely. The step S1 receives the image data D1 related to a given image p[i, j] in the object image 514 and stores the same in the first frame memory 524a.

The step 52 obtains edge likelihood images for all pixels (i, j) of the image p[i, j]. Namely, the image p[i, j] is projected onto the axis X to form a projected image px[i], and onto the axis Y to form a projected image py[j]. An image p[i+k/2, j] is distanced away from the projected image px[i] by k pixels (k being an optional number) in the direction of the axis X. An image p[i, j+k/2] is distanced away from the projected image py[j] by k pixels in the direction of the axis Y. Then, edge likelihood images for all pixels (i, j) are obtained as follows:

$$eLx^k[i]=|p[i+k/2, j]-p[i, j]|+|p[i, j]-p[i-k/2, j]| \quad (35)$$

$$eLy^k[j]=|p[i, j+k/2]-p[i, j]|+|p[i, j]-p[i, j-k/2]| \quad (36)$$

Namely, the contents of the first frame memory 524a are copied into the second frame memory 524b, and the contents of the second frame memory 524b are delayed by k/2 pixels from the contents of the first frame memory 524a. The delayed image data D11 are supplied to the ALU 521, which calculates the differential data eLx [i] and eLy [j].

A maximum difference "max$^k$" is selected among these differential data obtained with the optional pixel number k. The step S3 finds maximum differences max's with at least two different k's, respectively. Upon receiving the differential data eLx$^k$[i] and eLy$^k$[j], the histogram calculation unit 522 calculates differences (histogram hst$^k$[m]) of the differential data.

The CPU 523 stores the maximum difference max$^k$ in the mapped memory 502 through the accessible system bus 525. The CPU 523 finds maximum differences max$^k$, s according to the histograms hst$^k$[m] of the differential data eLx$^k$[i] and ely$^k$[j] calculated with the at least two different k's, which may range from 2 to 10 (FIGS. 37(A) to 37(E)).

The step S4 finds a maximum value "max" among the at least two maximum differences max 's. Here, a maximum value selected with all k's ranging from 1 to 10 is expressed as "dpmax." The step S5 multiplies the maximum value max by a threshold a ($0.7 \leq \alpha \leq 0.9$). For example, the blur level (blur width) k is found from the maximum value dpmax for the k's ranging from 1 to 10 and a threshold of $\alpha = 90\%$.

The step S6 selects k's that satisfy "max$^k \geq \alpha \cdot$max." This means that, if $\alpha \cdot$max is equal to max, or if max is greater than $\alpha \cdot$max, the corresponding k is selected. Among the selected k's, the step S6 selects a minimum k as the blur level k.

The step S7 calculates, according to the blur level k, an edge likelihood image (estimated edge data) eLx[i, j] of the image p[i, j] on the axes X and an edge likelihood image (estimated edge data) eLy[i, j) of the image p[i, j] on the axis Y. When the blur level k is 4, the estimated edge data will be as follows:

$$eLx[i, j] = |p[i+2, j] - p[i, j]| + |p[i, j] - p[i-2, j]| \quad (37)$$

$$eLy[i, j] = |p[i, j+2] - p[i, j]| + |p[i, j] - p[i, j-2]| \quad (38)$$

Namely, the contents of the first frame memory 524a are copied into the second frame memory 524b, and the contents of the second frame memory 524b are delayed by k/2 pixels from the contents of the first frame memory 524a. The delayed image data D12 are provided to the ALU 521, which calculates the estimated edge data eLx[i, j] and eLy[i, j]. For example, an absolute difference of pixels delayed by k/2 pixels is found and again stored in the first frame memory 524a.

The step S8 multiplies the edge likelihood images eLx[]i, j] and eLy[i, j] by weight coefficients Ox[i, j] and βy[i, j], respectively, as follows:

$$DLx[i, j] = \beta x[i, j](|p[i+2, j] - p[i, j]| + |p[i, j] - p[i-2, j]|) \quad (39)$$

$$DLy[i, j] = \beta[i, j](|p[i, j+2] - p[i, j]| + |p[i, j] - p[i, j-2]|) \quad (40)$$

The weight coefficients are obtained as follows (FIGS. 38 to 40):

$$\beta x[i, j] = \beta[b1]$$

$$\beta y[i, j] = \beta[b2]$$

where the first and second coefficients b1 and b2 are obtained as follows:

$$b1 = \frac{||p[i+2, j] - p[i, j]| - |p[i, j] - p[i-2, j]||}{|p[i+2, j] - p[i, j]| + |p[i, j] - p[i-2, j]|} \quad (41)$$

$$b2 = \frac{||p[i, j+2] - p[i, j]| - |p[i, j] - p[i, j-2]||}{|p[i, j+2] - p[i, j]| + |p[i, j] - p[i, j-2]|} \quad (42)$$

The evaluation images DLx[i, j] and DLy[i, j] for evaluating the estimated edge data are stored in the first frame memory 524a.

The step S9 carries out a pattern matching operation according to the evaluation image DLx[i, j] and DLy[i, j].

In this way, the steps S1 to S6 of the embodiment FIG. 43 obtain edge likelihood images for all pixels (i, j) of the given image p[i, j], to find the blur level k. Namely, the image p[i, j] is projected onto the axis X to form a projected image px[i], and onto the axis Y to form a projected image py[j]. An image p[i+k/2, j] is distanced away from the projected image px[i] by k/2 pixels (k being an optional number) in the direction of the axis X. An image p[i, j+k/2] is distanced away from the projected image py[j] by k/2 pixels in the direction of the axis Y. Then, edge likelihood images for all pixels (i, j) are obtained as follows:

$$eLx^k[i] = |p[i+k/2, j] - p[i, j]| + |p[i-k/2, j] - p[i, j]|$$

$$eLy^k[j] = |p[i, j+k/2] - p[i, j]| + |p[i, j] - p[j-k/2]|$$

According to these adge likelihood images, the blur level k is determined.

Similar to the first to third embodiments, the fourth embodiment calculates, according to the blur level k, an edge likelihood image eLx[i, j] of the image p[i, j] on the axis X, and an edge likelihood image eLy[i, j] of the image p[i, j] on the axis Y as follows:

$$eLx[i, j] = |p[i+k/2, j] - p[i, j]| + |p[i, j] - p[i-k/2, j]|$$

$$eLy[i, j] = |p[i, j] - p[i, j+k/2]| + |p[i, j] - p[i, j-k/2]|$$

Accordingly, similar to the first to third embodiments, the fourth embodiment extracts clear edges from the object image 514 even if the object image 514 is blurred.

As a result, a pattern matching processor employing this image processing method as an essential part thereof correctly carries out a pattern matching operation.

As explained above, an image processor according to the present invention employed for a pattern matching processor comprises data operation means, data processing means, and control means, to extract edges out of an object image. Even if the object image is blurred, the present invention more clearly extracts edges out of the object image than a prior art. The image processor according to the present invention correctly prepares evaluation data necessary for a pattern matching operation.

An image processing method according to the present invention computes absolute differences and absolute edge likelihood differences between a given image in an object image and images distanced away from the given image by an optional number of pixels in directions X and Y. These absolute differences and absolute edge likelihood differences are calculated for all pixels of the given image with the optional pixel number, and a maximum difference is selected among the absolute differences. With at least two different pixel numbers, maximum differences are calculated, respectively, and a maximum value is selected among the maximum differences. Among the optional pixel numbers, those which satisfy threshold conditions are selected, and among the selected pixel numbers, a minimum pixel number is selected as a blur level.

Even if the given image is blurred, i.e., even if a change in a Signal quantity provided by the given image is small due to a change in gray scale between adjacent pixels and noise, the present invention provides, according to the blur level, an edge likelihood image of the given image on the axis X and an edge likelihood image of the given image on the axis Y, to enhance the clearness of edges of the given image, thereby more clearly extracting the edges out of the image than a prior art.

Another image processing method of the present invention forms an X-axis projected image by projecting a given image onto an axis X and a Y-axis projected image by projecting the given image onto an axis Y for all pixels of the given image when computing a blur level. The method then determines absolute differences and edge likelihood images from the projected images and images distanced away from the projected images by an optional number of pixels in the directions of the axes X and Y. According to the absolute differences, the blur level is computed.

Even if the object image is blurred, this method clearly extracts edges out of the object image.

These image processing methods of the present invention multiply the edge likelihood images in the directions X and Y by weighting coefficients, respectively, before detecting edges.

These methods thus provide edge data with clearness information and correctly weight the edge data, to form edge likelihood evaluation images in the directions X and Y. According to the evaluation images, a pattern matching operation is accurately carried out.

In this way, the present invention improves pattern matching evaluation accuracy and the performance of a pattern matching processor employing the image processor according to the present invention.

We claim:

1. An electron beam tester for scanning a sample with an electron beam emitted from an electron beam unit, to form a secondary electron image, and correcting deformation of the secondary electron image, said electron beam tester comprising:

deflection control means connected to the electron beam unit for linearly transforming, according to linear transformation parameters, an electron beam scanning position into dive signals to be sent to first and second deflectors each having different deflecting directions;

secondary electron image storage means connected to the electron beam unit for storing the secondary electron image;

coordinate axis rotating and projected luminance distribution forming means connected to the secondary electron image storage means for obtaining projected luminance B(X) which accumulated the luminance of the secondary electron image along straight lines extending in parallel with the rotating axis Y obtained when rotating an X-Y coordinate system, and the axis Y being rotated either by changing the linear transformation parameters or by shifting picture rows in parallel to the axis X of the X-Y coordinate in the fixed axis X;

parallelism evaluation means connected to the coordinate axis rotating and projected luminance distribution forming means for obtaining a parallelism evaluation value (d) between a line direction of wiring patterns and the axis Y based on the projected luminance B(X); and correction quantity determination means connected to the parallelism evaluation means for finding a rotation angle (As) which becomes a maximum parallelism value to the rotation of the axis Y, and the rotation angle (As) being used as a correction quantity for correcting deformation of the secondary electron image.

* * * * *